United States Patent
Lee et al.

(10) Patent No.: US 12,255,230 B2
(45) Date of Patent: Mar. 18, 2025

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Tsung-Lin Lee, Hsinchu (TW); Choh-Fei Yeap, Hsinchu (TW); Da-Wen Lin, Hsinchu (TW); Chih-Chieh Yeh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 442 days.

(21) Appl. No.: 17/709,583

(22) Filed: Mar. 31, 2022

(65) Prior Publication Data
US 2023/0317784 A1    Oct. 5, 2023

(51) Int. Cl.
*H01L 29/423* (2006.01)
*H01L 21/8234* (2006.01)
*H01L 29/06* (2006.01)
*H01L 29/66* (2006.01)
*H01L 29/786* (2006.01)

(52) U.S. Cl.
CPC .. *H01L 29/0665* (2013.01); *H01L 21/823412* (2013.01); *H01L 21/823418* (2013.01); *H01L 29/42392* (2013.01); *H01L 29/66553* (2013.01); *H01L 29/66742* (2013.01); *H01L 29/78618* (2013.01); *H01L 29/78696* (2013.01)

(58) Field of Classification Search
CPC ......... H01L 29/0665; H01L 21/823412; H01L 21/823418; H01L 29/42392; H01L 29/66553; H01L 29/66742; H01L 29/78618; H01L 29/78696; H01L 29/0642; H01L 29/0673; H01L 29/775; H01L 21/02304; H01L 29/0847; H01L 29/165; H01L 29/7848; H01L 29/66439; H01L 29/66545; B82Y 10/00
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

*Primary Examiner* — Elias Ullah
(74) *Attorney, Agent, or Firm* — Birch, Stewart, Kolasch & Birch, LLP

(57) ABSTRACT

A method for forming a semiconductor structure is provided. The method includes forming a semiconductor fin structure including first semiconductor layers and second semiconductor layers alternatingly stacked, laterally recessing the first semiconductor layers of the semiconductor fin structure to form first notches in the first semiconductor layers, forming first passivation layers on first sidewalls of the first semiconductor layers exposed from the first notches, and forming first inner spacer layers in the first notches.

20 Claims, 47 Drawing Sheets

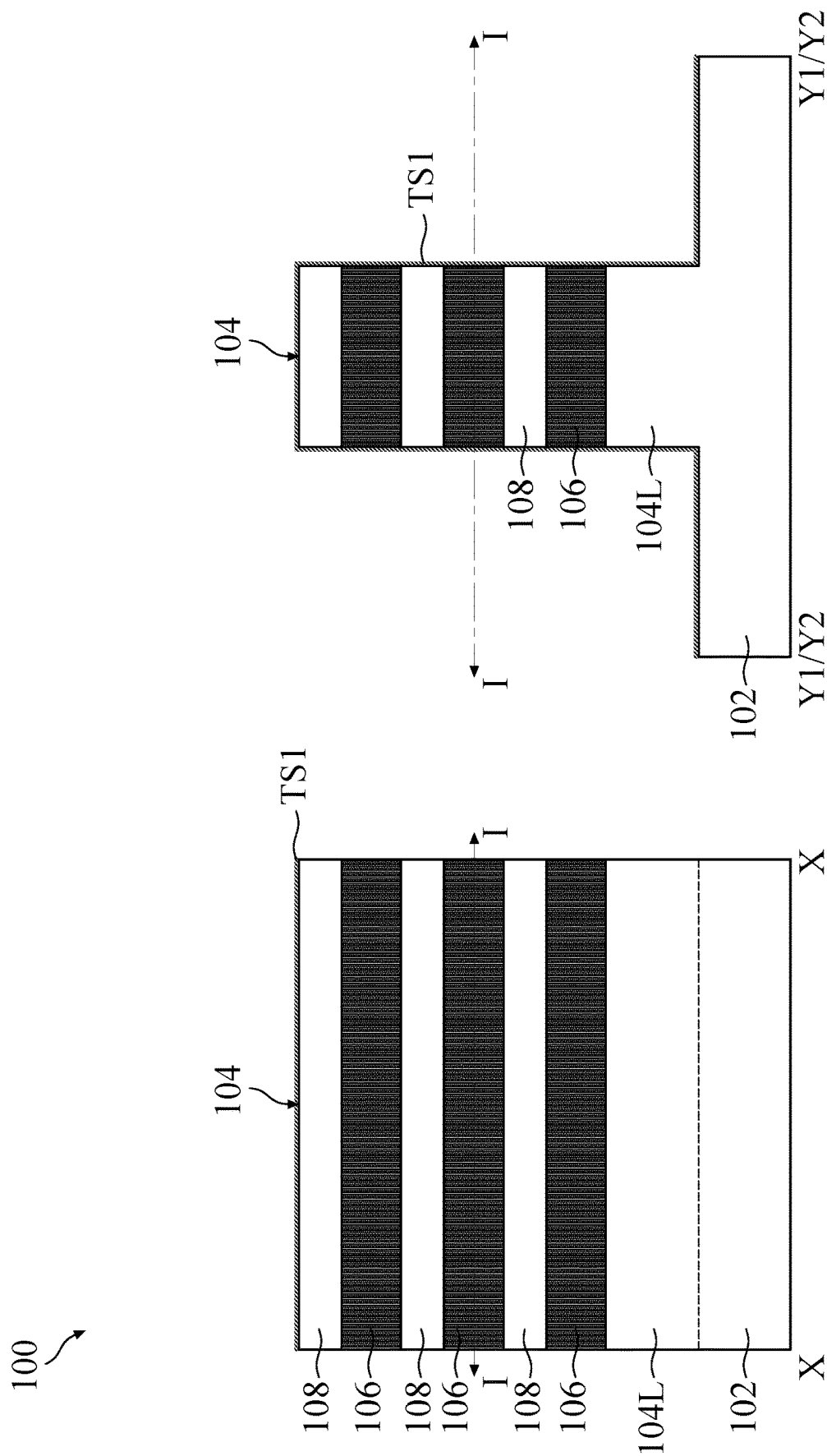

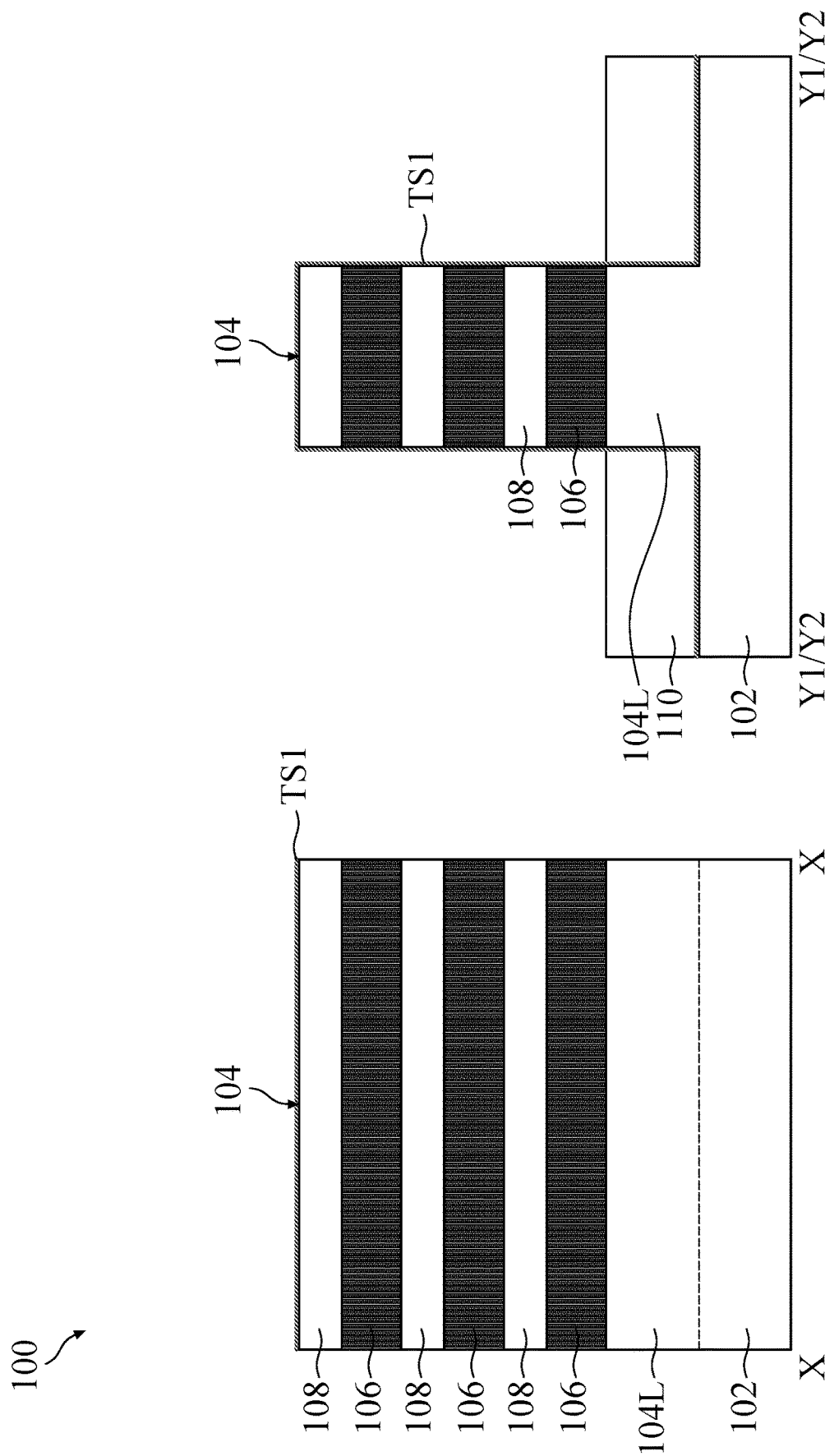

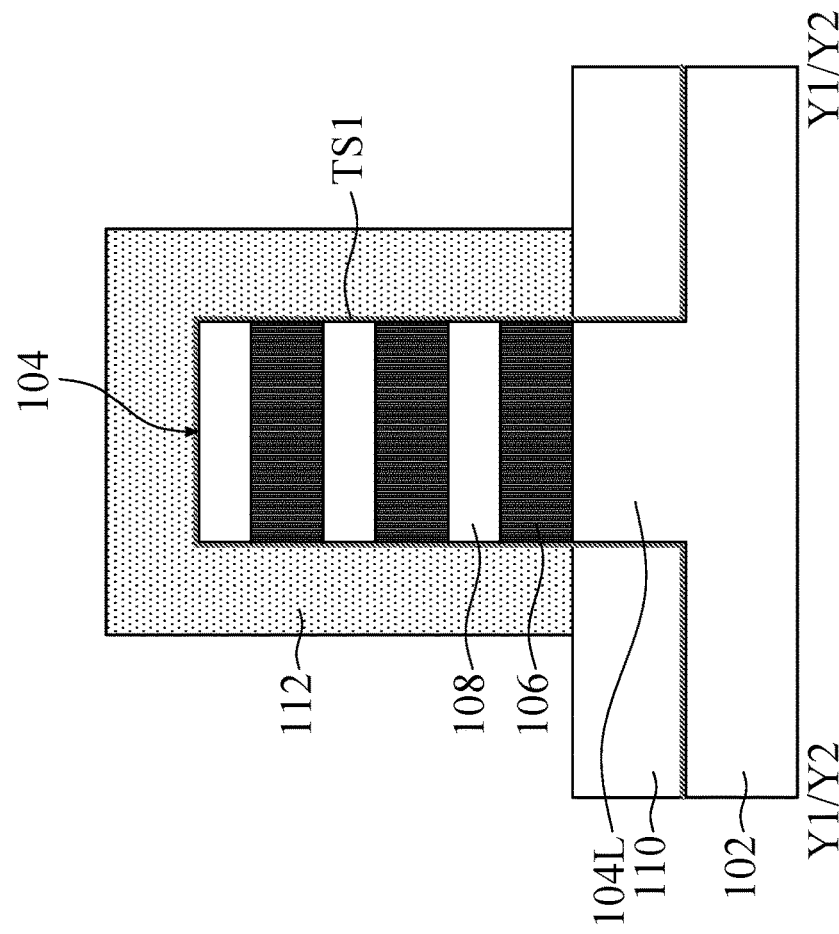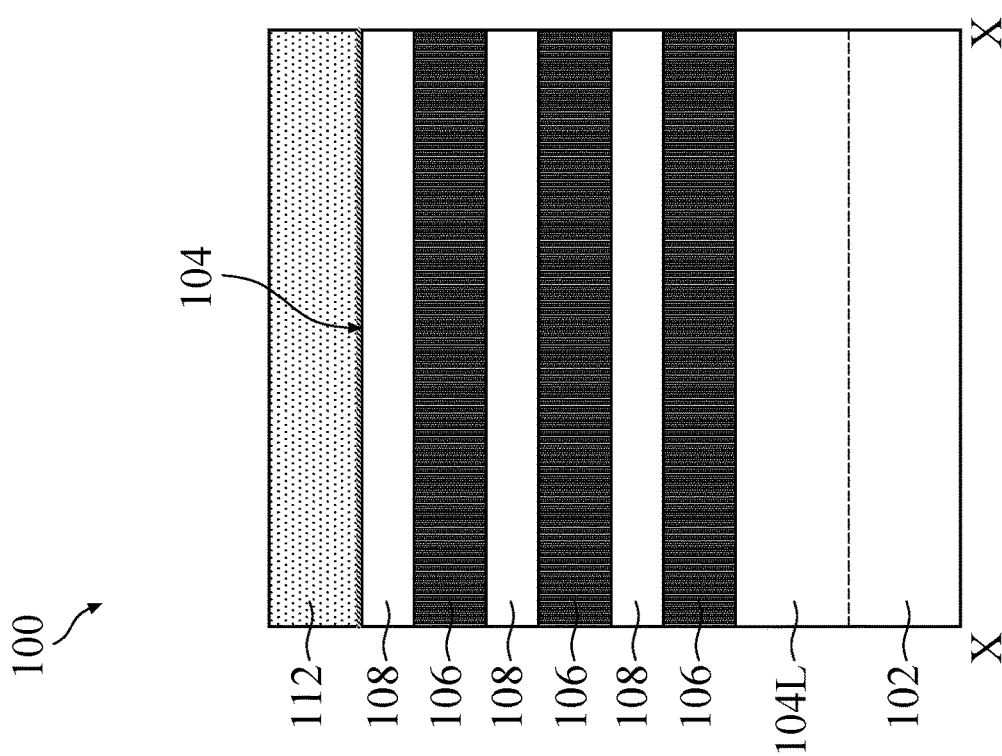
FIG. 2D-2
FIG. 2D-1

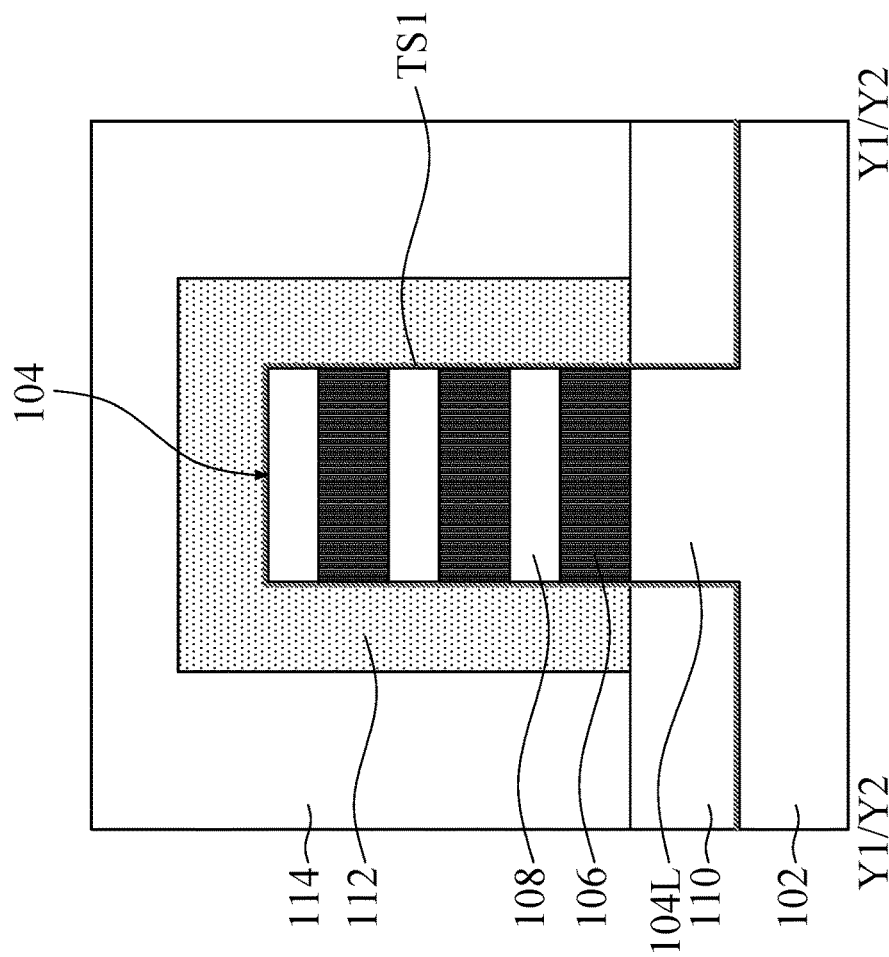
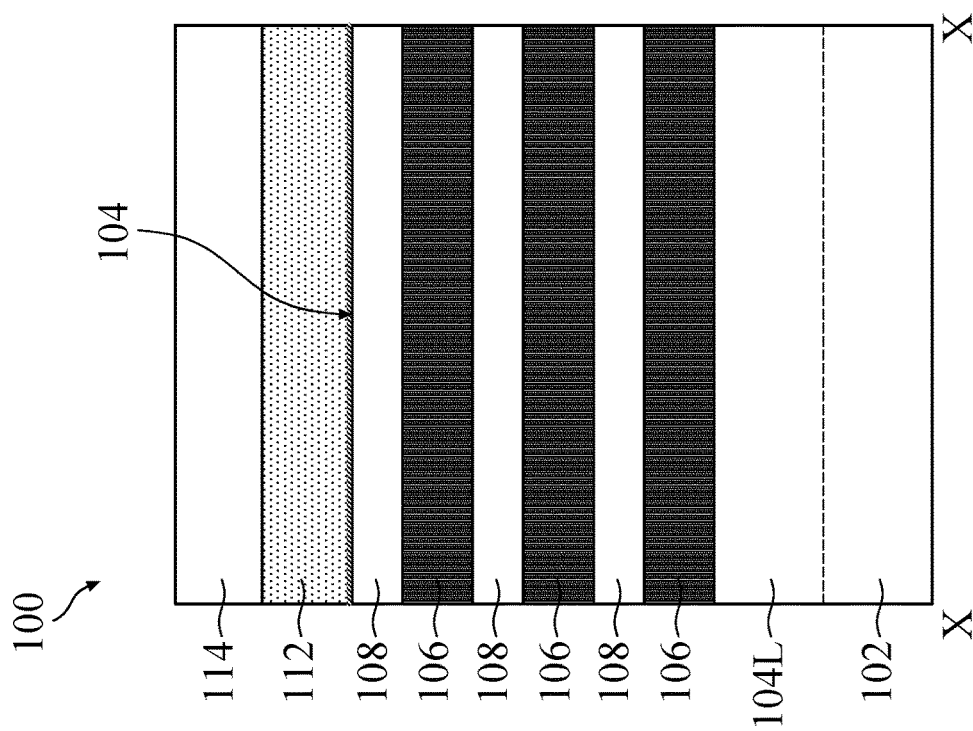
FIG. 2E-2
FIG. 2E-1

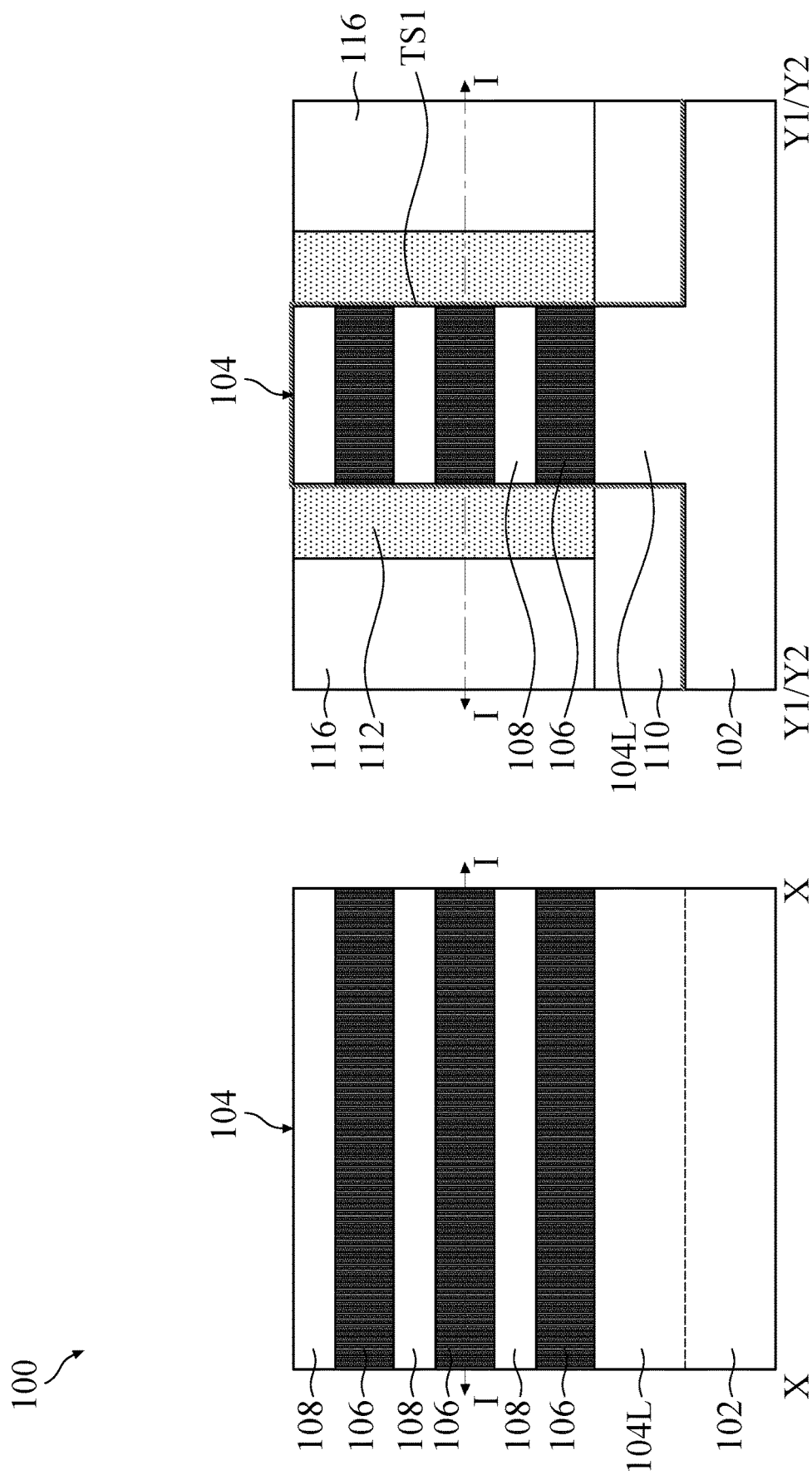

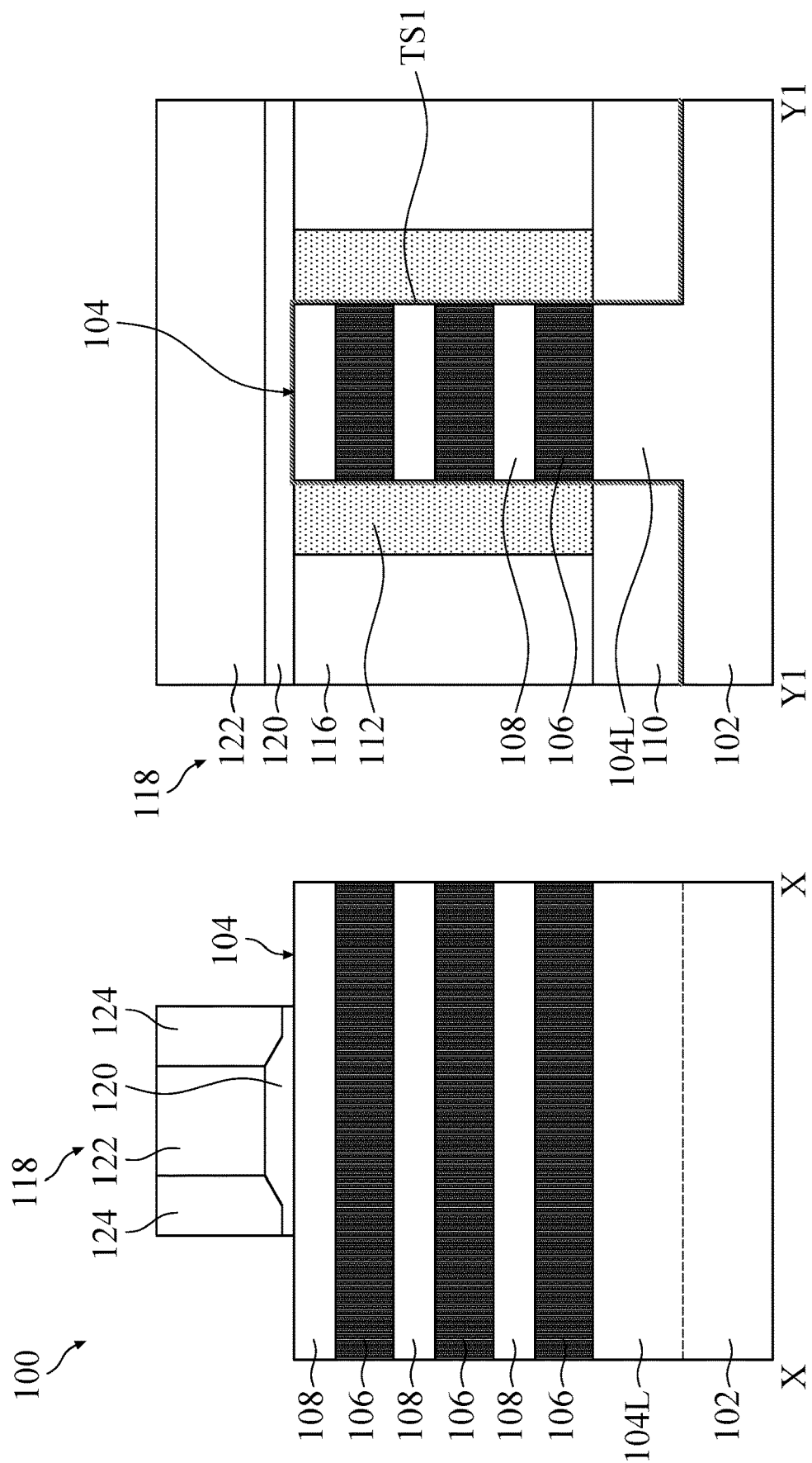

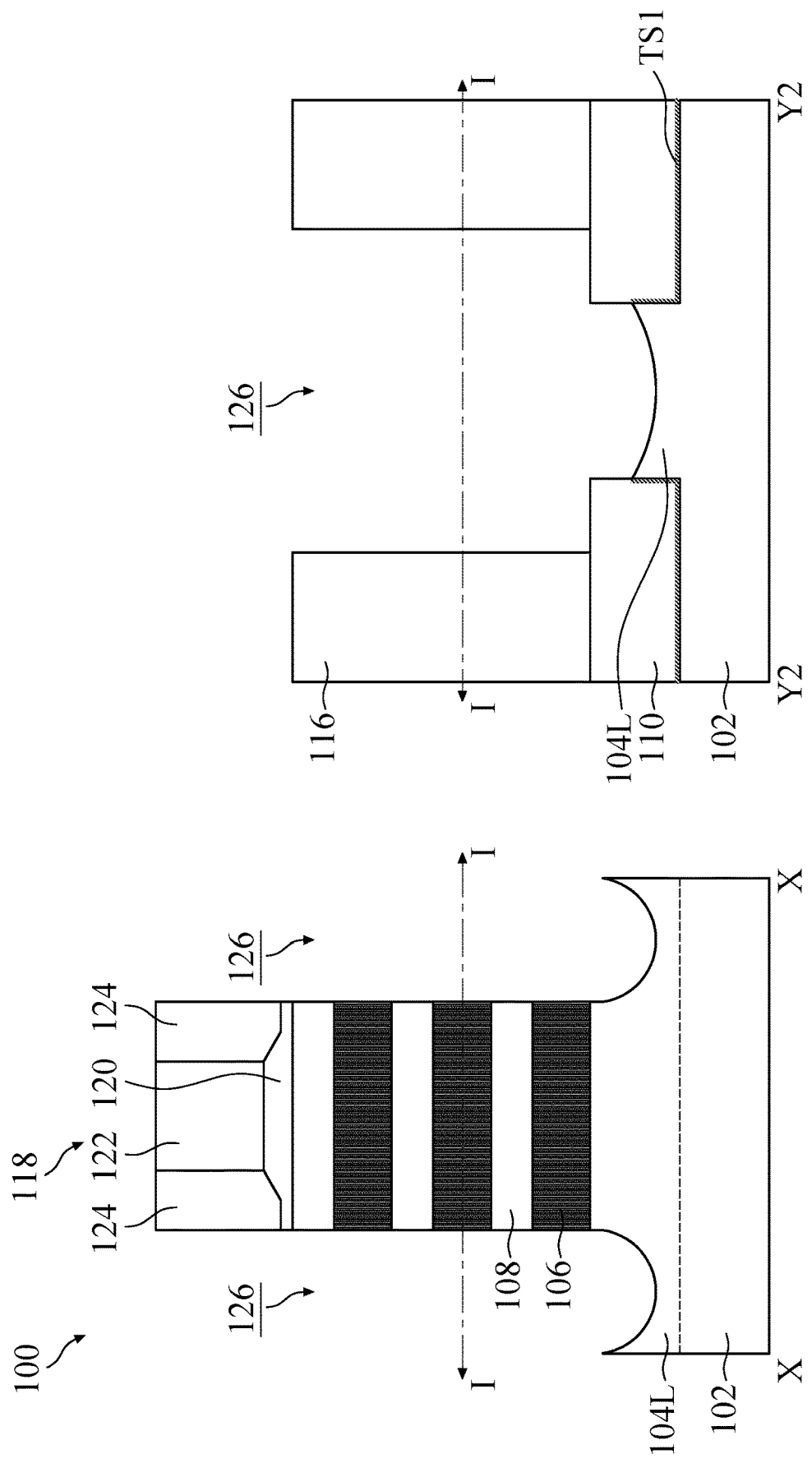

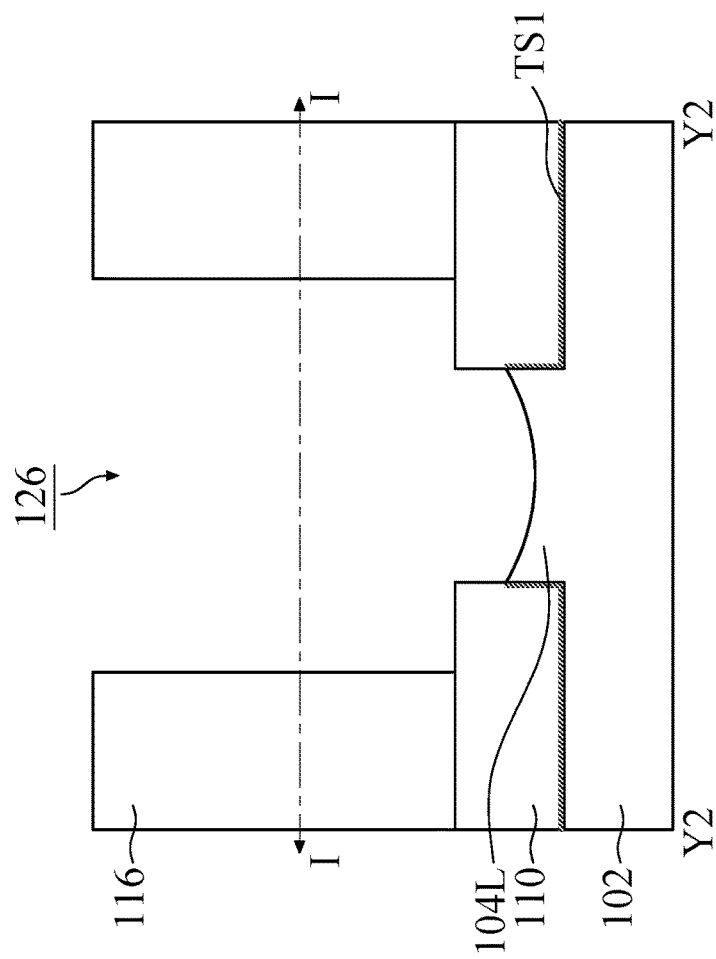
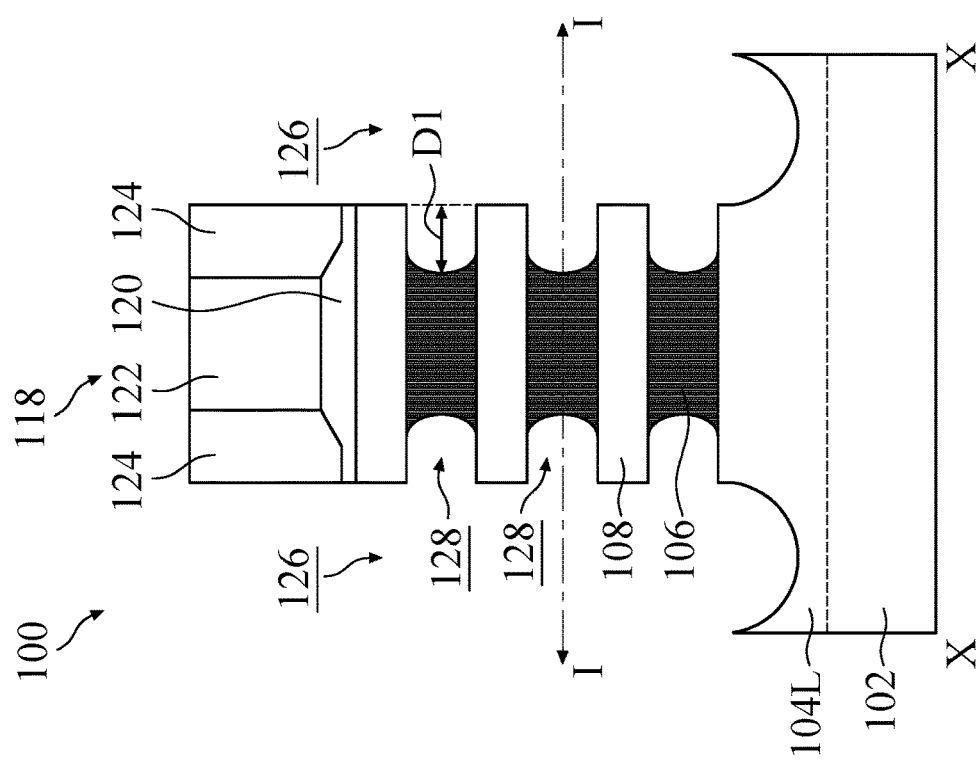
FIG. 2I-1  FIG. 2I-2

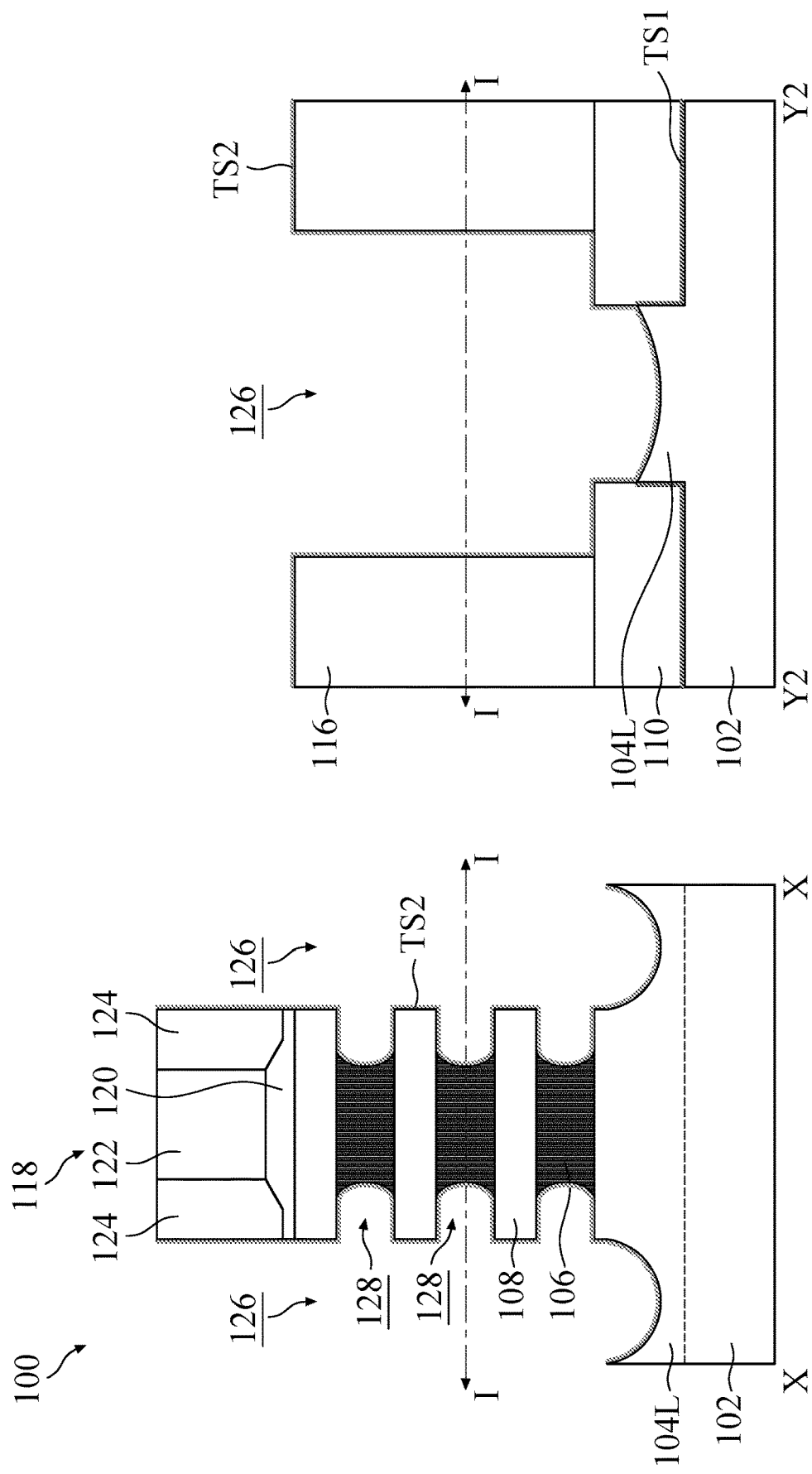

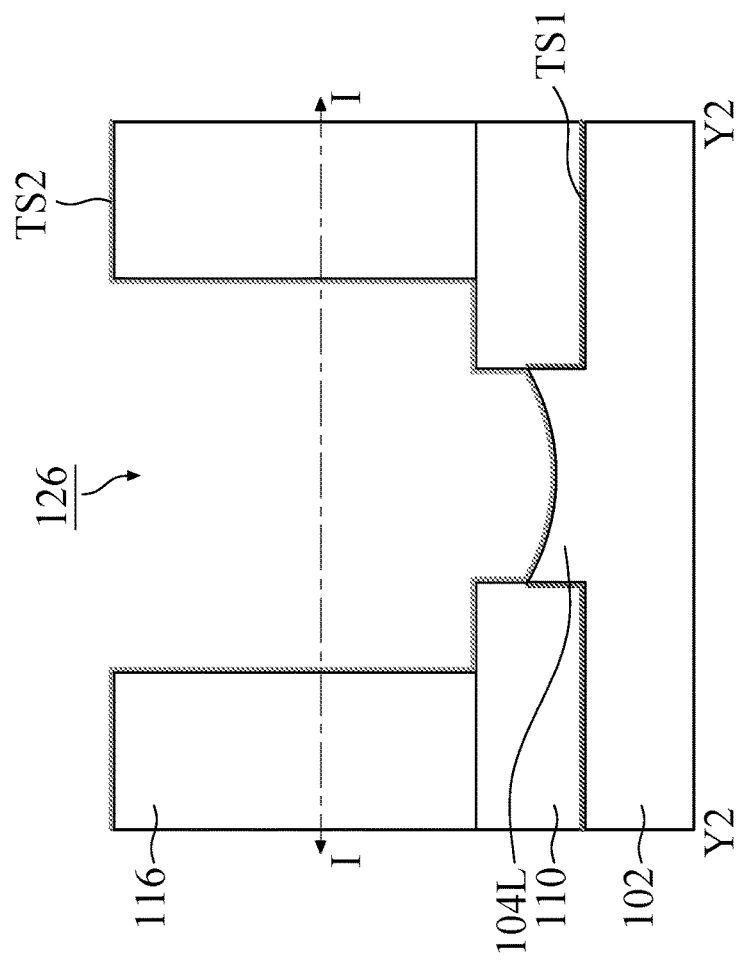
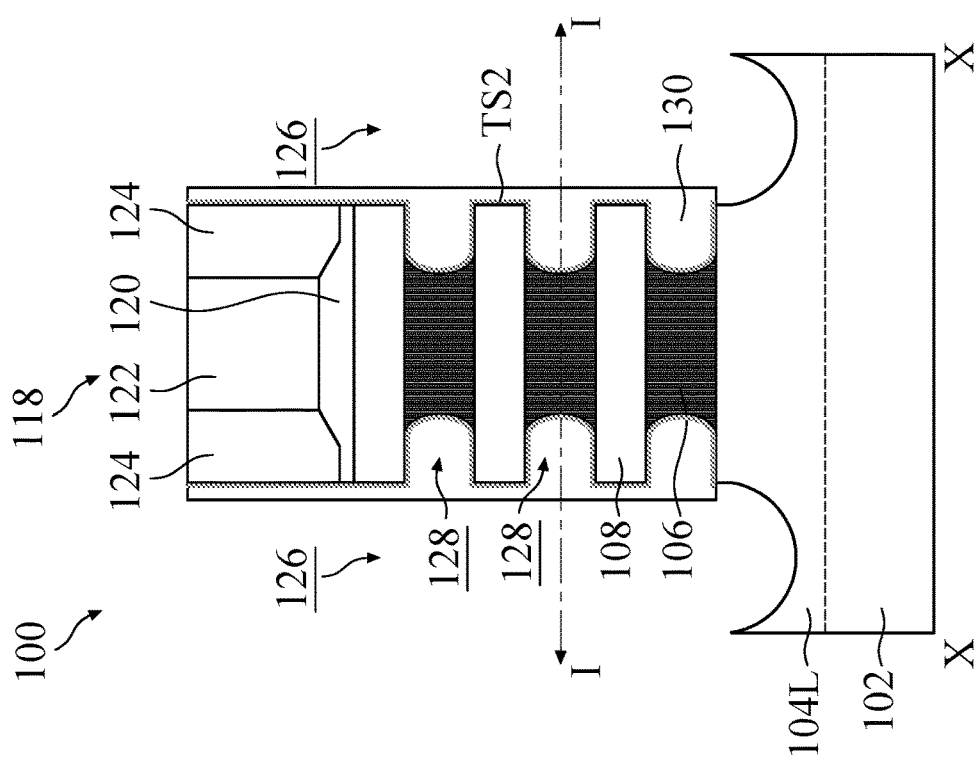
FIG. 2K-1
FIG. 2K-2

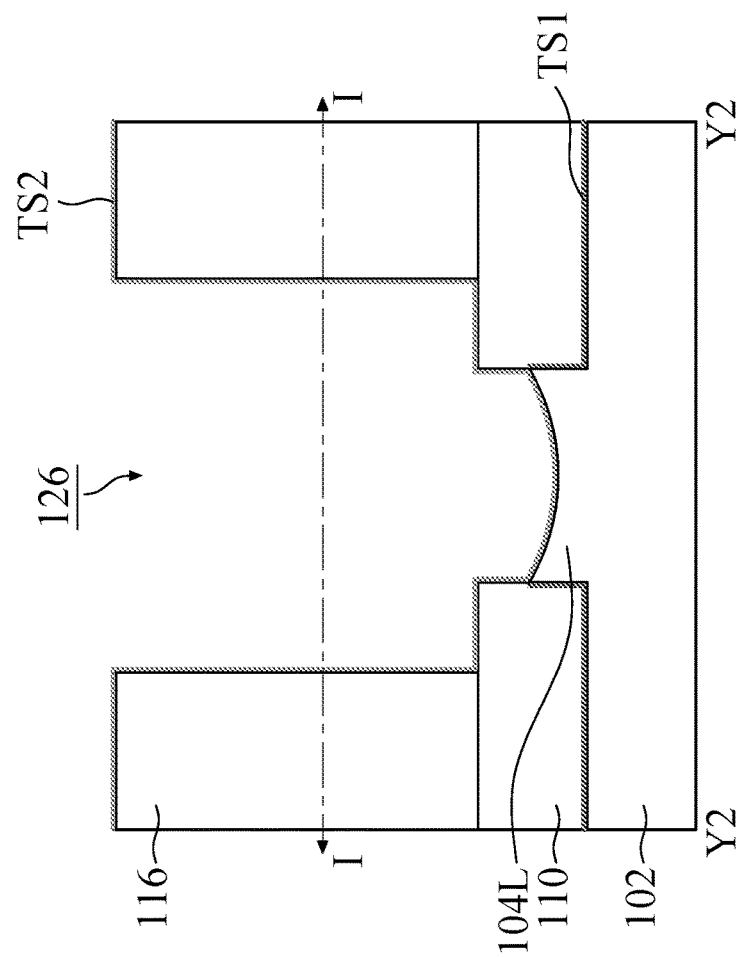
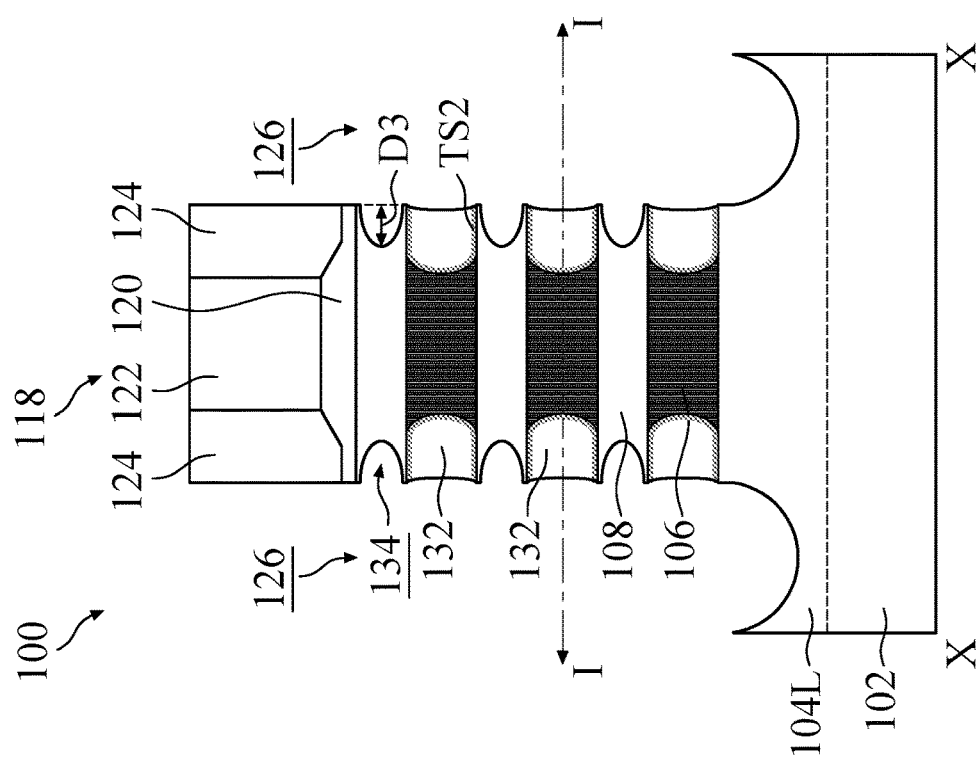
FIG. 2L-1
FIG. 2L-2

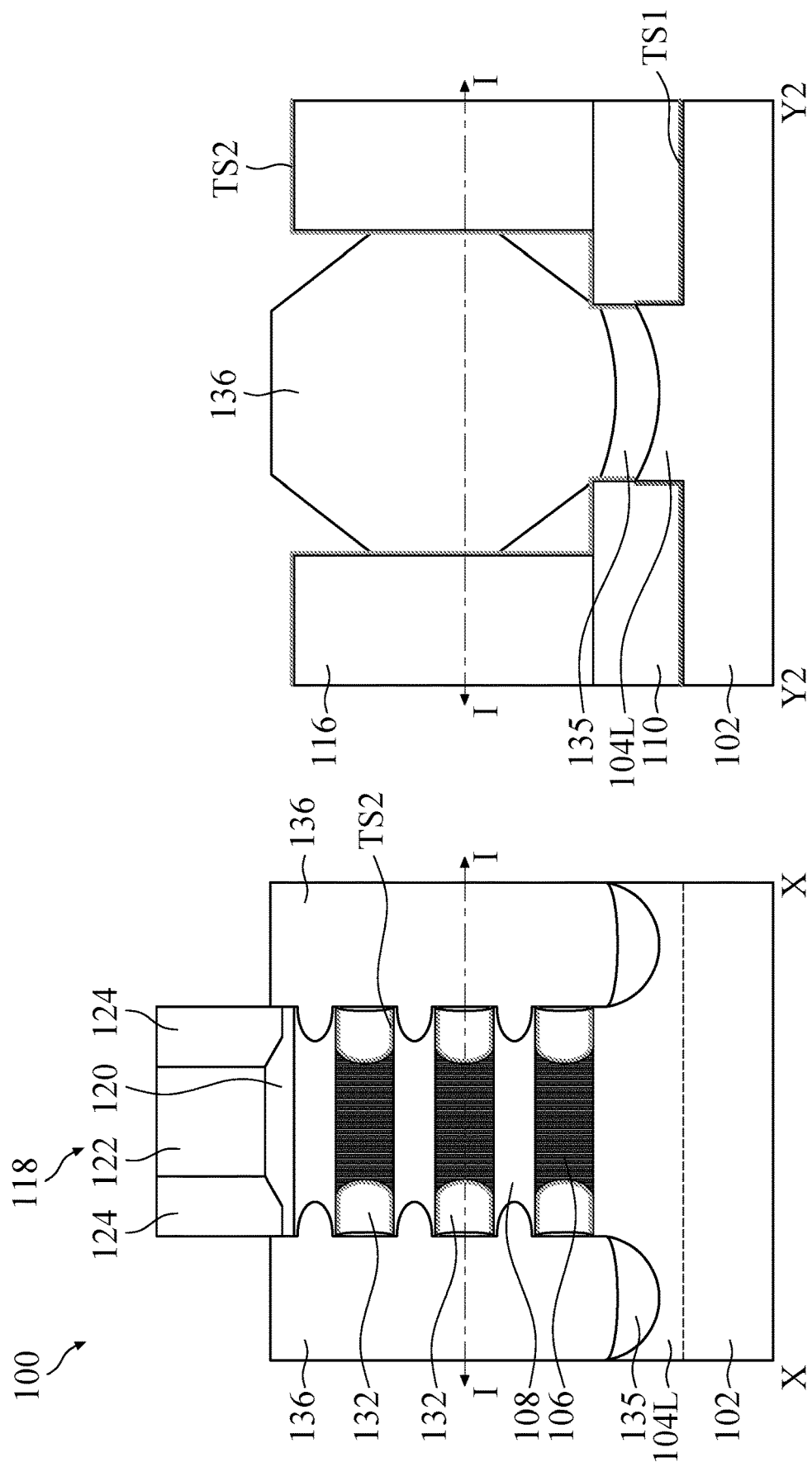

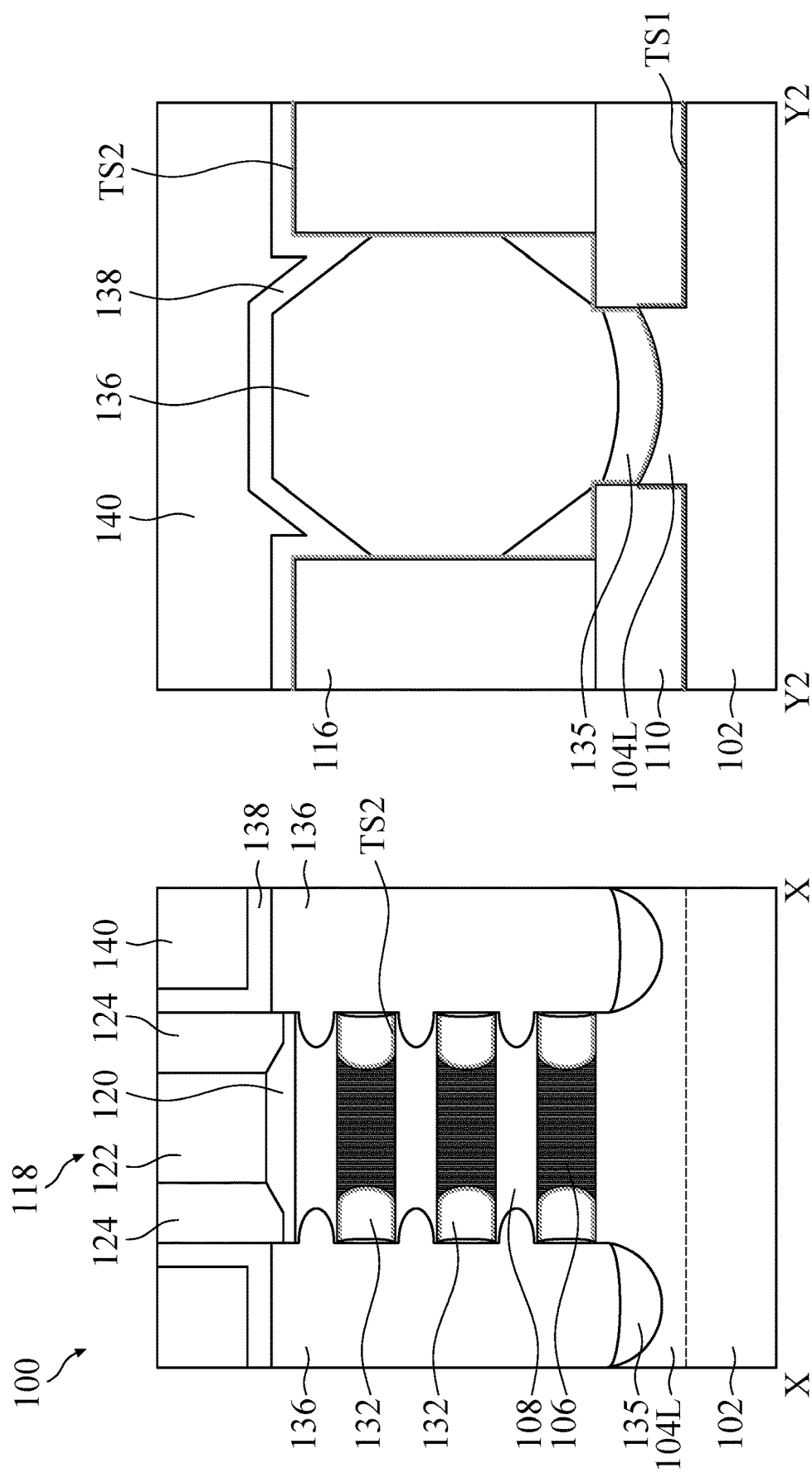

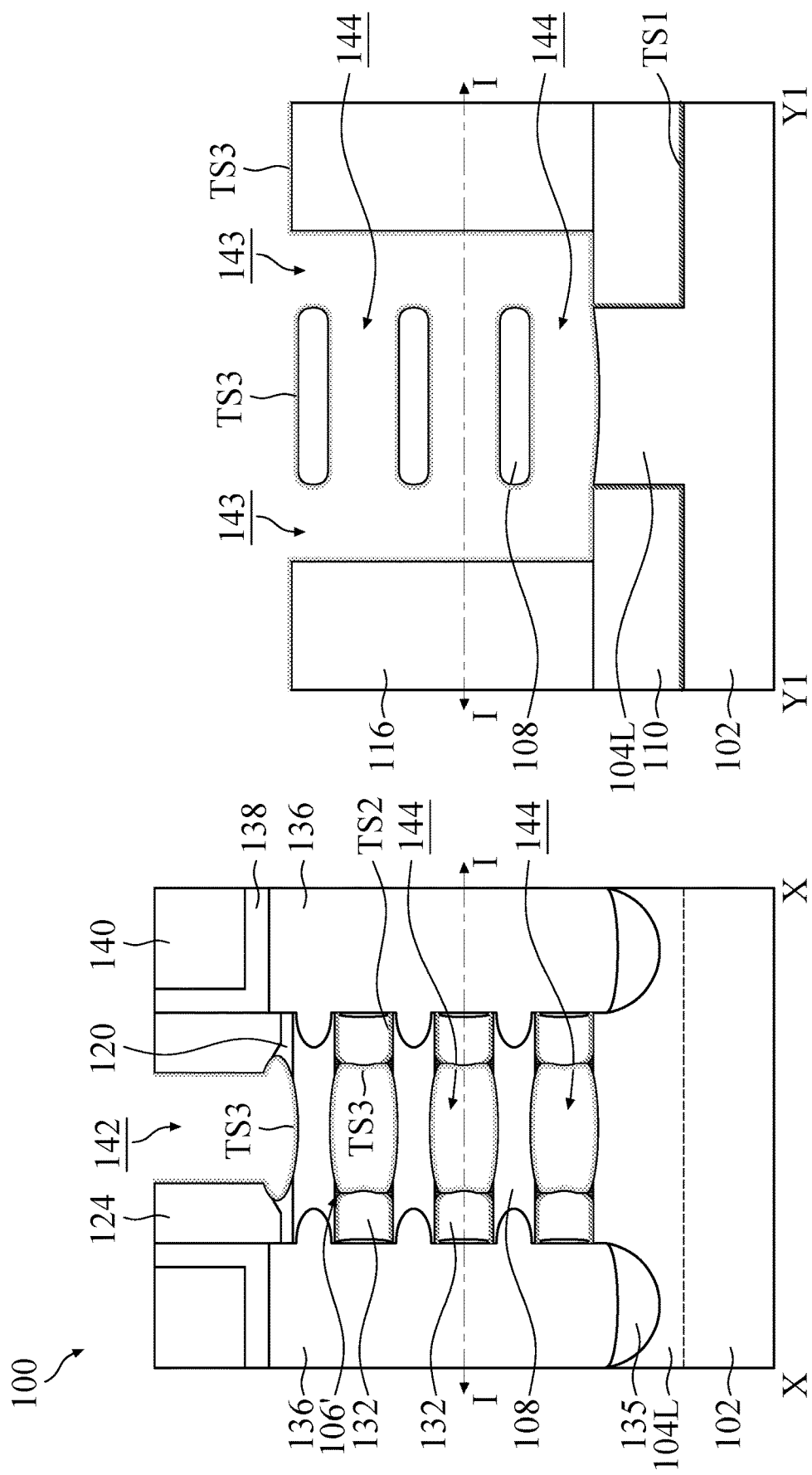

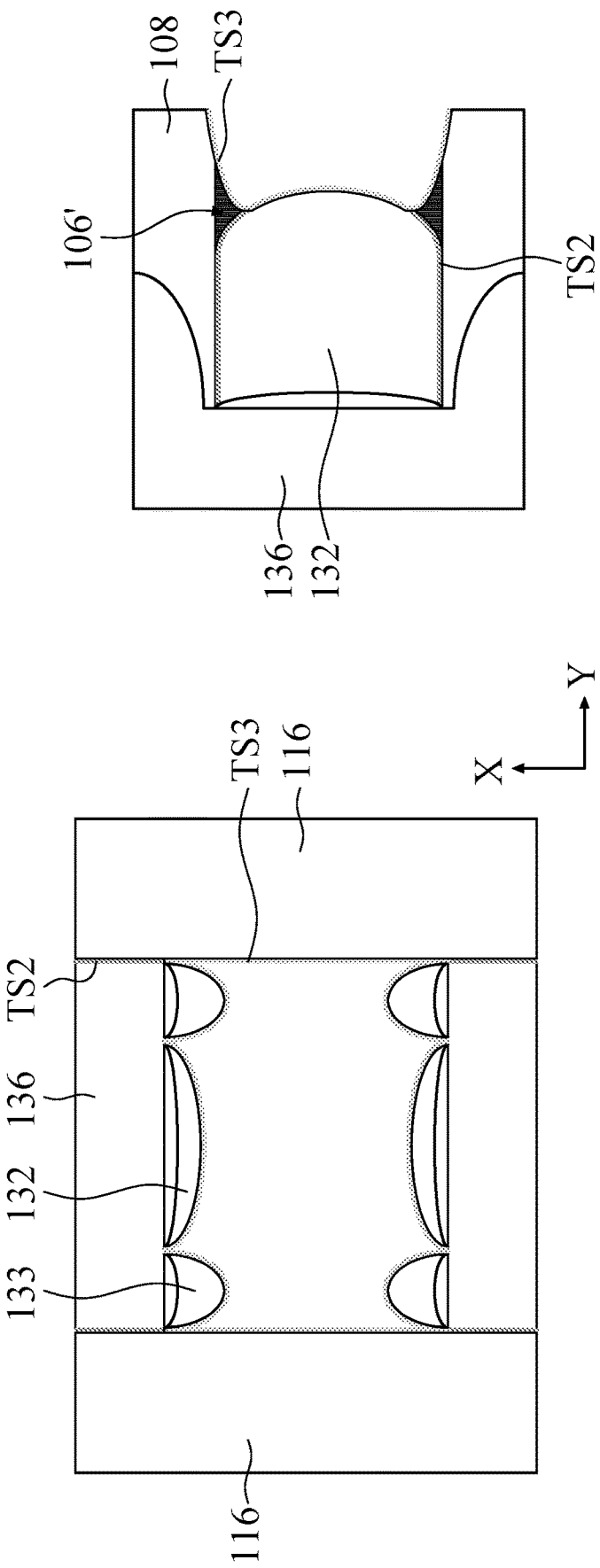

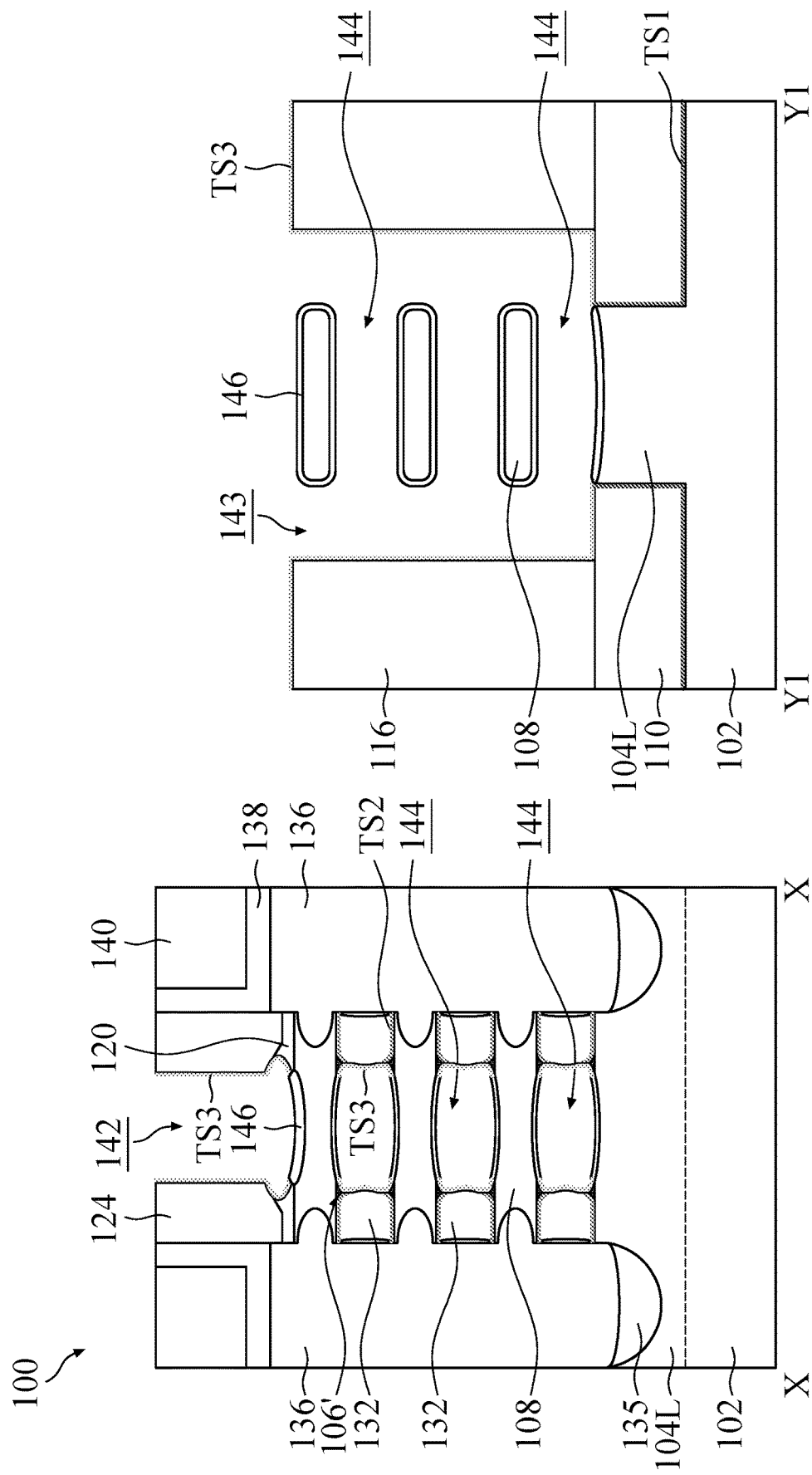

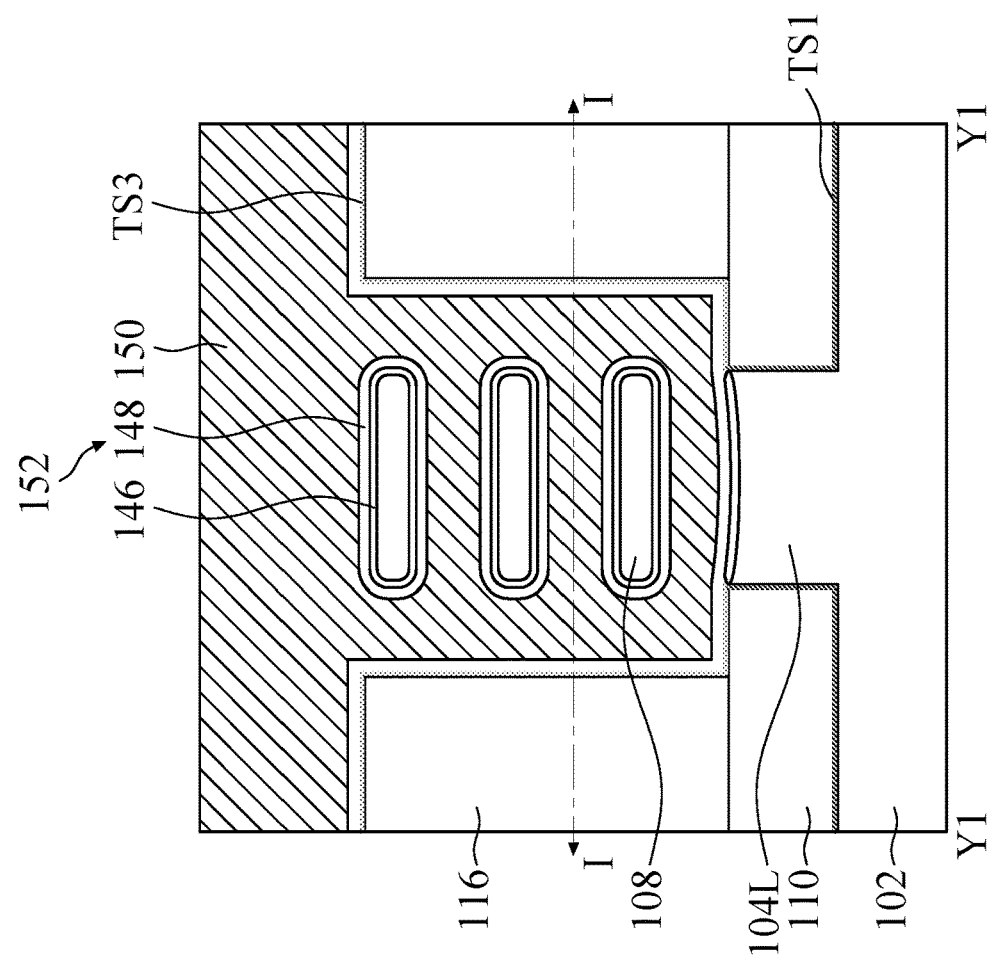
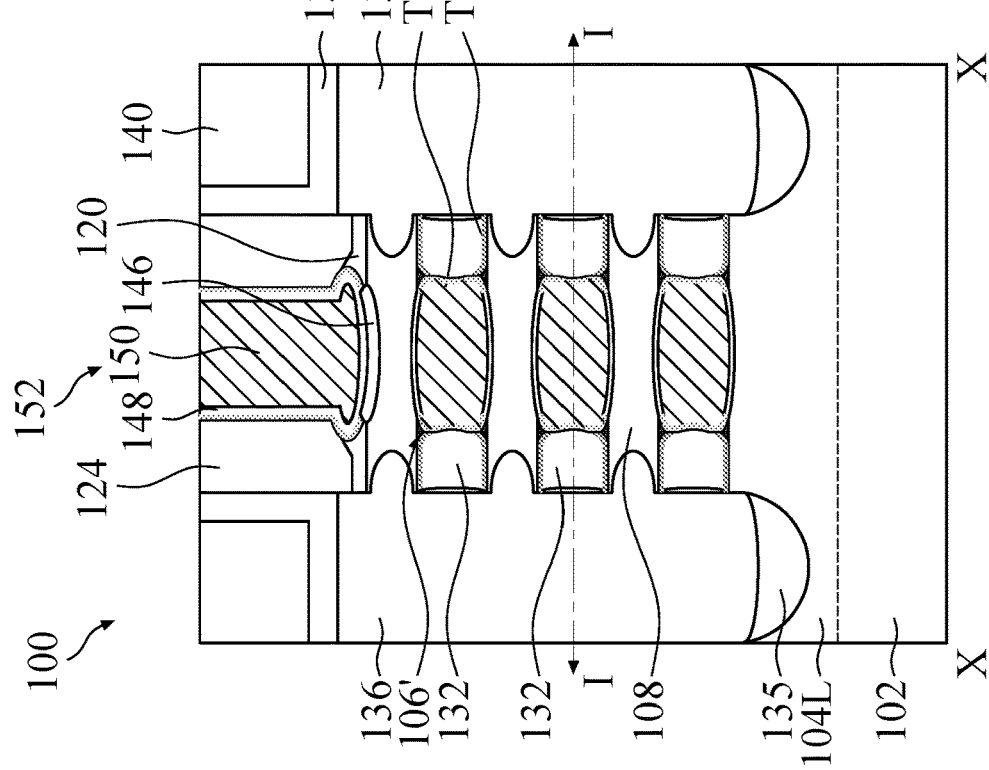
FIG. 2R-1
FIG. 2R-2

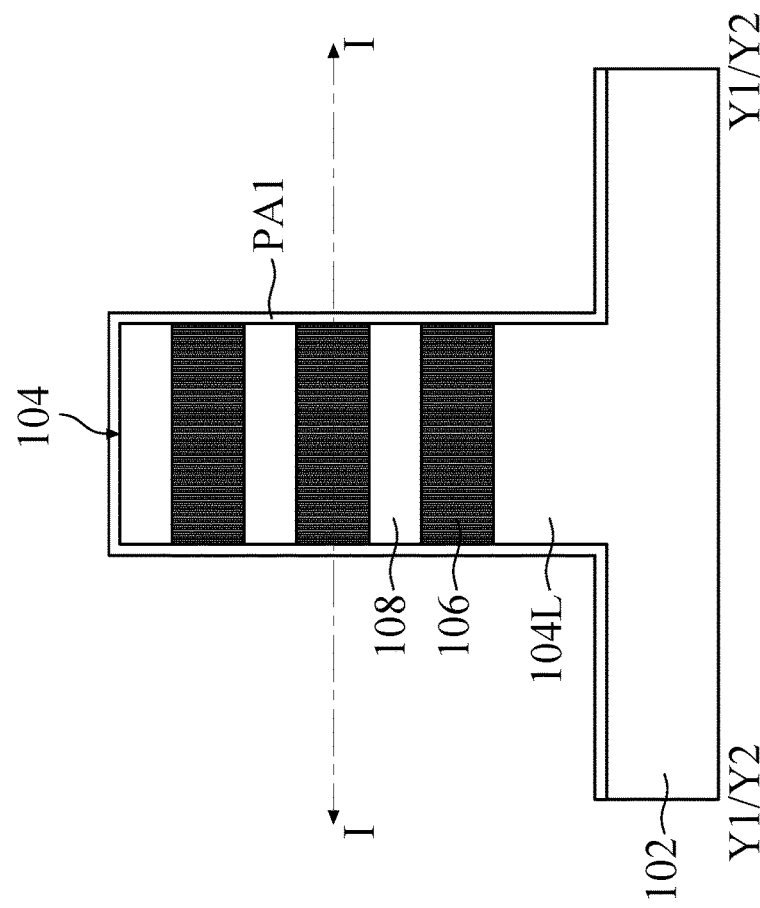
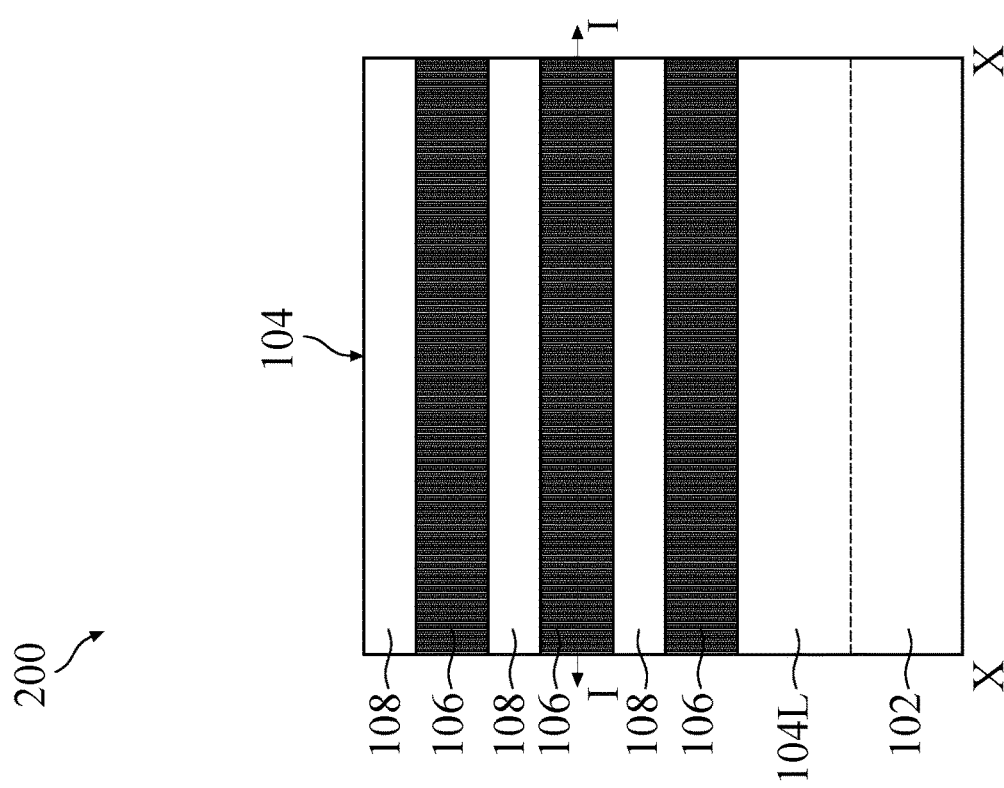
FIG. 3A-2
FIG. 3A-1

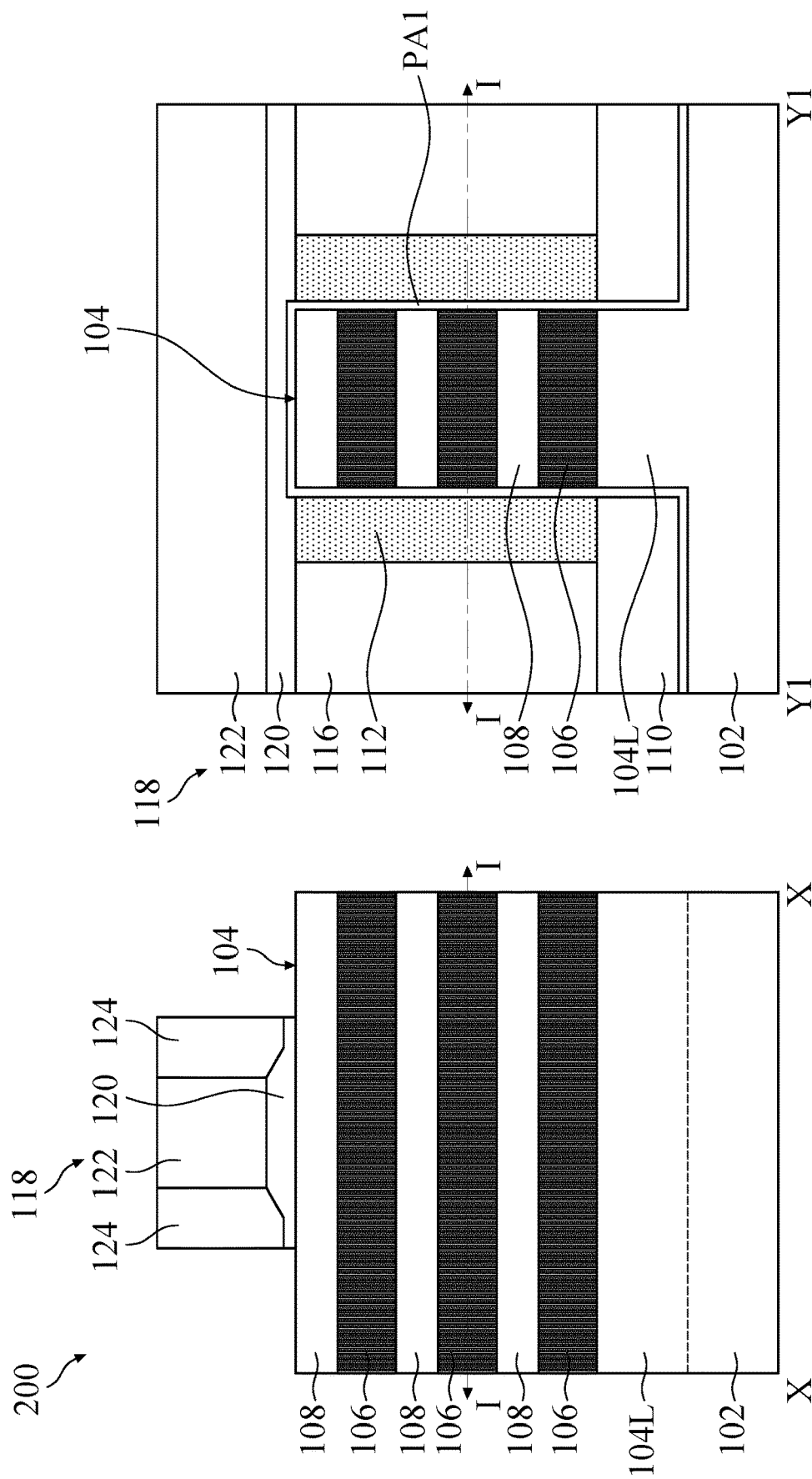

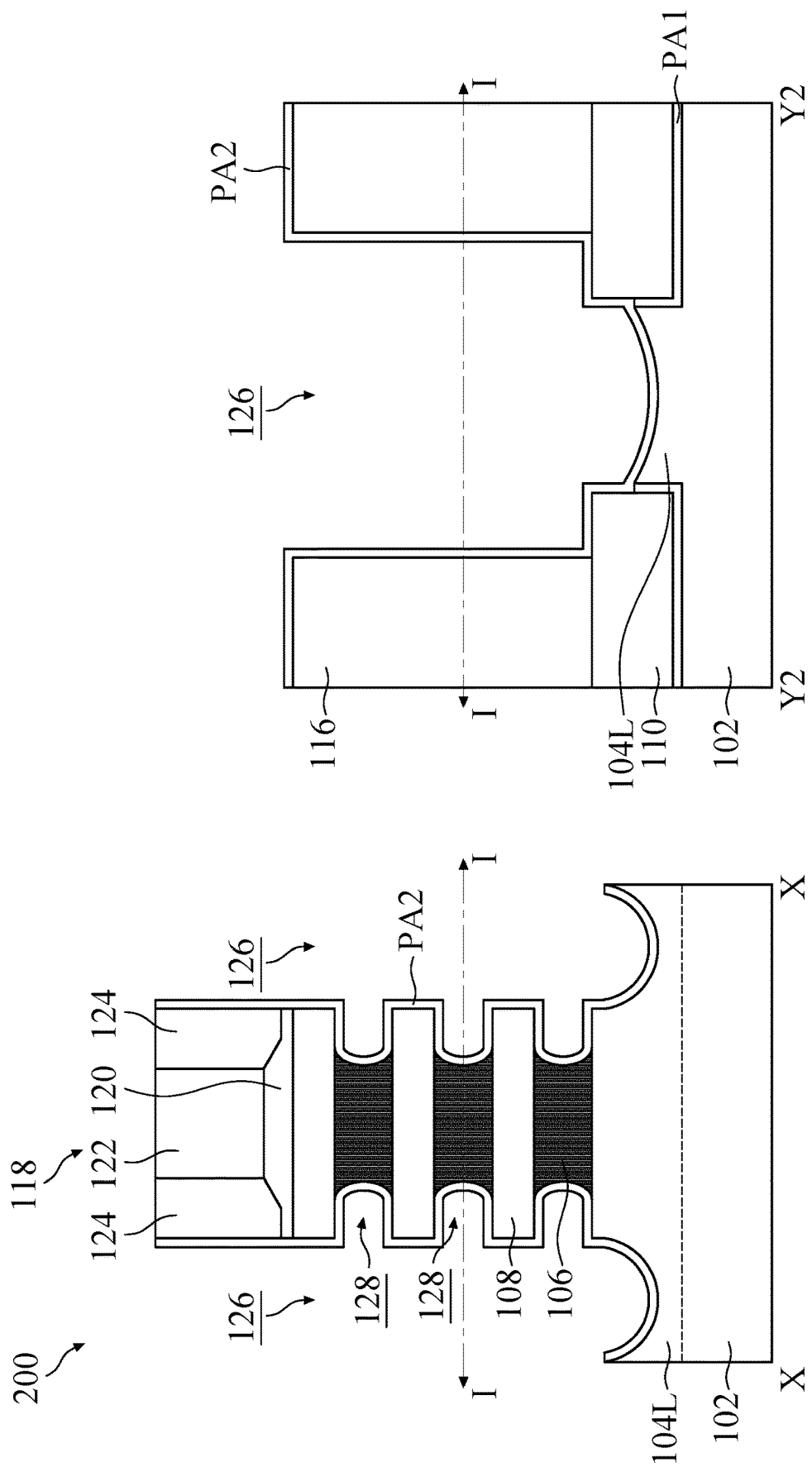

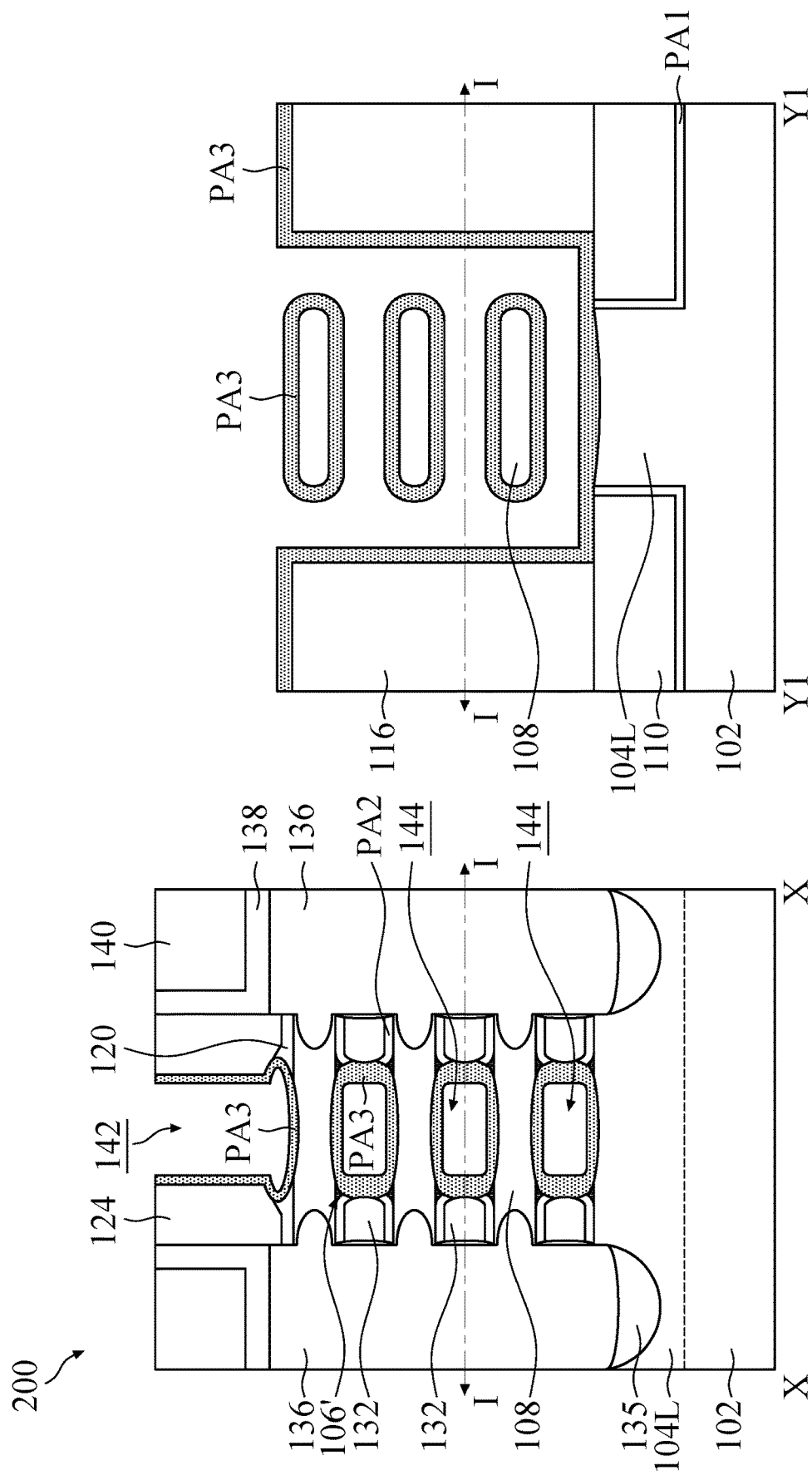

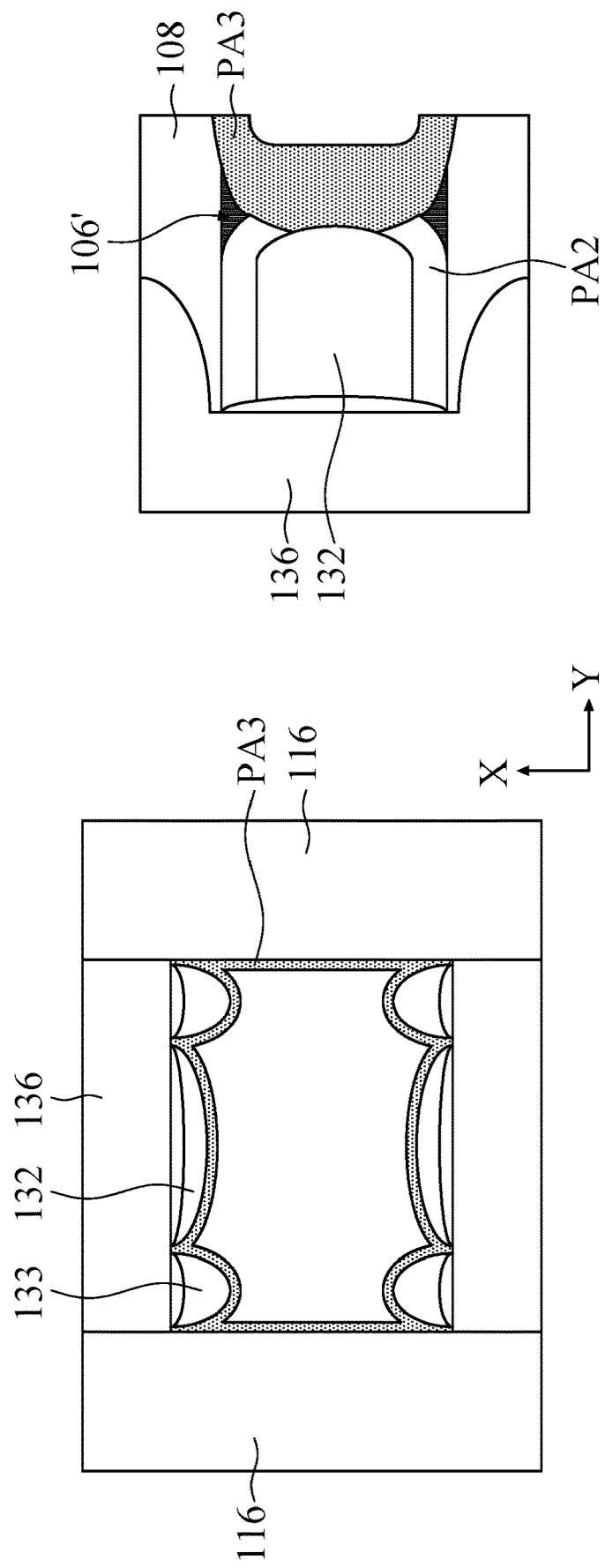

SEMICONDUCTOR STRUCTURE AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure, which can extend around the channel region and provide access to the channel on two or four sides. GAA devices are compatible with conventional complementary metal-oxide-semiconductor (CMOS) processes, and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2B-1, 2C-1, 2D-1, 2E-1, 2F-1, 2G-1, 2H-1, 2I-1, 2J-1, 2K-1, 2L-1, 2M-1, 2N-1, 2O-1, 2P-1, 2Q-1 and 2R-1 are cross-sectional views illustrating the formation of a semiconductor structure at various intermediate stages, in accordance with some embodiments of the disclosure.

FIGS. 2A-2, 2B-2, 2C-2, 2D-2, 2E-2, 2F-2, 2G-2, 2H-2, 2I-2, 2J-2, 2K-2, 2L-2, 2M-2, 2N-2, 2O-2, 2P-2, 2Q-2 and 2R-2 are cross-sectional views illustrating the formation of a semiconductor structure at various intermediate stages, in accordance with some embodiments of the disclosure.

FIGS. 2B-3, 2F-3, 2H-3, 2I-3, 2J-3, 2K-3, 2L-3, 2M-3, 2O-3, 2P-3 and 2R-3 are plan views illustrating the formation of a semiconductor structure at various intermediate stages, in accordance with some embodiments of the disclosure.

FIGS. 2O-4, 2P-4 and 2R-4 are enlarged views of FIGS. 2O-1, 2P-1 and 2R-1 to illustrate more detail of a remaining portion of a first semiconductor layer and neighboring components, in accordance with some embodiments of the disclosure.

FIGS. 3A-1, 3B-1, 3C-1, 3D-1, 3E-1, 3F-1, 3G-1, 3H-1 and 3I-1 are cross-sectional views illustrating the formation of a semiconductor structure at various intermediate stages, in accordance with some embodiments of the disclosure.

FIGS. 3A-2, 3B-2, 3C-2, 3D-2, 3E-2, 3F-2, 3G-2, 3H-2 and 3I-2 are cross-sectional views illustrating the formation of a semiconductor structure at various intermediate stages, in accordance with some embodiments of the disclosure.

FIGS. 3A-3, 3B-3, 3C-3, 3D-3, 3E-3, 3G-3, 3H-3 and 3I-3 are plan views illustrating the formation of a semiconductor structure at various intermediate stages, in accordance with some embodiments of the disclosure.

FIGS. 3G-4, 3H-4 and 3I-4 are enlarged views of FIGS. 3G-1, 3H-1 and 3I-1 to illustrate more detail of a remaining portion of a first semiconductor layer and neighboring components, in accordance with some embodiments of the disclosure.

DETAILED DESCRIPTION

Figure 1:
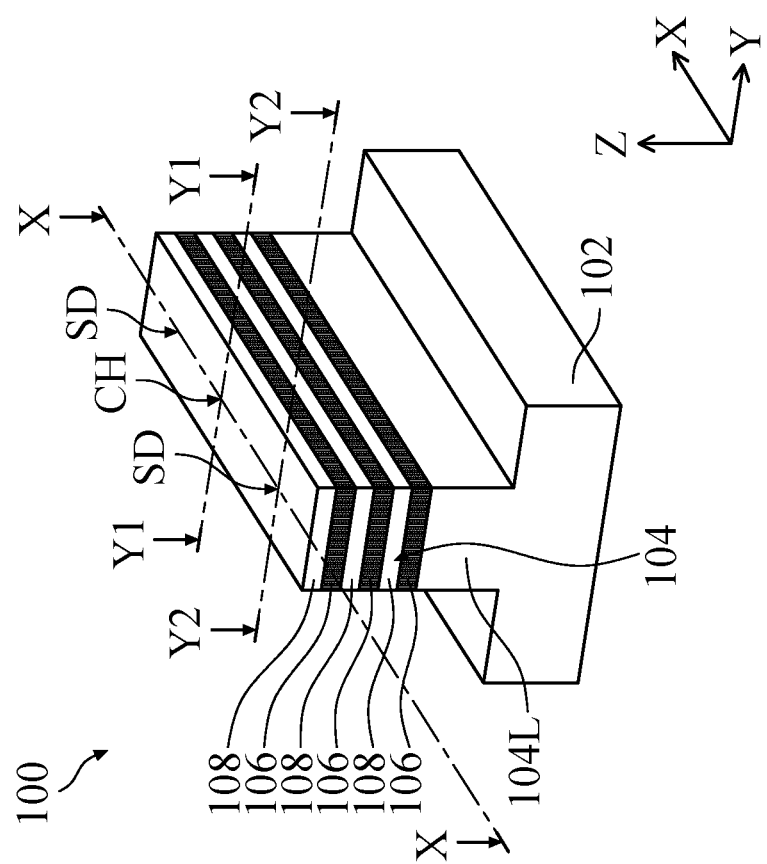
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of a semiconductor structure are provided. The aspect of the present disclosure is directed to forming passivation layers on exposed etched surfaces of SiGe layers. After the etching SiGe layers, dangling bonds may exist on the exposed etching surfaces. In accordance with the embodiments, once the SiGe layers are etched to have etched surfaces, a passivation layer may be formed to cover the exposed etched surfaces of the SiGe layers, thereby passivating the reactivity of the dangling bonds. In some embodiments, the formation of the passivation layer may include treating the exposed surfaces of the semiconductor structure with radicals (such as nitrogen radical, hydrogen radical, deuterium radical and/or sulfur radical). In some other embodiments, the formation of the passivation layer may include forming a silicon layer. Therefore, the density of interface trap (Dit) may be reduced, and the carrier mobility may be improved.

FIG. 1 is a perspective view of a semiconductor structure 100, in accordance with some embodiments. A semiconductor structure 100 is provided, as shown in FIG. 1, in accordance with some embodiments. The semiconductor structure 100 includes a substrate 102 and a semiconductor fin structure 104 over the substrate 102, in accordance with some embodiments. Although one semiconductor fin structure 104 is illustrated in FIG. 1, more than one semiconductor fin structures 104 may be formed over the semiconductor substrate 102.

For a better understanding of the semiconductor structure, X-Y-Z coordinate reference is provided in the figures of the present disclosure. The X-axis and the Y-axis are generally orientated along the lateral (or horizontal) directions that are parallel to the main surface of the substrate 102. The Y-axis is transverse (e.g., substantially perpendicular) to the X-axis. The Z-axis is generally oriented along the vertical direction that is perpendicular to the main surface of the substrate 102 (or the X-Y plane).

The semiconductor fin structure 104 includes a lower fin element 104L formed from a portion of the substrate 102 and an upper fin element formed from an epitaxial stack including alternating first semiconductor layers 106 and second semiconductor layer 108, in accordance with some embodiments. The semiconductor fin structure 104 extends in the X direction, in accordance with some embodiments. That is, the semiconductor fin structure 104 has a longitudinal axis parallel to the X direction, in accordance with some embodiments. The X direction may also be referred to as the channel-extending direction. The current of the resulting semiconductor device (i.e., nanostructure transistor) flows in the X direction through the channel.

The semiconductor fin structure 104 includes a channel region CH and source/drain regions SD, where the channel region CH is defined between the source/drain regions SD, in accordance with some embodiments. In this disclosure, a source/drain refers to a source and/or a drain. It is noted that in the present disclosure, a source and a drain are interchangeably used and the structures thereof are substantially the same. FIG. 1 shows one channel region CH and two source/drain regions SD for illustrative purpose and is not intended to be limiting. The number of the channel region CH and the source/drain regions may be dependent on the semiconductor device design demand and/or performance consideration. Gate structure or gate stack (not shown) will be formed with a longitudinal axis parallel to the Y direction and extending across and/or surrounds the channel region CH of the semiconductor fin structure 104. The Y direction may also be referred to as a gate-extending direction.

FIG. 1 further illustrates a reference cross-section that is used in later figures. Cross-section X-X is in a plan parallel to the longitudinal axis of the semiconductor fin structure 104 (X direction) and through the semiconductor fin structure 104, in accordance with some embodiments. Cross-section Y1-Y1 is in a plan parallel to the longitudinal axis of the gate structure (Y direction) and across the gate structure, in accordance with some embodiments. Cross-section Y2-Y2 is in a plan parallel to the longitudinal axis of the gate structure (Y direction) and across the source/drain region SD of the semiconductor fin structure 104, in accordance with some embodiments.

FIGS. 2A-1 through 2R-4 are cross-sectional views illustrating the formation of a semiconductor structure 100 at various intermediate stages, in which FIGS. 2A-1, 2B-1, 2C-1, 2D-1, 2E-1, 2F-1, 2G-1, 2H-1, 2I-1, 2J-1, 2K-1, 2L-1, 2M-1, 2N-1, 2O-1, 2P-1, 2Q-1 and 2R-1 correspond to cross-section X-X shown in FIG. 1, FIGS. 2A-2, 2B-2, 2C-2, 2D-2, 2E-2 and 2F-2 correspond to cross-section Y1-Y1 or cross-section Y2-Y2 shown in FIG. 1, FIGS. 2G-2, 2O-2, 2P-2, 2Q-2 and 2R-2 correspond to cross-section Y1-Y1 shown in FIG. 1, and FIGS. 2H-2, 2I-2, 2J-2, 2K-2, 2L-2, 2M-2 and 2N-2 correspond to cross-section Y2-Y2 shown in FIG. 1, in accordance with some embodiments of the disclosure.

FIGS. 2B-3, 2F-3, 2H-3, 2I-3, 2J-3, 2K-3, 2L-3, 2M-3, 2O-3, 2P-3 and 2R-3 are plan views of the semiconductor structure 100 taken along line I-I shown in FIGS. 2B-1, 2F-1, 2H-1, 2I-1, 2J-1, 2K-1, 2L-1, 2M-1, 2O-1, 2P-1 and 2R-1 and these figures ending with "-2", in accordance with some embodiments of the disclosure.

Figures 2, 2A:
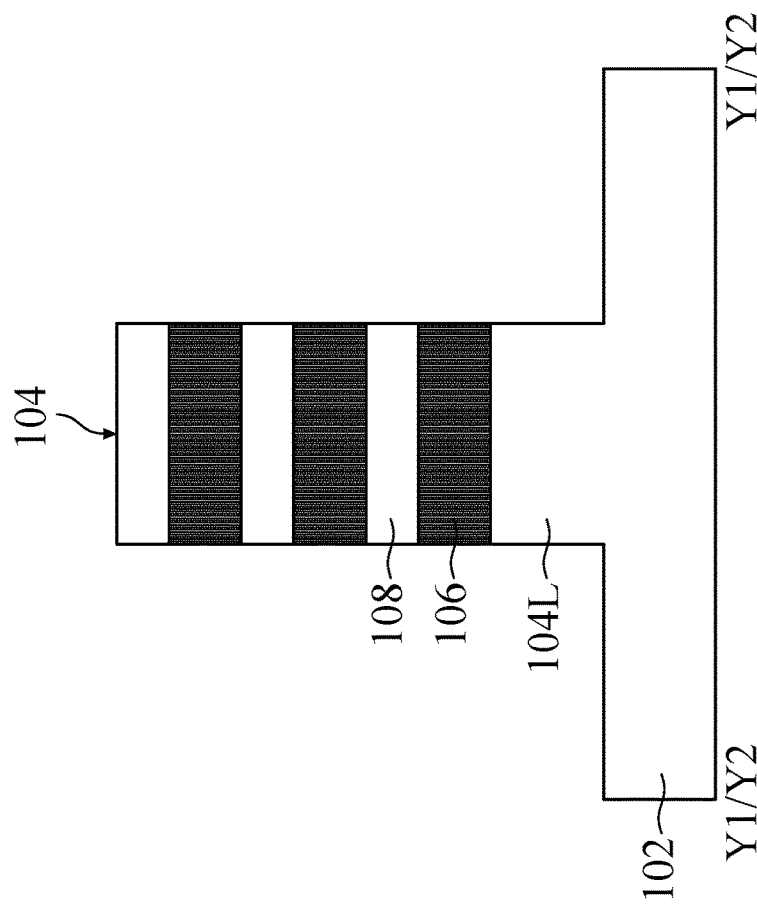
Figures 1, 2A:
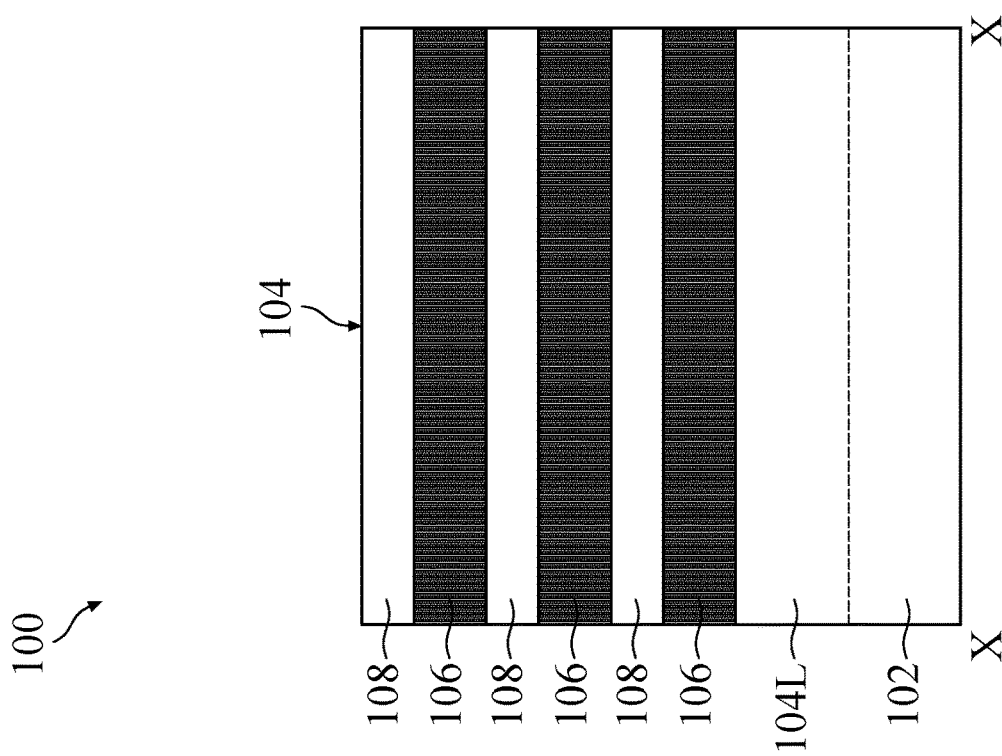

FIGS. 2A-1 and 2A-2 illustrate a semiconductor structure 100 after the formation of a semiconductor fin structure 104, in accordance with some embodiments.

A semiconductor structure 100 is provided, as shown in FIGS. 2A-1 and 2A-2, in accordance with some embodiments. The semiconductor structure 100 includes a substrate 102 and a semiconductor fin structure 104, in accordance with some embodiments.

The substrate 102 may be a portion of a semiconductor wafer, a semiconductor chip (or die), and the like. In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

The formation of the semiconductor fin structure 104 includes forming an epitaxial stack over the substrate 102 using an epitaxial growth process, in accordance with some embodiments. The epitaxial stack includes alternating first semiconductor layers 106 and second semiconductor layers 108, in accordance with some embodiments. The epitaxial growth process may be molecular beam epitaxy (MBE), metal organic chemical vapor deposition (MOCVD), or vapor phase epitaxy (VPE), or another suitable technique.

In some embodiments, the first semiconductor layers 106 are made of a first semiconductor material and the second semiconductor layers 108 are made of a second semiconductor material with a different composition than the first semiconductor material. The first semiconductor material for the first semiconductor layers 106 has a different lattice constant than the second semiconductor material for the second semiconductor layers 108, in accordance with some embodiments. In some embodiments, the first semiconductor material and the second semiconductor material have different oxidation rates and/or etching selectivity.

In some embodiments, the first semiconductor layers 106 are made of SiGe, where the percentage of germanium (Ge) in the SiGe is in a range from about 20 atomic % to about 50 atomic %, and the second semiconductor layers 108 are made of pure or substantially pure silicon. In an embodiment, the second semiconductor layers 108 are undoped such as intrinsic silicon. For example, an impurity (or an n-type dopant and/or a p-type dopant) in the second semiconductor layers 108 has a concentration of less than about $10^{14}$ cm$^{-3}$. In some embodiments, the first semiconductor layers 106 are $Si_{1-x}Ge_x$, where x is more than about 0.3, or Ge (x=1.0) and the second semiconductor layers 108 are Si or $Si_{1-y}Ge_y$, where y is less than about 0.4, and x>y.

The first semiconductor layers 106 are configured as sacrificial layers and will be removed to form gaps to accommodate gate materials, in accordance with some embodiments. The second semiconductor layers 108 will form nanostructures (e.g., nanowires or nanosheets) that laterally extend between source/drain features and serve as the channel for the resulting semiconductor device (such as a nanostructure transistor), in accordance with some embodiments. As the term is used herein, "nanostructures" refers to semiconductor layers that have cylindrical shape, bar shaped and/or sheet shape. Gate stack (not shown) will be formed across and wrap around the nanostructures, in accordance with some embodiments.

In some embodiments, the thickness of each of the first semiconductor layers 106 is in a range from about 3 nm to about 20 nm, such as about 4 nm to about 12 nm. In some embodiments, the thickness of each of the second semiconductor layers 108 is in a range from about 3 nm to about 20 nm, such as about 4 nm to about 12 nm. The thickness of the second semiconductor layers 108 may be greater than, equal to, or less than the first semiconductor layers 106, which may depend on the amount of gate materials to be filled in spaces where the first semiconductor layers 106 are removed.

Although three first semiconductor layers 106 and three second semiconductor layers 108 are shown in FIGS. 2A-1 and 2A-2, the numbers are not limited to three, and can be 1, 2 or more than 3, and is less than 20. By adjusting the number of the semiconductor layers, a driving current of the resulting semiconductor device can be adjusted.

The epitaxial stack (including the first semiconductor layers 106 and the second semiconductor layers 108) are patterned into the semiconductor fin structure 104, in accordance with some embodiments. In some embodiments, the patterning process includes forming a patterned hard mask layer (not shown) over the epitaxial stack. In some embodiments, the patterned hard mask layer is made of one or more dielectric materials such as nitride (such as silicon nitride) and/or oxide (such as silicon oxide).

An etching process is then performed to remove portions of the epitaxial stack and underlying substrate 102 uncovered by the patterned hard mask layer, thereby forming trenches and the semiconductor fin structure 104 protruding from between the trenches, in accordance with some embodiments. The etching process may be an anisotropic etching process, e.g., dry plasma etching. The patterned hard mask layer may be optionally removed by an etching process or an ashing process.

FIGS. 2B-1, 2B-2 and 2B-3 illustrate a semiconductor structure 100 after a first passivation process, in accordance with some embodiments.

After the etching process for forming the semiconductor fin structure 104, residues, polymers and/or etching byproducts due to the etching process leave on the exposed surfaces of the semiconductor structure 100, in accordance with some embodiments. A clean process is performed on the semiconductor structure 100 to remove the residues, polymers and/or byproducts, in accordance with some embodiments. In some embodiments, the clean process includes immersing the semiconductor structure 100 in SPM (sulfuric acid and hydrogen peroxide mixture) solution, SC-1 (RCA Standard Clean-1) solution, and/or SC-2 (RCA Standard Clean-2) solution. The clean process may be performed at a temperature from room temperature (about 25° C.) to about 50° C.

In addition, after the etching process for forming the semiconductor fin structure 104, dangling bonds may exist on the exposed etching surfaces (i.e., the sidewalls) of the first semiconductor layers 106 of the semiconductor fin structure 104. A first passivation process is performed on the semiconductor structure 100 to passivate the dangling bonds of the first semiconductor layers 106 on the exposed surfaces, in accordance with some embodiments.

The first passivation process includes treating the exposed surfaces of the semiconductor structure 100 using radicals that tend to bond to the dangling bonds of the first semiconductor layers 106, in accordance with some embodiments. The treated surfaces of the semiconductor structure 100 is denoted as TS1, as shown in FIGS. 2B-1, 2B-2 and 2B-3, in accordance with some embodiments. In some embodiments, the radicals are nitrogen radical, hydrogen radical, deuterium radical and/or sulfur radical.

For example, the semiconductor structure 100 is placed in a processing chamber which may be equipped with a remote plasma system (RPS). Processing gases (e.g., nitrogen gas, ammonia gas, hydrogen gas, deuterium gas and/or sulfur hexafluoride gas) pass through the RPS and are formed into radicals, and the radicals then flow into the processing chamber. The semiconductor structure 100 is soaked with the radicals, and the radicals are absorbed onto the exposed surface of the semiconductor structure 100, in accordance with some embodiments. The dangling bonds of the first semiconductor layers 106 are boned with the radicals, thereby passivating the reactivity of the dangling bonds, in accordance with some embodiments. In some embodiments, the first passivation process is performed at a temperature in a range from about 200° C. to about 700° C.

In some embodiments, the radicals may diffuse into a surface portion (e.g., within 1 angstrom (Å) from the treated surfaces TS1) of the components (such as the first semiconductor layers 106 and/or the second semiconductor layers 108) of the semiconductor structure 100.

The dangling bonds of the first semiconductor layers 106 have high reactivity. When the semiconductor structure is subjected to subsequent thermal processes (such as deposition processes and/or annealing processes), the first semiconductor layers 106 may be easily oxidized from the exposed etched surface where dangling bonds exist, especially if the residues, polymers and/or etching byproducts remain on the exposed etched surface of the first semiconductor layers 106. The oxide of the first semiconductor layers 106 (e.g., GeO$_x$) may provide a path for germanium atoms from the first semiconductor layers 106 to easily diffuse into the second semiconductor layers 108, which may increase the density of interface trap (Dit). As a result, the scattering of carriers (e.g., electrons and/or holes) may increase, and thus the carrier mobility may degrade.

The first passivation process decreases the reactivity of the dangling bonds and thus may mitigate or prevent oxide formation, in accordance with some embodiments. Therefore, Dit may be reduced, which may in turn improve the performance of the resulting semiconductor device.

In some embodiments, the treated surface portions of the first semiconductor layers 106 may serve as the passivation layers which cover the exposed surface of the first semiconductor layers 106. In some embodiments, after the first passivation process, the atoms (e.g., nitrogen, hydrogen, deuterium and/or sulfur) for forming radicals may have a higher concentration at the treated surfaces TS1 than the concentration of the inner bulk portion of the semiconductor structure 100, or may have the highest concentration at the treated surfaces TS1. In an embodiment in which the nitrogen radicals are used, nitrogen in the first semiconductor layers 106 has a maximum concentration at the treated surface portion.

FIGS. 2C-1 and 2C-2 illustrate a semiconductor structure 100 after the formation of an isolation structure 110, in accordance with some embodiments.

An isolation structure 110 is formed to surround the lower fin element 104L of the semiconductor fin structure 104, as shown in FIGS. 2C-1 and 2C-2, in accordance with some embodiments. In some embodiments, the isolation structure 110 is made of silicon oxide (SiO$_2$), silicon nitride (SiN), silicon oxynitride (SiON), another suitable insulating material, multilayers thereof, or a combination thereof.

The formation of the isolation structure 110 includes depositing an insulating material for the isolation structure 110 over the semiconductor fin structure 104 and the substrate 102, in accordance with some embodiments. In some embodiments, the deposition process includes CVD such as low-pressure CVD (LPCVD), plasma-enhanced CVD (PECVD), high density plasma CVD (HDP-CVD), high aspect ratio process (HARP), or flowable CVD (FCVD)), atomic layer deposition (ALD), another suitable technique, or a combination thereof. In some embodiments, the insulating material may be bi-layered or multi-layered, for example, a lining layer and a bulk layer over the lining layer.

A planarization process is then performed to remove a portion of the insulating material above the top surface of the semiconductor fin structure 104 until the semiconductor fin structure 104 is exposed, in accordance with some embodiments. In some embodiments, the planarization process is an etching-back process such as dry plasma etching and/or wet chemical etching, and/or a chemical mechanical polishing (CMP) process.

The insulating material is then recessed using an etching process (such as anisotropic etching process such as dry plasma etching, an isotropic etching process such as dry chemical etching, remote plasma etching or wet chemical etching, or a combination thereof) to form trenches exposing the upper fin element, in accordance with some embodiments.

The remainder of the insulating material serves as the isolation structure 110, in accordance with some embodiments. The isolation structure 110 is configured to electrically isolate adjacent active regions (e.g., the semiconductor fin structures 104) of the semiconductor structure 100 and is also referred to as a shallow trench isolation (STI) feature, in accordance with some embodiments.

FIGS. 2D-1 and 2D-2 illustrate a semiconductor structure 100 after the formation of a semiconductor capping layer 112, in accordance with some embodiments.

A semiconductor capping layer 112 is formed on the treated surface TS1 of the upper fin element of the semiconductor fin structure 104 and surrounds the upper fin element using an epitaxial growth process, as shown in FIGS. 2D-1 and 2D-2, in accordance with some embodiments. The semiconductor capping layer 112 partially fills the trenches, in accordance with some embodiments. The epitaxial growth process may be MBE, MOCVD, or VPE, another suitable technique, or a combination thereof. In some embodiments, the semiconductor capping layer 112 may substantially be not formed along the dielectric surface of the isolation structure 110 due to the characteristics of the epitaxial growth process.

In some embodiments, the semiconductor capping layer 112 are made of semiconductor material such as silicon germanium. In some embodiment, the percentage of germanium in the semiconductor capping layer 112 may less than, the same as, or higher than the percentage of germanium in the first semiconductor layers 106.

The semiconductor structure 100 is passivated to have treated surface TS1 which may suppress the diffusion of the germanium from the semiconductor capping layer 112 into the second semiconductor layers 108 during subsequent thermal processes, in accordance with some embodiments.

FIGS. 2E-1 and 2E-2 illustrate a semiconductor structure 100 after the formation of a dielectric material 114, in accordance with some embodiments.

A dielectric material 114 is formed over the semiconductor capping layer 112 and the isolation structure 110, as shown in FIGS. 2E-1 and 2E-2, in accordance with some embodiments. The dielectric material 114 overfills the remainder of the trenches, in accordance with some embodiments.

In some embodiments, the dielectric material 114 is dielectric material having a dielectric constant less than about 7 such as silicon oxide (SiO$_2$), silicon nitride (SiN), silicon oxynitride (SiON), silicon oxycarbide (SiOC), silicon carbon nitride (SiCN), silicon oxycarbonitride (SiOCN), or oxygen-doped silicon carbonitride (Si(O)CN), and/or dielectric material having a dielectric constant greater than about 7, such as Al$_2$O$_3$, HfO$_2$, ZrO$_2$, HfAlO, HfSiO, a multilayer thereof, or a combination thereof. In some embodiments, the dielectric material 114 is deposited using CVD (such as FCVD, LPCVD, PECVD, HDP-CVD or HARP), ALD, another suitable technique, or a combination thereof.

FIGS. 2F-1, 2F-2 and 2F-3 illustrate a semiconductor structure 100 after a planarization process, in accordance with some embodiments.

Figures 2, 2B, 3:
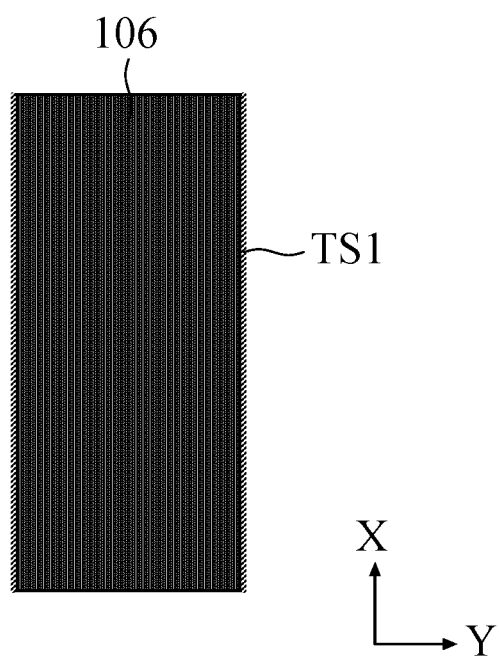
Figures 2, 2F, 3:
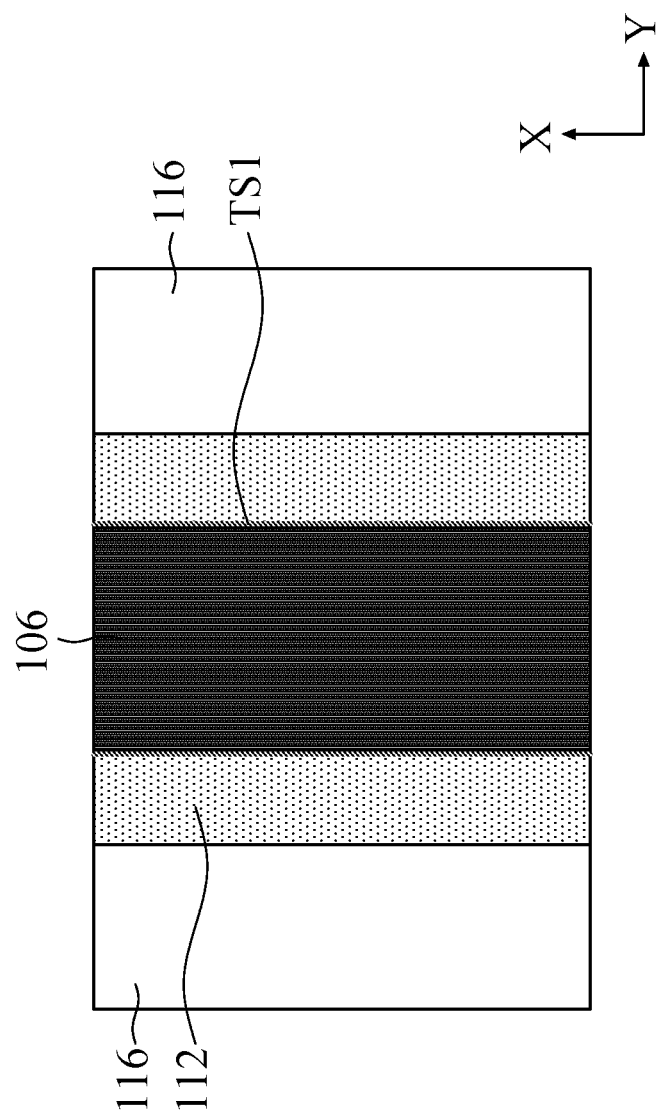
Figures 2, 2H, 3:
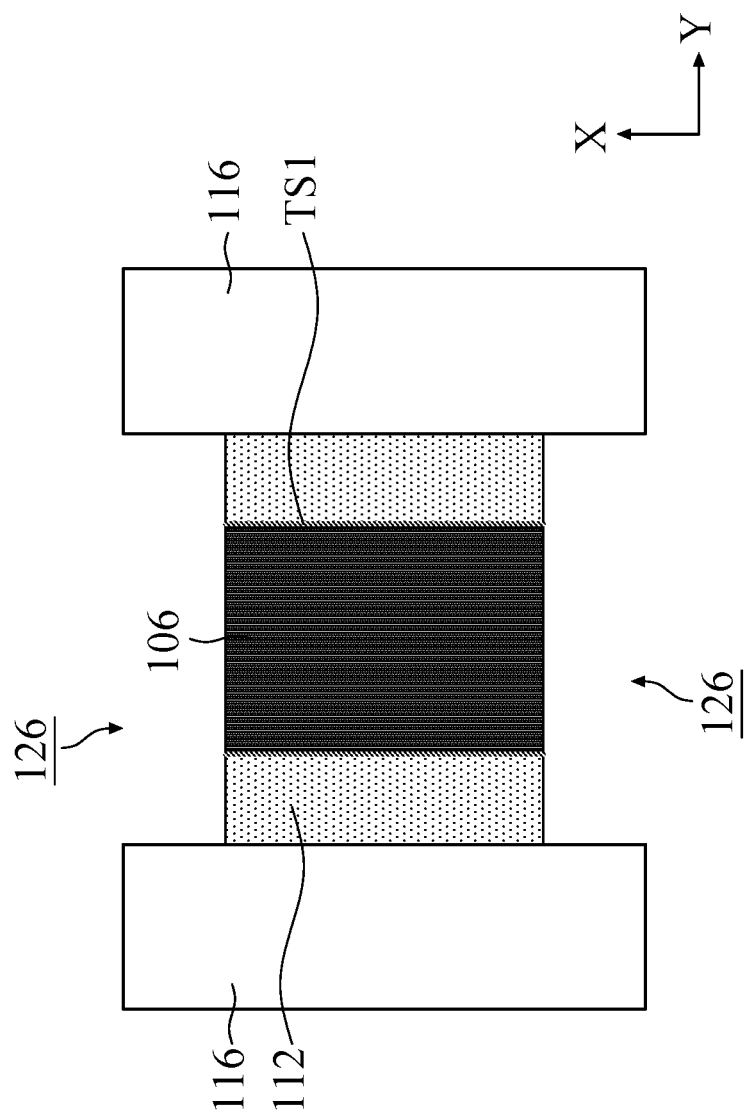

A planarization process is performed on the semiconductor structure 100 to remove portions of the dielectric material 114 and the semiconductor capping layer 112 above the top surface of the semiconductor fin structure 104 until the top surface of the semiconductor fin structure 104 is exposed, as shown in FIGS. 2F-1 and 2F-2, in accordance with some embodiments. In some embodiments, the planarization process is CMP, an etching back process, or a combination thereof.

The remainder of the dielectric material 114 serves as dielectric fin structures 116, shown in FIGS. 2F-2 and 2F-3, in accordance with some embodiments. In some embodiments, the dielectric fin structures 116 are spaced apart from the semiconductor fin structure 104 by the semiconductor capping layer 112. In some embodiments, the dielectric fin structures 116 extend in the X direction. The dielectric fin structures 116 have longitudinal axes parallel to the X direction and substantially parallel to the semiconductor fin structure 104, in accordance with some embodiments.

In some embodiments, the dielectric fin structures 116 may also be referred to as hybrid fin structures. In some embodiments, the dielectric fin structures 116 are configured to constrain the lateral growth of subsequently formed source/drain features and configured as a portion for cutting a gate stack.

FIGS. 2G-1 and 2G-2 illustrate a semiconductor structure 100 after the formation of a dummy gate structure 118 and gate spacer layers 124, in accordance with some embodiments.

Dummy gate structure 118 is formed over the semiconductor structure 100, as shown in FIGS. 2G-1 and 2G-2, in accordance with some embodiments. The dummy gate structure 118 extends over and covers the channel region of the semiconductor fin structure 104, the semiconductor capping layer 112, and the dielectric fin structures 116, in accordance with some embodiments. The dummy gate structure 118 is configured as a sacrificial structure and will be replaced with an active gate stack, in accordance with some embodiments.

In some embodiments, the dummy gate structure 118 extends in the Y direction. That is, the dummy gate structure 118 has a longitudinal axis parallel to the Y direction, in accordance with some embodiments. FIG. 2G-1 shows one dummy gate structure 118 for illustrative purpose and is not intended to be limiting. The number of the dummy gate structure 118 may be dependent on the semiconductor device design demand and/or performance consideration.

The dummy gate structure 118 includes a dummy gate dielectric layer 120 and a dummy gate electrode layer 122 formed over the dummy gate dielectric layer 120, as shown in FIGS. 2G-1 and 2G-2, in accordance with some embodiments. In some embodiments, the dummy gate dielectric layer 120 is made of one or more dielectric materials, such as silicon oxide (SiO), silicon nitride (SiN), silicon oxynitride (SiON), $HfO_2$, HfZrO, HfSiO, HfTiO, HfAlO, or a combination thereof. In some embodiments, the dielectric material is formed using ALD, CVD, thermal oxidation, physical vapor deposition (PVD), another suitable technique, or a combination thereof.

In some embodiments, the dummy gate electrode layer 122 is made of semiconductor material such as polysilicon and/or poly-silicon germanium. In some embodiments, the dummy gate electrode layer 122 is made of a conductive material such as metallic nitrides, metallic silicides, metals, or a combination thereof. In some embodiments, the material for the dummy gate electrode layer 122 is formed using CVD, another suitable technique, or a combination thereof.

In some embodiments, the formation of the dummy gate structure 118 includes globally and conformally depositing a dielectric material for the dummy gate dielectric layer 120 over the semiconductor structure 100, depositing a material for the dummy gate electrode layer 122 over the dielectric material, planarizing the material for the dummy gate electrode layer 122, and patterning the material for the dummy gate electrode layer 122 and the dielectric material into the dummy gate structure 118.

The patterning process includes forming a patterned hard mask layer (not shown) over the material for the dummy gate electrode layer 122, in accordance with some embodiments. The hard mask layer corresponds to and overlaps the channel region of the semiconductor fin structure 104, in accordance with some embodiments. In some embodiments, the patterned hard mask layer is made of one or more dielectric materials such as nitride (such as silicon nitride) and/or oxide (such as silicon oxide). The material for the dummy gate electrode layer 122, uncovered by the patterned hard mask layer, are etched away, in accordance with some embodiments. In some embodiments, the dielectric material, uncovered by the dummy gate electrode layer 122, may be partially removed. In alternative embodiments, the dielectric material, uncovered by the dummy gate electrode layer 122, may be entirely removed.

Gate spacer layers 124 are formed on the opposite sides of the dummy gate structure 118 and over the dummy gate dielectric layer 120, as shown in FIG. 2G-1, in accordance with some embodiments. The gate spacer layers 124 are used to offset the subsequently formed source/drain features and separate the source/drain features from the gate structure, in accordance with some embodiments.

In some embodiments, the gate spacer layers 124 are made of dielectric material, such as a silicon-containing dielectric material, such as silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). In some embodiments, the formation of the gate spacer layers 124 includes globally and conformally depositing a dielectric material for the gate spacer layers 124 over the semiconductor structure 100. The deposition processes may be ALD, CVD (such as LPCVD, PECVD, HDP-CVD, HARP, and FCVD), another suitable technique, or a combination thereof.

Afterward, an etching process is performed to remove portions of the dielectric material for the gate spacer layers 124 formed along the upper surfaces of the dummy gate electrode layer 122 and the semiconductor fin structure 104, in accordance with some embodiments. Portions of the dielectric material for the gate spacer layers 124 formed along the upper surface of the semiconductor capping layer 112 and the upper surfaces and the sidewalls of the dielectric fin structures 116 are also removed, in accordance with some embodiments. In addition, portions of the dummy gate dielectric layer 120 uncovered by the gate spacer layers 124 may be removed in the etching process.

The etching process may be an anisotropic etching process such as dry plasma etching. In some embodiments, the etching processes are performed without an additional photolithography process. Remaining portions of the dielectric material on the sidewalls of the gate electrode layer 122 serve as the gate spacer layers 124, in accordance with some embodiments.

FIGS. 2H-1, 2H-2 and 2H-3 illustrate a semiconductor structure 100 after the formation of source/drain recesses 126, in accordance with some embodiments.

An etching process is performed to recess the source/drain regions of the semiconductor fin structure 104 and the semiconductor capping layer 112, thereby forming source/drain recesses 126, as shown in FIGS. 2H-1, 2H-2 and 2H-3, in accordance with some embodiments. The source/drain recesses 126 extends into the lower fin elements 104L, in accordance with some embodiments. In some embodiments, the source/drain recesses 126 expose of the dielectric fin structures 116 and the isolation structure 110, in accordance with some embodiments.

The etching process may be an anisotropic etching process such as dry plasma etching. The gate spacer layers 124 and the dummy gate structure 118 may serve as etch masks such that the source/drain recesses 126 are formed self-aligned opposite sides of the dummy gate structure 118, in accordance with some embodiments. In some embodiments, the etching process is performed without the need for an additional photolithography process.

FIGS. 2I-1, 2I-2 and 2I-3 illustrate a semiconductor structure 100 after the formation of notches 128 and 129, in accordance with some embodiments.

Figures 2, 2I, 3:
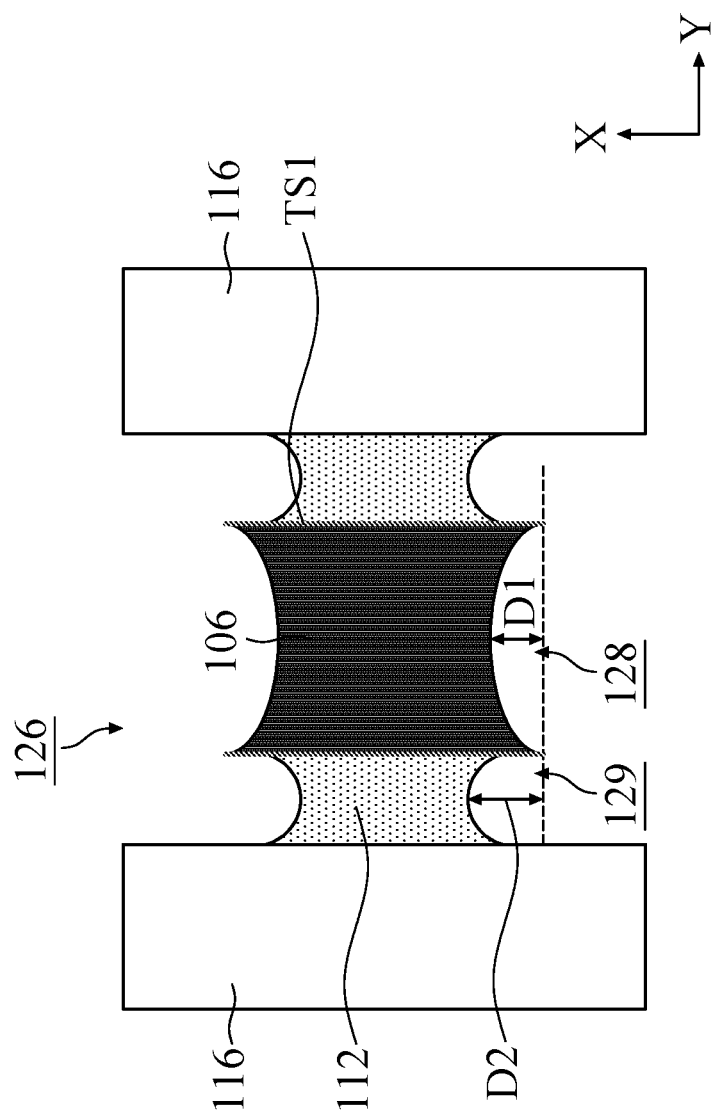
Figures 2, 2J, 3:
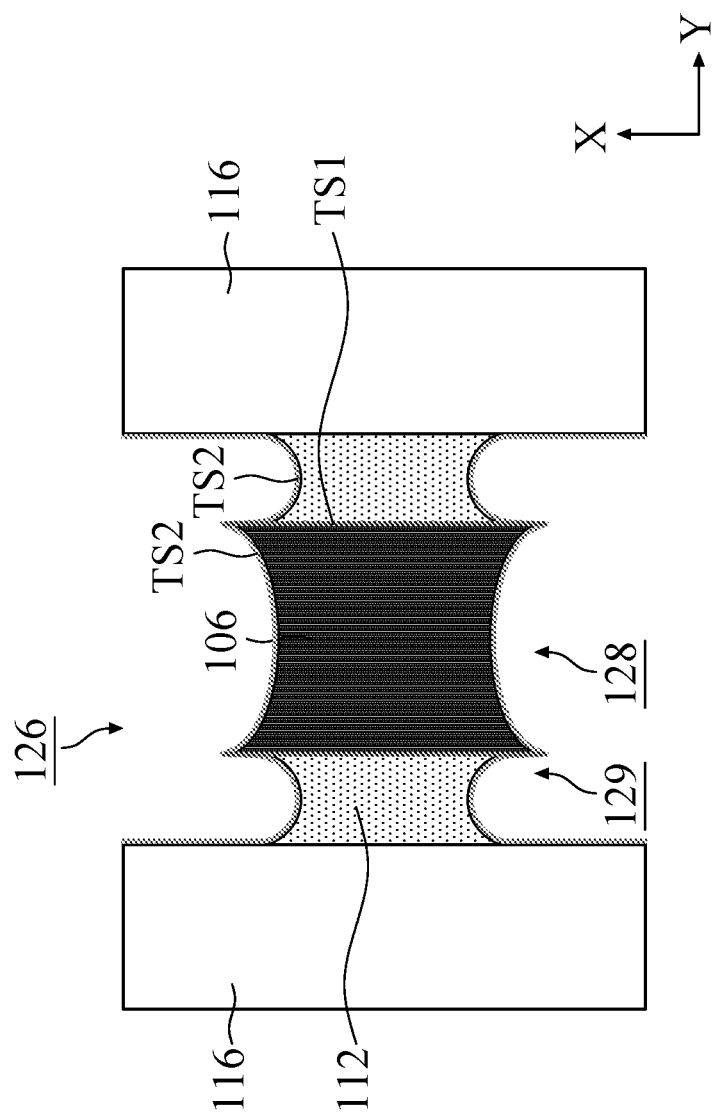
Figures 2, 2K, 3:
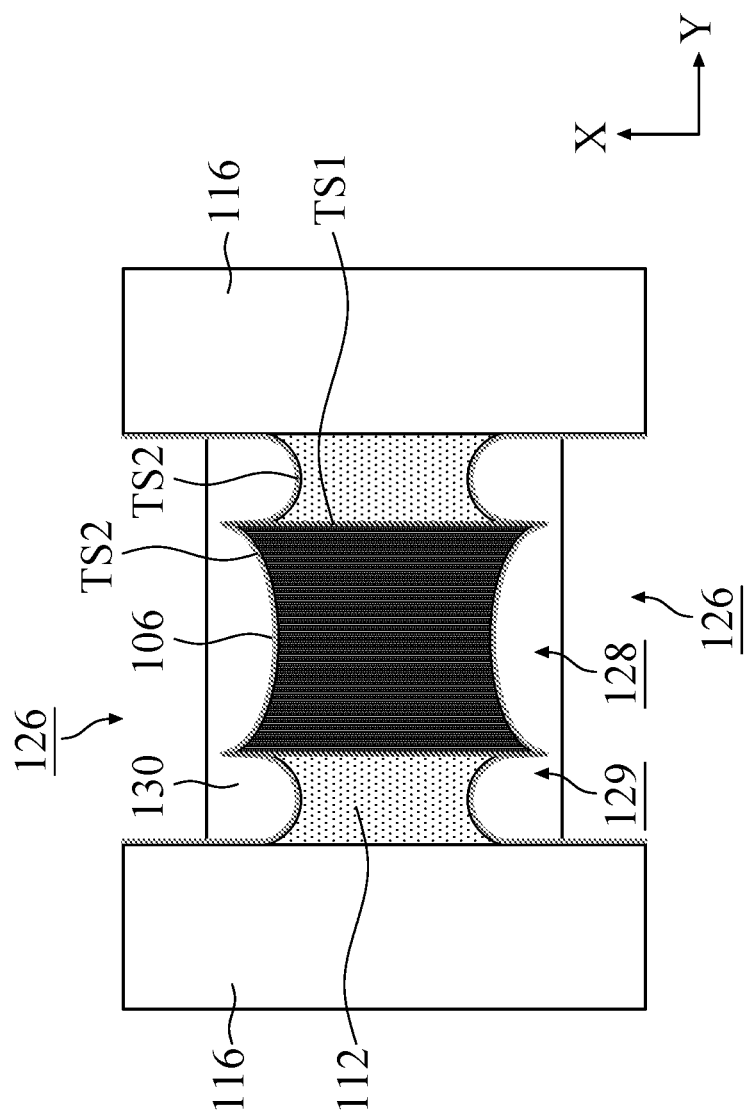

An etching process is performed to laterally recess, from the source/drain recesses 126 toward the channel region, the first semiconductor layers 106 of the semiconductor fin structure 104 to form notches 128, as shown in FIGS. 2I-1 and 2I-3, in accordance with some embodiments. The etching process also laterally recesses the semiconductor capping layer 112 to form notches 129, as shown in FIG. 2I-3, in accordance with some embodiments. In some embodiments, the etching process is an isotropic etching such as dry chemical etching, remote plasma etching, wet chemical etching, another suitable technique, or a combination thereof.

The notches 128 are formed between adjacent second semiconductor layers 108 and between the lowermost second semiconductor layer 108 and the lower fin element 104L, in accordance with some embodiments. The notches 129 are formed between the dielectric fin structures 116 and the semiconductor fin structure 104, in accordance with some embodiments. In some embodiments, the notches 128 and the notches 129 are located directly below the gate spacer layers 124.

In some embodiments, the notches 128 and 129 has curved surfaces, e.g., concave toward the channel region. Due to the difference in the germanium percentage between the first semiconductor layers 106 and the semiconductor capping layer 112, the recessing depths of the notches 128 and 129 may be different. In some embodiments, the maximum recessing depths D1 of the notches 128 is less than the maximum recessing depths D2 of the notches 129, as shown in FIG. 2I-3.

FIGS. 2J-1, 2J-2 and 2J-3 illustrate a semiconductor structure 100 after a second passivation process, in accordance with some embodiments.

After the etching processes for forming the source/drain recess 126 and the notches 128 and 129, residues, polymers and/or etching byproducts due to the etching processes leave on the exposed surfaces of the semiconductor structure 100, in accordance with some embodiments. A clean process is performed on the semiconductor structure 100 to remove the residues, polymers and/or byproducts, in accordance with some embodiments. In some embodiments, the clean process includes immersing the semiconductor structure 100 in SPM solution, SC-1 (RCA Standard Clean-1) solution, and/or SC-2 (RCA Standard Clean-2) solution. The clean process may be performed at a temperature from room temperature (about 25° C.) to about 50° C.

In addition, after the etching processes for forming the source/drain recess 126 and the notches 128 and 129, dangling bonds may exist on the exposed etching surfaces (i.e., the sidewalls) of the first semiconductor layers 106 of the semiconductor fin structure 104 and the semiconductor capping layer 112. A second passivation process is performed on the semiconductor structure 100 to passivate the dangling bonds of the first semiconductor layers 106 and the semiconductor capping layer 112 on the exposed surfaces, in accordance with some embodiments.

The second passivation process includes treating the exposed surfaces of the semiconductor structure 100 using radicals that tend to bond to the dangling bonds of the first semiconductor layers 106 and the semiconductor capping layer 112, in accordance with some embodiments. The treated surfaces of the semiconductor structure 100 is denoted as TS2, as shown in FIGS. 2J-1, 2J-2 and 2J-3, in accordance with some embodiments. In some embodiments, the radicals are nitrogen radical, hydrogen radical, deuterium radical and/or sulfur radical.

For example, the semiconductor structure 100 is placed in a processing chamber which may be equipped with RPS. Processing gases (e.g., nitrogen gas, ammonia gas, hydrogen gas, deuterium gas and/or sulfur hexafluoride gas) pass through the RPS and are formed into radicals, and the radicals then flow into the processing chamber. The semiconductor structure 100 is soaked with the radicals, and the radicals are absorbed onto the exposed surface of the semiconductor structure 100, in accordance with some embodiments. The dangling bonds of the first semiconductor layers 106 and the semiconductor capping layer 112 are boned with the radicals, thereby passivating the reactivity of the dangling bonds, in accordance with some embodiments. In some embodiments, the second passivation process is performed at a temperature in a range from about 200° C. to about 700° C.

In some embodiments, the radicals may diffuse into a surface portion (e.g., within 1 Å from the treated surfaces TS2) of the components (such as the first semiconductor layers 106, the second semiconductor layers 108, the isolation structure 110, the semiconductor capping layer 112, the dielectric fin structures 116, and/or the gate spacer layers 124) of the semiconductor structure 100.

The second passivation process decreases the reactivity of the dangling bonds and thus may mitigate or prevent oxide formation, in accordance with some embodiments. Therefore, Dit may be reduced, which may in turn improve the performance of the resulting semiconductor device.

In some embodiments, the treated surface portions of the first semiconductor layers 106 and the semiconductor capping layer 112 may serve as the passivation layers which cover the exposed surface of the first semiconductor layers 106 and the semiconductor capping layer 112. In some embodiments, after the second passivation process, the atoms (e.g., nitrogen, hydrogen, deuterium and/or sulfur) for forming radicals may have a higher concentration at the treated surfaces TS2 than the concentration of the inner bulk portion of the semiconductor structure 100, or may have the highest concentration at the treated surfaces TS2. In an embodiment in which the nitrogen radicals are used, nitrogen in the first semiconductor layers 106 has a maximum concentration at the treated surface portion, and nitrogen in the semiconductor capping layer 112 has a maximum nitrogen concentration at the treated surface portion.

FIGS. 2K-1, 2K-2 and 2K-3 illustrate a semiconductor structure 100 after the formation of a dielectric material 130, in accordance with some embodiments.

A dielectric material 130 is globally deposited over the semiconductor structure 100, and an etching back process is performed to pull back the dielectric material 130, as shown in FIGS. 2K-1 and 2K-3, in accordance with some embodiments.

In some embodiments, the dielectric material 130 is silicon oxide ($SiO_2$), silicon nitride (SiN), silicon carbide (SiC), silicon oxynitride (SiON), silicon carbon nitride (SiCN), silicon oxycarbonitride (SiOCN), and/or oxygen-doped silicon carbonitride (Si(O)CN). The dielectric material 130 is deposited to overfills the notches 128 and 129, in accordance with some embodiments. In some embodiments, the deposition process includes ALD, CVD (such as PECVD, LPCVD or HARP), another suitable technique, or a combination thereof.

The etching back process removes portions of the dielectric material 130 formed along the lower fin element 104, the dielectric fin structures 116 and the isolation structure 110, in accordance with some embodiments. In some embodiments, the etching back process includes an anisotropic etching process such as dry plasma etching, an isotropic etching process such as dry chemical etching, remote plasma etching or wet chemical etching, or a combination thereof. Remaining portions of the dielectric material 130 leaves on the opposite sides of the dummy gate structure 118 and in the notches 128 and 129, as shown in FIGS. 2K-1 and 2K-3, in accordance with some embodiments.

FIGS. 2L-1, 2L-2 and 2L-3 illustrate a semiconductor structure 100 after the formation of notches 134, in accordance with some embodiments.

Figures 2, 2L, 3:
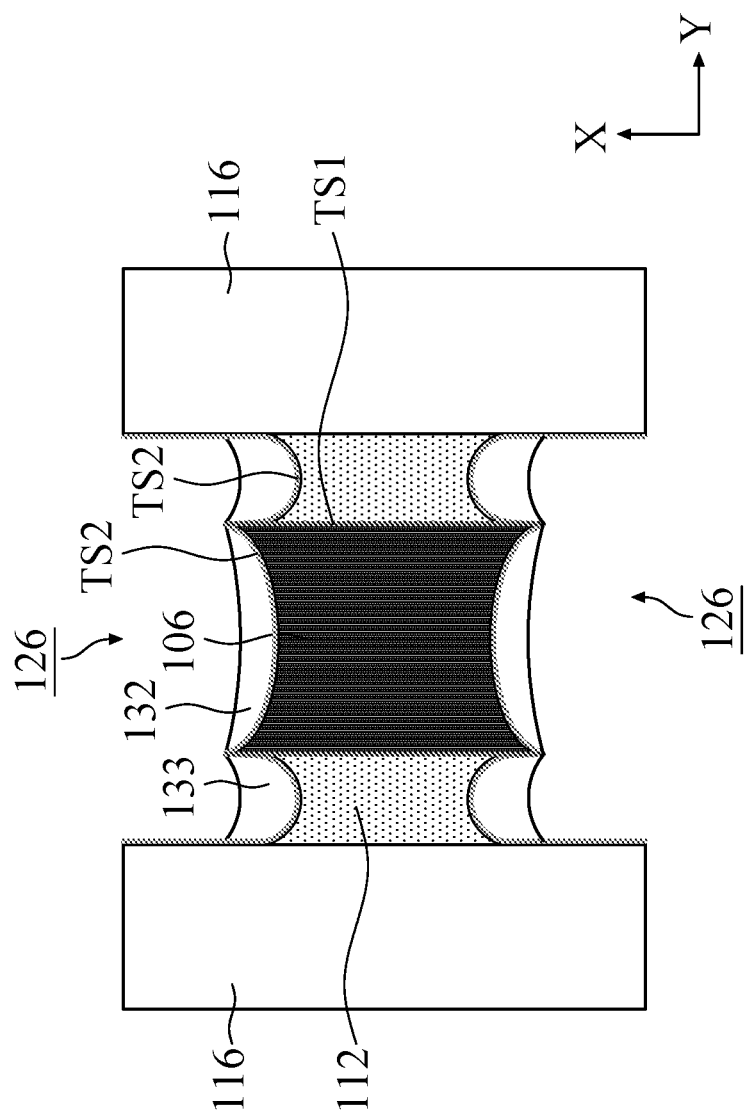

An etching process is performed to laterally recess, from the source/drain recesses 126 toward the channel region, the second semiconductor layers 108 of the semiconductor fin structure 104 to form notches 134, as shown in FIG. 2L-1, in accordance with some embodiments. The lateral recessing of the second semiconductor layers 108 may reduce junction overlap, in accordance with some embodiments. In some embodiments, the etching process is an isotropic etching such as dry chemical etching, remote plasma etching, wet chemical etching, another suitable technique, or a combination thereof.

In some embodiments, the notches 134 are located directly below the gate spacer layers 124. In some embodiments, the notches 134 has curved surfaces, e.g., concave toward the channel region. In some embodiments, the maximum recessing depths D3 (FIG. 2L-1) of the notches 134 is less than the maximum recessing depths D1 (FIG. 2I-1) of the notches 129.

In addition, the etching process also removes portions of the dielectric material 130 outside the notches 128 and 129, in accordance with some embodiments. Remaining portions of the dielectric material 130 in the notches 128 serve as inner spacer layers 132, as shown in FIGS. 2L-1 and 2L-3, in accordance with some embodiments. Remaining portions of the dielectric material 130 in the notches 129 serve as inner spacer layers 133, as shown in FIG. 2L-3, in accordance with some embodiments.

In some embodiments, the inner spacer layers 132 and 133 are formed directly below the gate spacer layers 124, in accordance with some embodiments. The inner spacer layers 132 and 133 interpose subsequently formed source/drain features and gate stack to avoid the source/drain features and the gate stack from being in direct contact and are configured to reduce the parasitic capacitance between the gate stack and the source/drain features (i.e., Cgs and Cgd), in accordance with some embodiments.

FIGS. 2M-1, 2M-2 and 2M-3 illustrate a semiconductor structure 100 after the formation of undoped epitaxial layers 135 and source/drain features 136, in accordance with some embodiments.

Figures 2, 2M, 3:
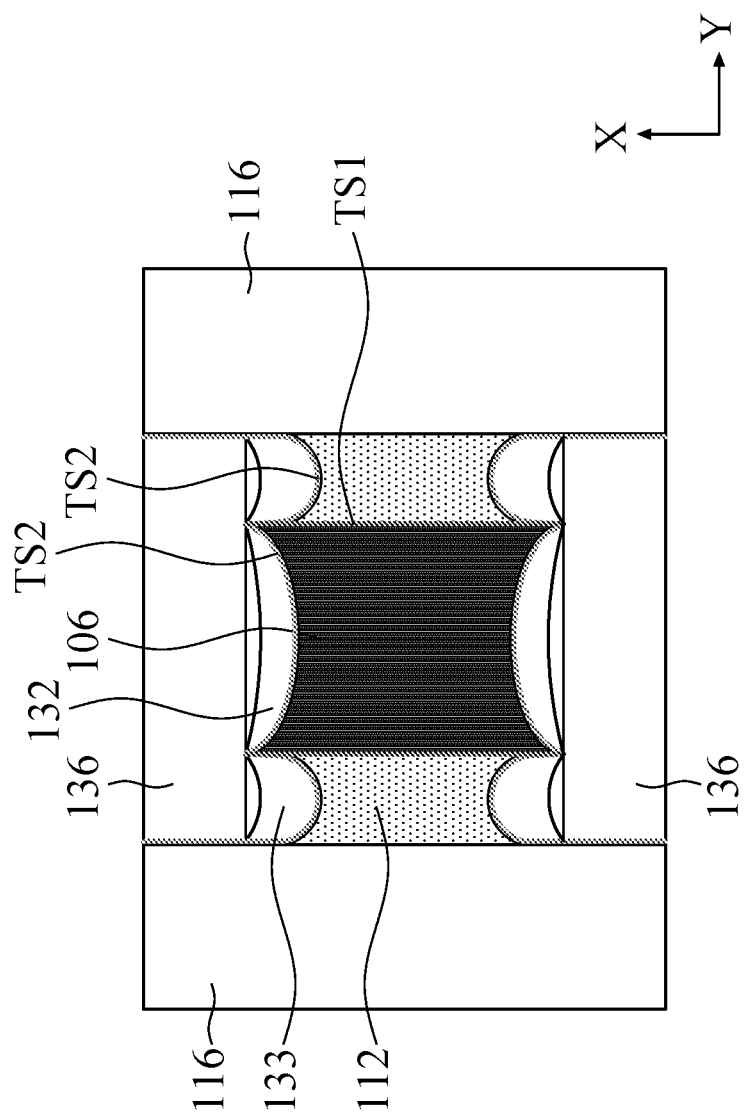

Undoped epitaxial layers 135 are formed the lower fin elements 104L in the source/drain recesses 126 using an epitaxial growth process, as shown in FIGS. 2M-1 and 2M-2, in accordance with some embodiments. The epitaxial growth process may be MBE, MOCVD, or VPE, another suitable technique, or a combination thereof. In some embodiments, the undoped epitaxial layers 135 may be intrinsic semiconductor material such as silicon, silicon germanium and/or another suitable semiconductor material. For example, an impurity (or an n-type dopant and/or a p-type dopant) in the undoped epitaxial layers 135 has a concentration of less than about $10^{14}$ cm$^{-3}$. In some embodiments, the undoped epitaxial layers 135 is configured as an insulating layer to reduce leakage between adjacent devices from through the substrate 102.

Source/drain features 136 are formed over the undoped epitaxial layers 135 in the source/drain recesses 126 using an epitaxial growth process, as shown in FIGS. 2M-1, 2M-2 and 2M-3, in accordance with some embodiments. The source/drain features 136 fills the notches 134, as shown in FIGS. 2M-1, in accordance with some embodiments. The epitaxial growth process may be MBE, MOCVD, or VPE, another suitable technique, or a combination thereof. The source/drain features 136 are formed on opposite sides of the dummy gate structure 118, in accordance with some embodiments.

In some embodiments, the source/drain features 136 grown in the X direction to adjoin the second semiconductor layers 108 of the semiconductor fin structure 104 and the inner spacer layers 132 and 133, as shown in FIGS. 2M-1 and 2M-3. The source/drain features 136 has portions which extends directly below the gate spacer layers 124 and are in contact with the semiconductor fin structure 104, which may reduce the junction overlap. As a result, the performance of the resulting semiconductor device may be enhanced, e.g., drain current (Id), saturation current (Isat), etc.

In some embodiments, the source/drain features 136 grown in the Y direction to adjoin the dielectric fin structures 116, as shown in FIGS. 2M-2 and 2M-3. The dielectric fin structures 116 confine the lateral growth (in the Y direction) of the source/drain features 136, and thus the source/drain features 136 have a lower dimension in the Y direction, in accordance with some embodiments. As a result, the parasitic capacitance between the source/drain feature 136 and a subsequently formed gate stack may be reduced, and thus the performance of the resulting semiconductor device may be enhanced, e.g., operation speed.

In some embodiments, the source/drain features 136 are made of any suitable semiconductor material for n-type semiconductor devices or p-type semiconductor devices. In some embodiments, the source/drain features 136 are doped. The concentration of the dopant in the source/drain features 136 in a range from about $1 \times 10^{19}$ cm$^{-3}$ to about $6 \times 10^{2}$ cm$^{-3}$. An annealing process may be performed on the semiconductor structure 100 to active the dopants in the source/drain features 136, in accordance with some embodiments.

In some embodiments wherein the semiconductor fin structure 104 are to be formed as an N-type nanostructure device (such as n-channel GAA FET), the source/drain features 136 are made of semiconductor material such as SiP, SiAs, SiCP, SiC, Si, GaAs, another suitable semiconductor material, or a combination thereof. In some embodiments, the source/drain features 136 are doped with the n-type dopant during the epitaxial growth process. For example, the n-type dopant may be phosphorous (P) or arsenic (As). For example, the source/drain features 136 may be the epitaxially grown Si doped with phosphorous to form silicon:phosphor (Si:P) source/drain features and/or arsenic to form silicon:arsenic (Si:As) source/drain feature.

In some embodiments wherein the semiconductor fin structure 104 are to be formed as a P-type nanostructure device (such as p-channel GAA FET), the source/drain features 136 are made of semiconductor material such as SiGe, Si, GaAs, another suitable semiconductor material, or a combination thereof. In some embodiments, the source/drain features 136 are doped with the p-type dopant during the epitaxial growth process. For example, the p-type dopant may be boron (B) or $BF_2$. For example, the source/drain features 136 may be the epitaxially grown SiGe doped with boron (B) to form silicon germanium:boron (SiGe:B) source/drain feature.

FIGS. 2N-1 and 2N-2 illustrate a semiconductor structure 100 after the formation of a contact etching stop layer (CESL) 138 and an interlayer dielectric (ILD) layer 140, in accordance with some embodiments.

A contact etching stop layer 138 is formed over the semiconductor structure 100, as shown in FIGS. 2N-1 and 2N-2, in accordance with some embodiments. In some embodiments, the contact etching stop layer 138 is made of dielectric material, such as silicon nitride (SiN), silicon oxide ($SiO_2$), silicon oxynitride (SiOC), silicon carbide (SiC), oxygen-doped silicon carbide (SiC:O), oxygen-doped silicon carbonitride (Si(O)CN), or a combination thereof. In some embodiments, a dielectric material for the contact etching stop layer 138 is globally and conformally deposited over the semiconductor structure 100 using CVD (such as LPCVD, PECVD, HDP-CVD, or HARP), ALD, another suitable method, or a combination thereof.

An interlayer dielectric layer 140 is formed over the contact etching stop layer 138, as shown in FIGS. 2N-1 and 2N-2, in accordance with some embodiments. In some embodiments, the interlayer dielectric layer 140 is made of dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 140 and the contact etching stop layer 138 are made of different materials and have a great difference in etching selectivity. In some embodiments, the dielectric material for the interlayer dielectric layer 140 is deposited using such as CVD (such as HDP-CVD, PECVD, HARP or FCVD), another suitable technique, or a combination thereof.

The dielectric materials for the contact etching stop layer 138 and the interlayer dielectric layer 140 formed above the upper surface of the dummy gate electrode layer 122 are removed using such as CMP until the dummy gate electrode layer 122 is exposed, in accordance with some embodiments. In some embodiments, the upper surfaces of the interlayer dielectric layer 140, the dummy gate electrode layer 122 and the gate spacer layers 124 are substantially coplanar.

FIGS. 2O-1, 2O-2 and 2O-3 illustrate a semiconductor structure 100 after the formation of a gate trench 142 and gaps 143 and 144, in accordance with some embodiments.

Figures 1, 2, 2O:
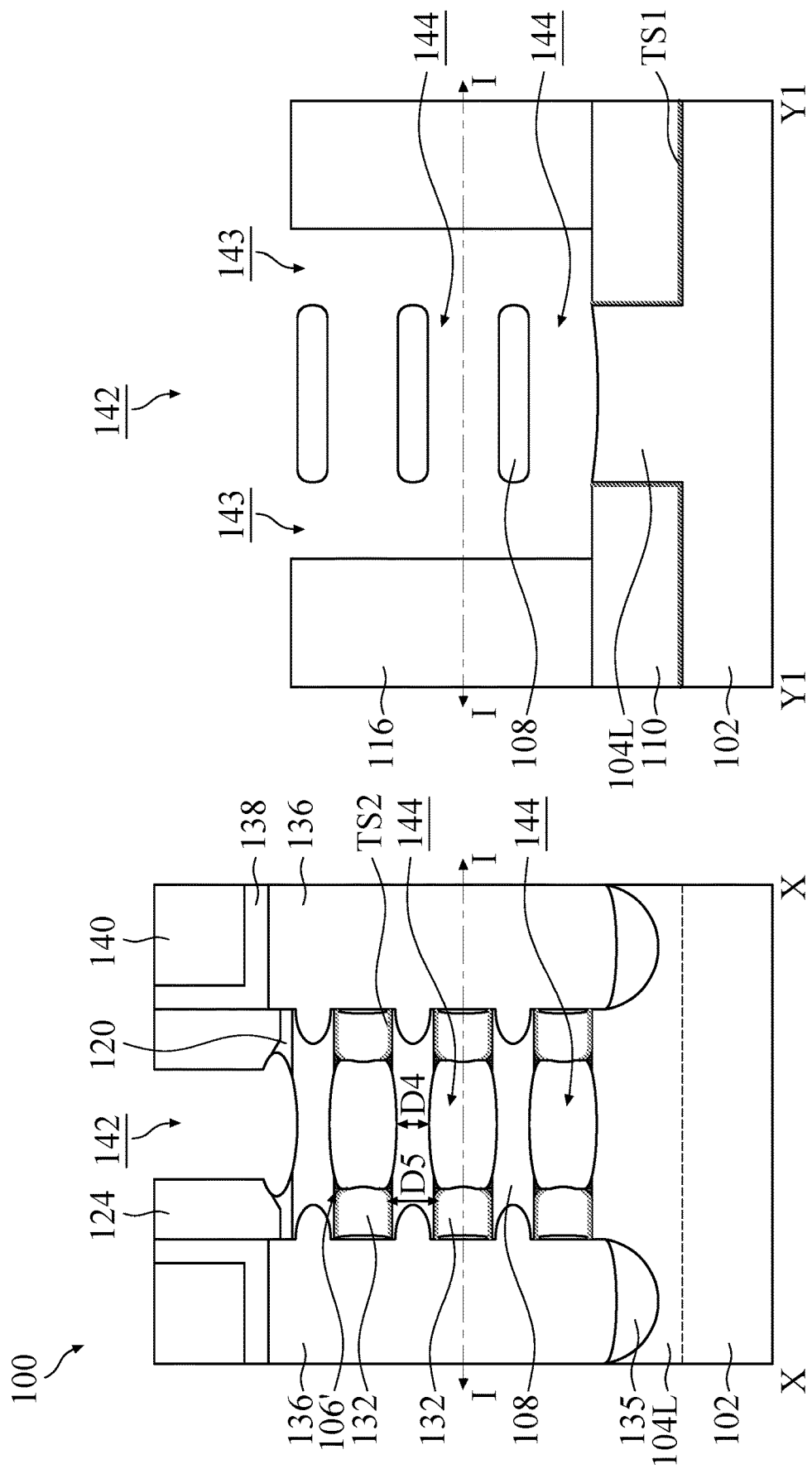

The dummy gate structure 118 is removed using one or more etching processes to form a gate trench 142 between the gate spacer layers 124, as shown in FIGS. 2O-1 and 2O-2, in accordance with some embodiments. In some embodiments, the gate trench 142 exposes the channel region of the semiconductor fin structure 104, the semiconductor capping layer 112 and the dielectric fin structures 116. In some embodiments, the gate trench 142 also exposes the inner sidewalls of the gate spacer layers 124 facing the channel region.

In some embodiments, the etching process includes one or more etching processes. For example, when the dummy gate electrode layer 122 is made of polysilicon, a wet etchant such as a tetramethylammonium hydroxide (TMAH) solution may be used to selectively remove the dummy gate electrode layer 122. For example, the dummy gate dielectric layer 120 may be thereafter removed using a plasma dry etching, a dry chemical etching, and/or a wet etching. In some embodiments, the portions of the dummy gate dielectric layer 120 remain below the gate spacer layers 124 after the one or more etching processes.

Afterward, an etching process is performed to remove the semiconductor capping layer 112 to form gaps 143 and remove the first semiconductor layers 106 of the semiconductor fin structure 104 to form gaps 144, as shown in FIGS. 2O-1, 2O-2 and 2O-3, in accordance with some embodiments. The inner spacer layers 132 and 133 may be used as an etching stop layer in the etching process, which may protect the source/drain features 136 from being damaged.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

The gaps 144 are formed between adjacent second semiconductor layers 108 and between the lowermost second semiconductor layer 108 and the lower fin element 104L, in accordance with some embodiments. The gaps 143 are formed between the dielectric fin structures 116 and the second semiconductor layers 108 of the semiconductor fin structure 104, in accordance with some embodiments. In some embodiments, the gaps 143 and 144 also expose the inner sidewalls of the inner spacer layers 133 and 132 facing the channel region. In some embodiments, the gaps 144 and the gaps 143 are connected to each other.

After the etching process, the four main surfaces (a top surface, a bottom surface and two side surfaces) of the second semiconductor layers 108 are exposed, as shown in FIG. 2O-2, in accordance with some embodiments. The exposed second semiconductor layers 108 serve as nanostructures that function as channel layers of the resulting semiconductor device (e.g., nanostructure transistors such as GAA FET), in accordance with some embodiments.

Furthermore, in the etching process, the nanostructures 108 are also trimmed to thin down the center portions of the nanostructures 108 exposed from the gaps 144, as shown in FIG. 2O-1, in accordance with some embodiments. In some embodiments, the thickness D4 of the center portions of the nanostructures 108 exposed from the gaps 144 is thinner than the thickness D5 of the end portions of the nanostructures 108 directly below the gate spacer layers 124. Because an intermixing of the first semiconductor layers 106 and the second semiconductor layers 108 may occur at the interfaces therebetween when the semiconductor structure 100 is subjected to several thermal processes, the trimming of the nanostructures may remove the intermixing part in the nanostructures. In addition, the center portions of the nanostructures 108 which are thinner than their end portions may suppress the current crowding effect, thereby improving the performance of the resulting semiconductor device (e.g., saturation current).

In some embodiments, the etching process may not completely remove the semiconductor material of the first semiconductor layers 106 due to etch process limitations and/or concerns about etch damage to adjacent components. If the first semiconductor layers 106 were to be completely removed, some adjacent components (such as the inner spacer layers, nanostructures, dielectric fin structure, etc.) may be damaged in the etching process.

FIG. 2O-4 illustrates an enlarged view of FIG. 2O-1 to illustrate a remaining portion 106' of a first semiconductor layer 106 and neighboring components, in accordance with some embodiments of the disclosure. In some embodiments, after the etching process for removing the first semiconductor layers 106 and the semiconductor capping layer 112, the remaining portions 106' of the first semiconductor layers 106 may leave at the corner between the nanostructures 108 and the inner spacer layers 132. The remaining portions 106' of the first semiconductor layers 106 are hereinafter referred to as semiconductor features 106'.

FIGS. 2P-1, 2P-2 and 2P-3 illustrate a semiconductor structure 100 after a third passivation process, in accordance with some embodiments.

After the etching process for removing the first semiconductor layers 106 and the semiconductor capping layer 112, residues, polymers and/or etching byproducts due to the etching process leave on the exposed surfaces of the semiconductor structure 100, in accordance with some embodiments. A clean process is performed on the semiconductor structure 100 to remove the residues, polymers and/or byproducts, in accordance with some embodiments. In some embodiments, the clean process includes immersing the semiconductor structure 100 in SPM (sulfuric acid and hydrogen peroxide mixture) solution, SC-1 (RCA Standard Clean-1) solution, and/or SC-2 (RCA Standard Clean-2) solution. The clean process may be performed at a temperature from room temperature (about 25° C.) to about 50° C.

In addition, after the etching process for removing the first semiconductor layers 106 and the semiconductor capping layer 112, dangling bonds may exist on the exposed etching surfaces of the semiconductor features 106'. A third passivation process is performed on the semiconductor structure 100 to passivate the dangling bonds of the semiconductor features 106' on the exposed surfaces, in accordance with some embodiments.

The third passivation process includes treating the exposed surfaces of the semiconductor structure 100 using radicals that tend to bond to the dangling bonds of the first semiconductor layers 106, in accordance with some embodiments. The treated surfaces of the semiconductor structure 100 is denoted as TS3, as shown in FIGS. 2P-1, 2P-2 and 2P-3, in accordance with some embodiments. In some embodiments, the radicals are nitrogen radical, hydrogen radical, deuterium radical and/or sulfur radical.

For example, the semiconductor structure 100 is placed in a processing chamber which may be equipped with RPS. Processing gases (e.g., nitrogen gas, ammonia gas, hydrogen gas, deuterium gas and/or sulfur hexafluoride gas) pass through the RPS and are formed into radicals, and the radicals then flow into the processing chamber. The semiconductor structure 100 is soaked with the radicals, and the radicals are absorbed onto the exposed surface of the semiconductor structure 100, in accordance with some embodiments. The dangling bonds of the semiconductor features 106' are boned with the radicals, thereby passivating the reactivity of the dangling bonds, in accordance with some embodiments. In some embodiments, the third passivation process is performed at a temperature in a range from about 200° C. to about 700° C.

In some embodiments, the radicals may diffuse into a surface portion (e.g., within 1 Å from the treated surfaces TS3) of the components (such as the semiconductor features 106', the nanostructures 108, the isolation structure 110, the dielectric fin structures 116, the dummy gate dielectric layer 120, the gate spacer layers 124, and/or the inner spacer layers 132 and 133) of the semiconductor structure 100.

The third passivation process decreases the reactivity of the dangling bonds and thus may mitigate or prevent oxide formation, in accordance with some embodiments. There-fore, Dit may be reduced, which may in turn improve the performance of the resulting semiconductor device.

FIG. 2P-4 illustrates an enlarged view of FIGS. 2P-1 to illustrate the semiconductor features 106' and neighboring components, in accordance with some embodiments of the disclosure. In some embodiments, the treated surface portions of the semiconductor features 106' may serve as the passivation layers which cover the exposed surface of the semiconductor features 106'. In some embodiments, after the third passivation process, the atoms (e.g., nitrogen, hydrogen, deuterium and/or sulfur) for forming radicals may have a higher concentration at the treated surfaces TS3 than the concentration of the inner bulk portion of the semiconductor structure 100, or may have the highest concentration at the treated surfaces TS3. In an embodiment in which the nitrogen radicals are used, nitrogen in the semiconductor features 106' has a maximum concentration at the treated surface portion.

FIGS. 2Q-1, 2Q-2 and 2Q-3 illustrate a semiconductor structure 100 after the formation of an interfacial layer 146, in accordance with some embodiments.

An oxidation process is performed on the semiconductor structure 100 such that semiconductor material from the nanostructures 108 and the lower fin elements 104L is oxidized to form an interfacial layer 146 on the exposed surfaces of the nanostructures 108 and the lower fin elements 104L, as shown in FIGS. 2Q-1 and 2Q-2, in accordance with some embodiments. The interfacial layer 146 wraps around the nanostructures 108, in accordance with some embodiment. In some embodiment, the oxidation process uses ozone ($O_3$), ammonia hydroxide-hydrogen peroxide-water mixture, and/or hydrochloric acid-hydrogen peroxide-water mixture.

The semiconductor structure 100 is passivated to have treated surface TS3 which may suppress the diffusion of the germanium from the semiconductor features 106' through the interfacial layer 146 into the nanostructures 108, in accordance with some embodiments.

FIGS. 2R-1, 2R-2 and 2R-3 illustrate a semiconductor structure 100 after the formation of a gate dielectric layer 148 and a gate electrode layer 150, in accordance with some embodiments. FIG. 2R-4 illustrates an enlarged view of FIGS. 2R-1 to illustrate the semiconductor features 106' and neighboring components, in accordance with some embodiments of the disclosure.

A gate dielectric layer 148 is formed conformally along the semiconductor structure 100 and partially fills the gate trench 142 and the gaps 143 and 144, as shown in FIGS. 2R-1, 2R-1 and 2R-3, in accordance with some embodiments. The gate dielectric layer 148 is formed on the interfacial layer 146 and wraps around the nanostructures 108, in accordance with some embodiments. The gate dielectric layer 148 is also formed along the upper surfaces and the sidewalls of the dielectric fin structures 116 and the upper surface of the isolation structure 110, in accordance with some embodiments. The gate dielectric layer 148 is also formed along the inner sidewalls of the gate spacer layers 124 facing the channel region and the inner sidewalls of the inner spacer layers 132 facing the channel region, in accordance with some embodiments.

The gate dielectric layer 148 may be a high-k dielectric layer. In some embodiments, the high-k dielectric layer is made of a dielectric material with a high dielectric constant (k value); higher than 3.9, for example. In some embodiments, the high-k dielectric layer includes hafnium oxide ($HfO_2$), $TiO_2$, $HfZrO$, $Ta_2O_3$, $HfSiO_4$, $ZrO_2$, $ZrSiO_2$, $LaO$, $AlO$, $ZrO$, $TiO$, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), a combination thereof, or another suitable material. The high-k dielectric layer may be deposited using ALD, PVD, CVD, and/or another suitable technique.

Figures 2, 2R, 3, 4:
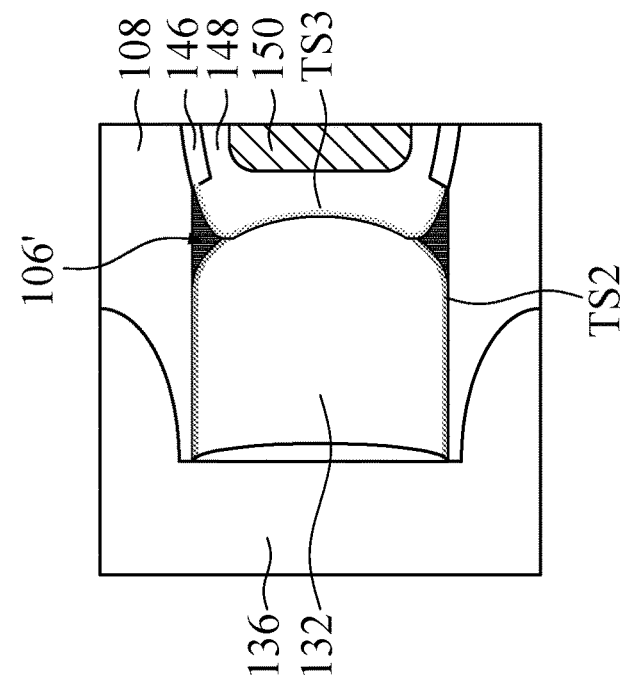
Figures 2, 2R, 3:
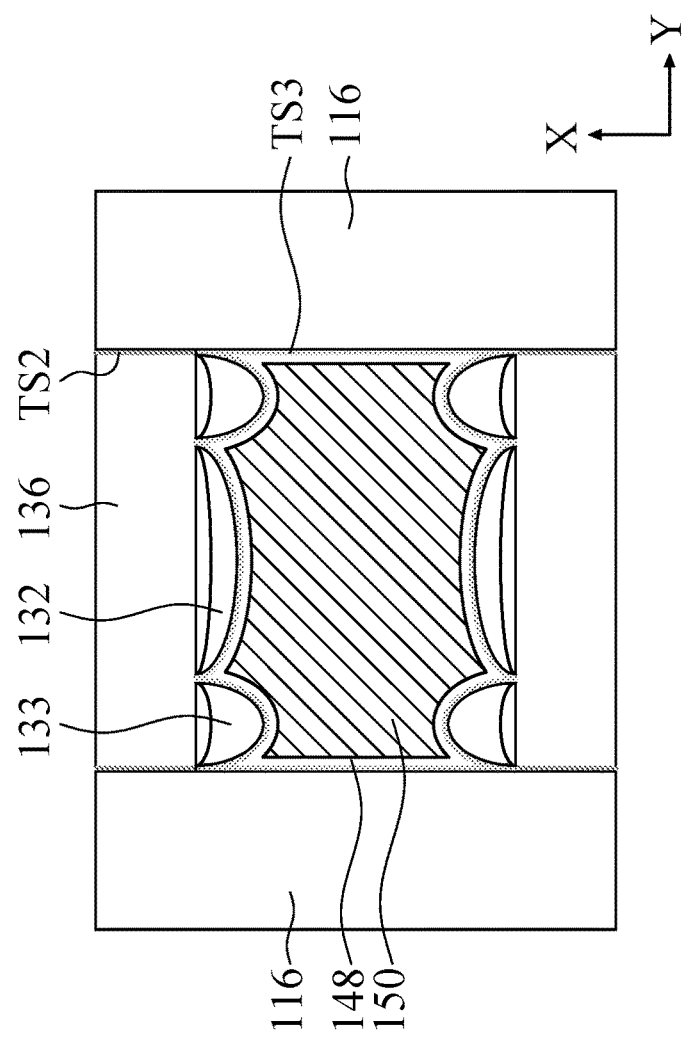

A metal gate electrode layer 150 is formed over the gate dielectric layer 148 and overfills remainders of the gate trench 142 and the gaps 143 and 144, as shown in FIGS. 2R-1 and 2R-2, in accordance with some embodiments. The metal gate electrode layer 150 wraps around the nanostructures 108, in accordance with some embodiments. In some embodiments, the metal gate electrode layer 150 is made of more than one conductive material, such as a metal, metal alloy, conductive metal oxide and/or metal nitride, another suitable conductive material, or a combination thereof. For example, the metal gate electrode layer 150 may be made of Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

The metal gate electrode layer 150 may be a multi-layer structure with various combinations of a diffusion barrier layer, work function layers with a selected work function to enhance the device performance (e.g., threshold voltage) for n-channel FETs or p-channel FETs, a capping layer to prevent oxidation of work function layers, a glue layer to adhere work function layers to a next layer, and a metal fill layer to reduce the total resistance of gate stacks, and/or another suitable layer. The metal gate electrode layer 150 may be formed using ALD, PVD, CVD, e-beam evaporation, or another suitable process. The metal gate electrode layer 150 may be formed separately for n-channel nanostructure transistors and p-channel nanostructure transistors, which may use different work function materials.

A planarization process such as CMP may be performed on the semiconductor structure 100 to remove the materials of the gate dielectric layer 148 and the metal gate electrode layer 150 formed above the upper surface of the interlayer dielectric layer 140, in accordance with some embodiments. After the planarization process, the upper surfaces of the metal gate electrode layer 150, the gate spacer layers 124 and the interlayer dielectric layer 140 are substantially coplanar, in accordance with some embodiments.

The interfacial layer 146, the gate dielectric layer 148 and the metal gate electrode layer 150 combine to form a final gate stack 152, in accordance with some embodiments. In some embodiments, the final gate stack 152 extends in the Y direction. That is, the final gate stack 152 has a longitudinal axis parallel to the Y direction, in accordance with some embodiments. The final gate stack 152 wraps around each of the nanostructures 108 and is interposed between the source/drain features 136, in accordance with some embodiments.

The final gate stack 152 combines with the source/drain features 136 to form a nanostructure transistor, such as an n-channel nanostructure transistor or p-channel nanostructure transistor, in accordance with some embodiments. The final gate stack 152 may engage the channel region of the nanostructures 108, such that current can flow between the source/drain features 136 during operation.

It is understood that the semiconductor structure 100 may undergo further CMOS processes to form various features over the semiconductor structure 100, such as gate isolation structures to the dielectric fin structures, contacts to gate and/or source/drain features, vias, lines, inter metal dielectric layers, passivation layers, etc.

In the embodiments of the present disclosure, the passivation processes are performed, thereby passivating the reactivity of the dangling bonds of the first semiconductor layers 106 and the semiconductor capping layer 112 on the exposed etched surface, in accordance with some embodiments. The oxide formation may be mitigated or prevented, and thus Dit may be reduced and the carrier mobility may be improved. Therefore, the performance of the resulting semiconductor device may be improved.

FIGS. 3A-1 through 3I-4 are cross-sectional views illustrating the formation of a semiconductor structure 200 at various intermediate stages, in accordance with some embodiments of the disclosure. The embodiments of the FIGS. 3A-1 through 3I-4 are similar to the embodiments of the FIGS. 2A-1 through 2R-4, except that the passivation layers are formed by deposition process.

Figures 3, 3A:
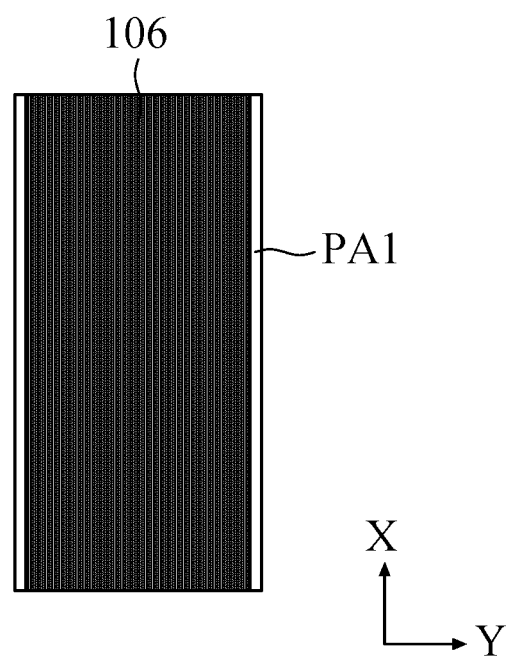

FIGS. 3A-1, 3B-1, 3C-1, 3D-1, 3E-1, 3F-1, 3G-1, 3H-1 and 3I-1 correspond to cross-section X-X shown in FIG. 1. FIG. 3A-2 corresponds to cross-section Y1-Y1 or cross-section Y2-Y2 shown in FIG. 1. FIGS. 3B-2, 3G-2, 3H-2 and 3I-2 correspond to cross-section Y1-Y1 shown in FIG. 1. FIGS. 3C-2, 3D-2, 3E-2 and 3F-2 correspond to cross-section Y2-Y2 shown in FIG. 1, in accordance with some embodiments of the disclosure.

FIGS. 3A-3, 3B-3, 3C-3, 3D-3, 3E-3, 3G-3, 3H-1 and 3I-3 are plan views of the semiconductor structure 200 taken along line I-I shown in FIGS. 3A-1, 3B-1, 3C-1, 3D-1, 3E-1, 3G-1, 3H-1 and 3I-1 and these figures ending with "-2", in accordance with some embodiments of the disclosure.

FIGS. 3A-1, 3A-2 and 3A-3 illustrate a semiconductor structure 200 after the formation of a first passivation layer PA1, in accordance with some embodiments.

After the etching process for forming the semiconductor fin structure 104, a clean process is performed on the semiconductor structure 200 to remove the residues, polymers and/or byproducts, in accordance with some embodiments. In some embodiments, the clean process includes immersing the semiconductor structure 200 in SPM solution, SC-1 (RCA Standard Clean-1) solution, and/or SC-2 (RCA Standard Clean-2) solution. The clean process may be performed at a temperature from room temperature (about 25° C.) to about 50° C.

After the etching process for forming the semiconductor fin structure 104, dangling bonds may exist on the exposed etching surfaces (i.e., the sidewalls) of the first semiconductor layers 106 of the semiconductor fin structure 104. A first passivation layer PA1 is formed over the semiconductor structure 200, in accordance with some embodiments. The first passivation layer PA1 is configured to passivate the dangling bonds of the first semiconductor layers 106 on the exposed surfaces, as shown in FIGS. 3A-1, 3A-2 and 3A-3, in accordance with some embodiments.

In some embodiments, the first passivation layer PA1 is made of semiconductor material such as silicon (e.g., polysilicon). In some embodiments, the first passivation layer PA1 is globally and conformally deposited using ALD, CVD, another suitable technique, or a combination thereof. In some embodiments, the deposition process uses silane (SiH$_4$), dichlorosilane (SiH$_2$Cl$_2$ or DSC) and/or disilane (Si$_2$H$_6$), or a combination thereof as a percussor, and is performed at a temperature in a range from about 200° C. to about 700° C. In some embodiments, the thickness of the first passivation layer PA1 is in a range from about 5 Å to about 20 Å.

The first passivation layer PA1 covers the exposed surface of the first semiconductor layers 106, which may decrease the reactivity of the dangling bonds, thereby mitigating and preventing oxide formation, in accordance with some embodiments. Therefore, Dit may be reduced, which may in turn improve the performance of the resulting semiconductor device.

FIGS. 3B-1, 3B-2 and 3B-3 illustrate a semiconductor structure 200 after the formation of a dummy gate structure 118 and gate spacer layers 124, in accordance with some embodiments.

Figures 3, 3B:
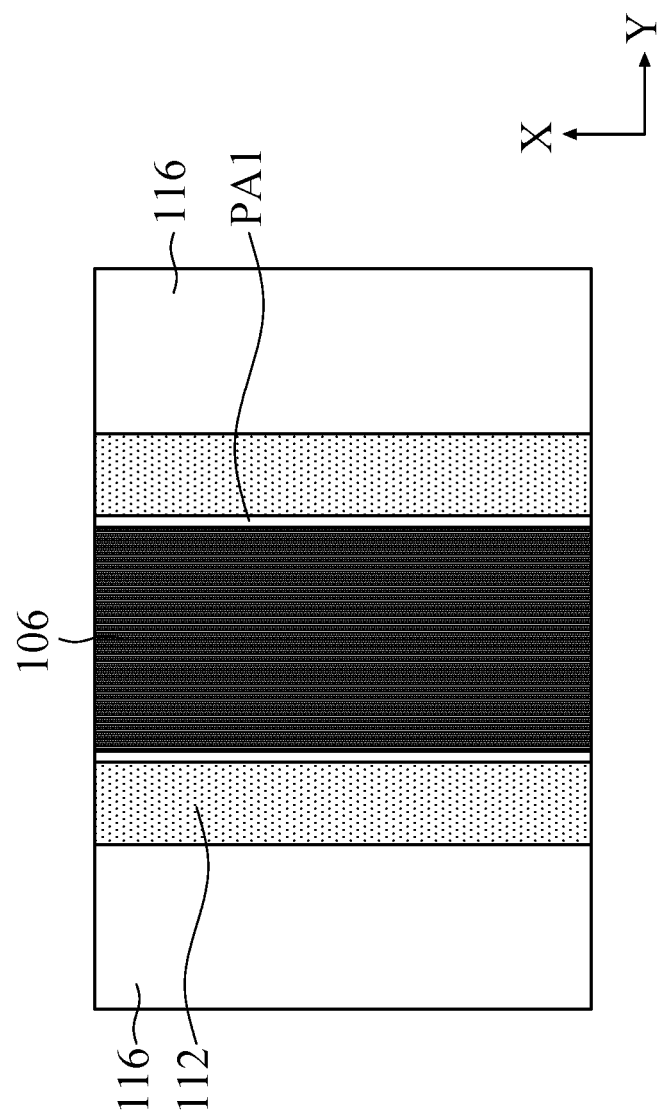
Figures 1, 2, 3C:
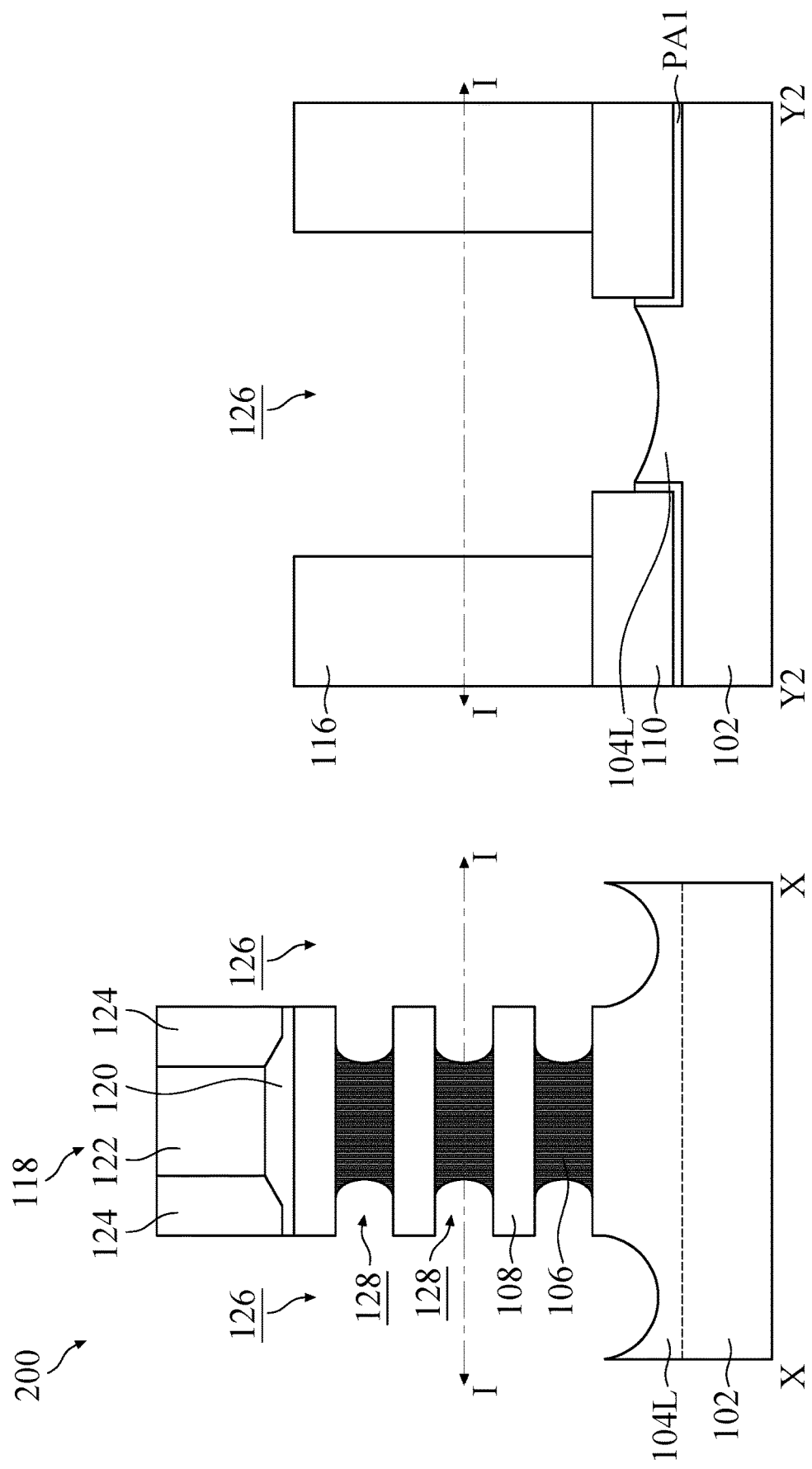
Figures 3, 3C:
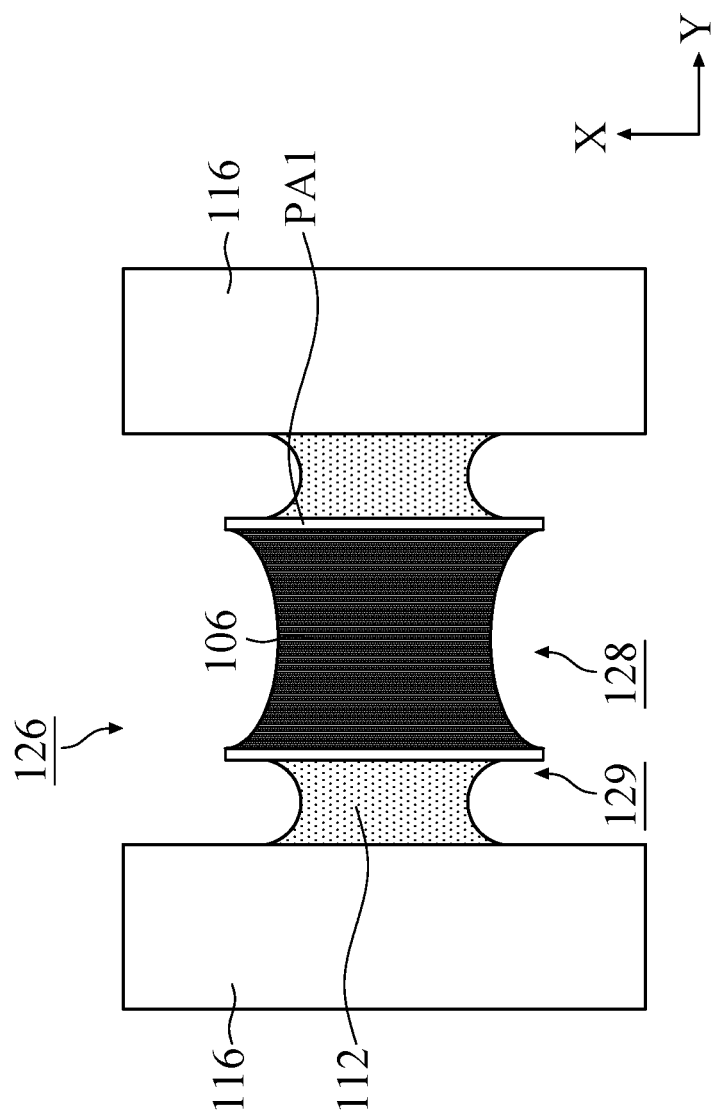
Figures 3, 3D:
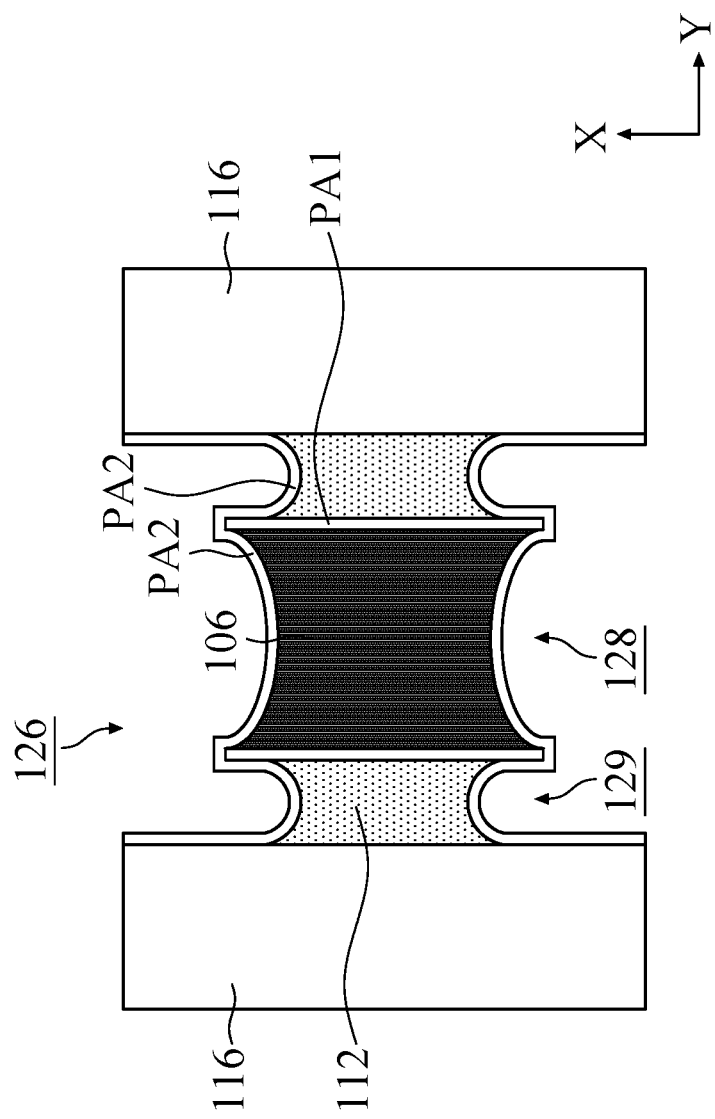

The steps described above with respect to FIGS. 2C-1 through 2G-2 are performed on the semiconductor structure 200, in accordance with some embodiments. An isolation structure 110 is formed over the first passivation layer PA1 to surround the lower fin element 104L of the semiconductor fin structure 104, as shown in FIG. 3B-2, in accordance with some embodiments. A semiconductor capping layer 112 is formed over the isolation structure 110 to surround the upper fin element, as shown in FIGS. 3B-2 and 3B-3, in accordance with some embodiments. The semiconductor structure 200 is covered by the first passivation layer PA1, which may suppress the diffusion of the germanium from the semiconductor capping layer 112 into the second semiconductor layers 108 during subsequent thermal processes, in accordance with some embodiments.

Dielectric fin structures 116 are formed over isolation structure 110 and spaced apart from the semiconductor fin structure 104 by the semiconductor capping layer 112, as shown in FIGS. 3B-2 and 3B-3, in accordance with some embodiments. The dummy gate structure 118 is formed over the channel region of the semiconductor fin structure 104, the semiconductor capping layer 112, and the dielectric fin structures 116, as shown in FIGS. 3B-1 and 3B-2, in accordance with some embodiments. Gate spacer layers 124 are formed on the opposite sides of the dummy gate structure 118, as shown in FIGS. 3B-1 and 3B-2, in accordance with some embodiments.

FIGS. 3C-1, 3C-2 and 3C-3 illustrate a semiconductor structure 200 after the formation of source/drain recesses 126 and notches 128 and 129, in accordance with some embodiments.

The steps described above with respect to FIGS. 2H-1 through 2I-3 are performed on the semiconductor structure 200, in accordance with some embodiments. An etching process is performed to recess the source/drain regions of the semiconductor fin structure 104 and the semiconductor capping layer 112, thereby forming source/drain recesses 126, as shown in FIGS. 3C-1, 3C-2 and 3C-3, in accordance with some embodiments. An etching process is performed to laterally recess the first semiconductor layers 106 of the semiconductor fin structure 104 to form notches 128 and laterally recesses the semiconductor capping layer 112 to form notches 129, as shown in FIGS. 3C-1, 3C-2 and 3C-3, in accordance with some embodiments.

FIGS. 3D-1, 3D-2 and 3D-3 illustrate a semiconductor structure 200 after the formation of a second passivation layer PA2, in accordance with some embodiments.

After the etching processes for forming the source/drain recess 126 and the notches 128 and 129, a clean process is performed on the semiconductor structure 200 to remove the residues, polymers and/or byproducts, in accordance with some embodiments. In some embodiments, the clean process includes immersing the semiconductor structure 200 in SPM solution, SC-1 (RCA Standard Clean-1) solution, and/or SC-2 (RCA Standard Clean-2) solution. The clean process may be performed at a temperature from room temperature (about 25° C.) to about 50° C.

After the etching process for forming the source/drain recess 126 and the notches 128 and 129, dangling bonds may exist on the exposed etching surfaces (i.e., the sidewalls) of the first semiconductor layers 106 of the semiconductor fin structure 104 and the semiconductor capping layer 112. A second passivation layer PA2 is formed over the semiconductor structure 200, as shown in FIGS. 3D-1, 3D-2 and 3D-3, in accordance with some embodiments. The second passivation layer PA2 partially fills the notches 128 and 129, in accordance with some embodiments. The second passivation layer PA2 is configured to passivate the dangling bonds of the first semiconductor layers 106 and the semiconductor capping layer 112 on the exposed surfaces, in accordance with some embodiments.

In some embodiments, the second passivation layer PA2 is made of semiconductor material such as silicon (e.g., polysilicon). In some embodiments, the second passivation layer PA2 is globally and conformally deposited using ALD, CVD, another suitable technique, or a combination thereof. In some embodiments, the deposition process uses silane ($SiH_4$), dichlorosilane ($SiH_2Cl_2$ or DSC) and/or disilane ($Si_2H_6$), or a combination thereof as a precursor, and is performed at a temperature in a range from about 200° C. to about 700° C. In some embodiments, the thickness of the second passivation layer PA2 is in a range from about 5 Å to about 20 Å.

The second passivation layer PA2 covers the exposed surface of the first semiconductor layers 106 and the semiconductor capping layer 112, which may decrease the reactivity of the dangling bonds, thereby mitigating and preventing oxide formation, in accordance with some embodiments. Therefore, Dit may be reduced, which may in turn improve the performance of the resulting semiconductor device.

FIGS. 3E-1, 3E-2 and 3E-3 illustrate a semiconductor structure 200 after the formation of inner spacer layers 132 and 133 and notches 134, in accordance with some embodiments.

Figures 1, 2, 3E:
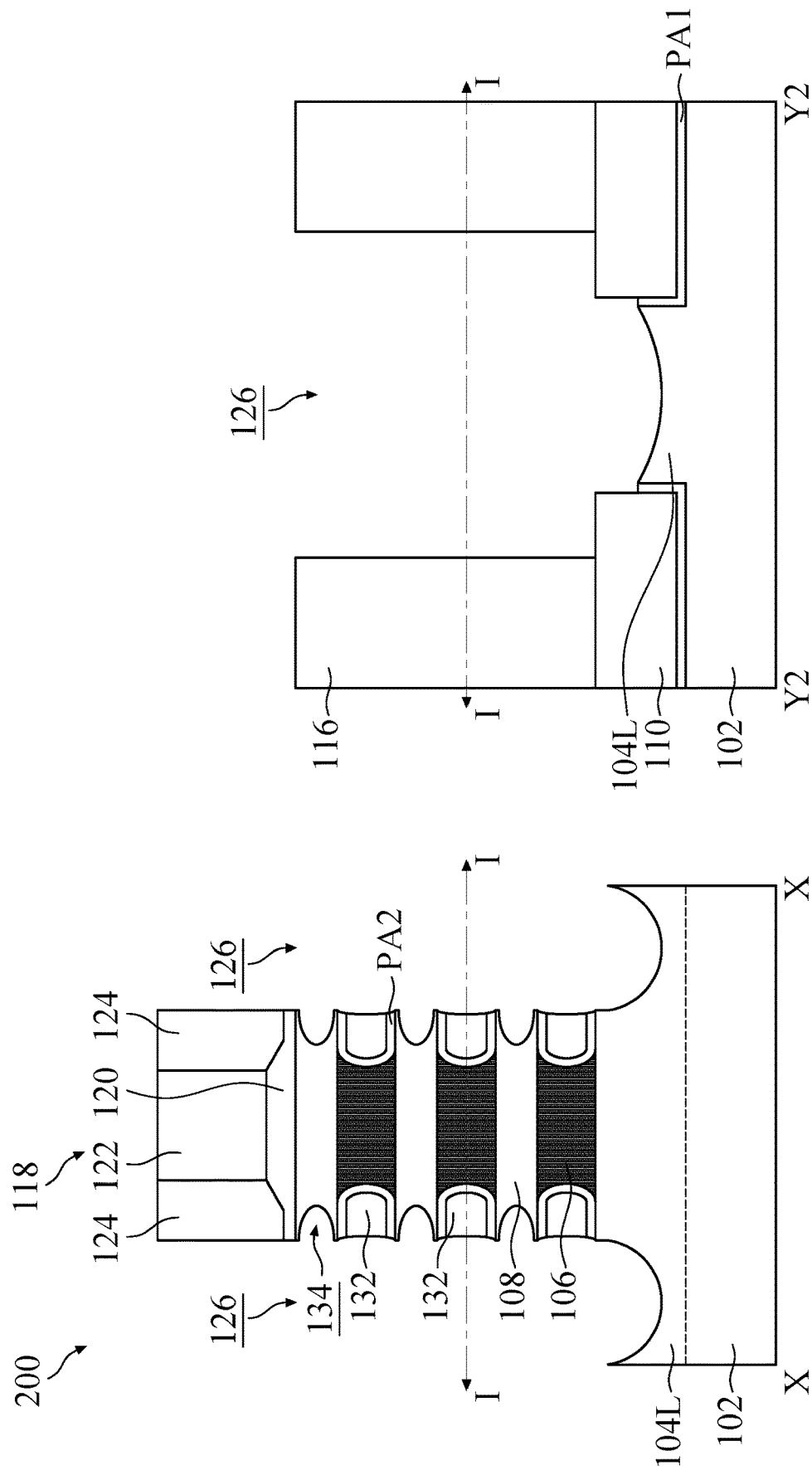
Figures 3, 3E:
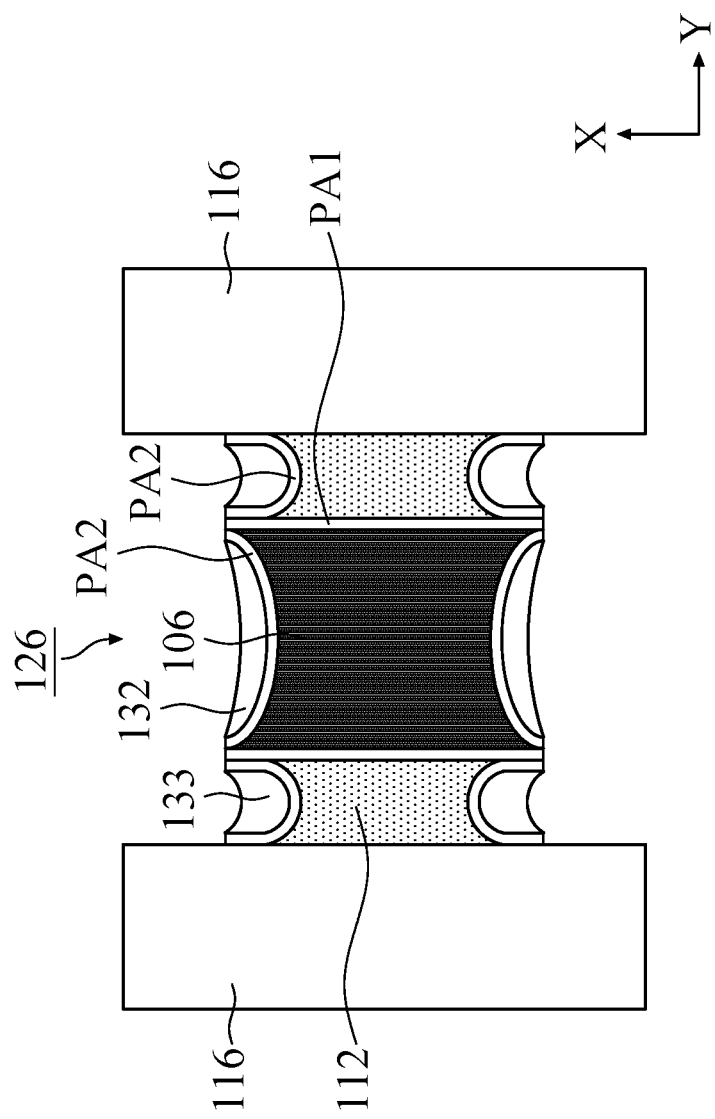

The steps described above with respect to FIGS. 2K-1 through 2L-3 are performed on the semiconductor structure 200, in accordance with some embodiments. Inner spacer layers 132 are formed in the notches 128 and inner spacer layers 133 are formed in the notches 129, as shown in FIGS. 3E-1 and 3E-3, in accordance with some embodiments. An etching process is performed to laterally recess the second semiconductor layers 108 of the semiconductor fin structure 104 to form notches 134, as shown in FIG. 3E-1, in accordance with some embodiments. In some embodiments, the portion of the second passivation layer PA2 outside the notches 128 and 129 is also removed in the etching process.

Figures 1, 2, 3F:
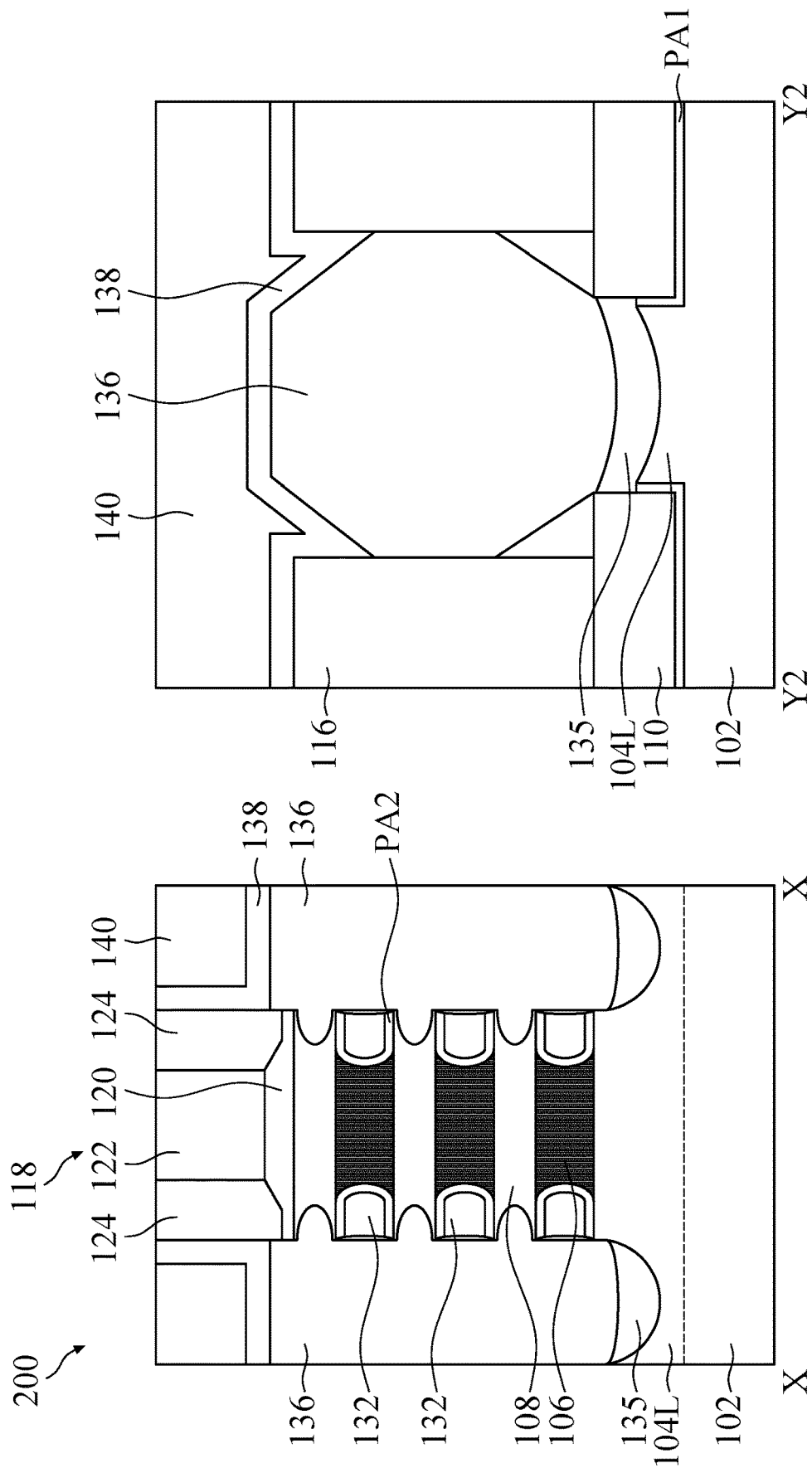

FIGS. 3F-1 and 3F-2 illustrate a semiconductor structure 200 after the formation of source/drain features 136, a contact etching stop layer 138 and an interlayer dielectric layer 140, in accordance with some embodiments.

The steps described above with respect to FIGS. 2M-1 through 2N-2 are performed on the semiconductor structure 200, in accordance with some embodiments. Undoped epitaxial layers 135 are formed the lower fin elements 104L in the source/drain recesses 126, as shown in FIGS. 3F-1 and 3F-2, in accordance with some embodiments. Source/drain features 136 are formed over the undoped epitaxial layers 135 in the source/drain recesses 126, as shown in FIGS. 3F-1 and 3F-2, in accordance with some embodiments. A contact etching stop layer 138 is formed over the semiconductor structure 200, and an interlayer dielectric layer 140 is formed over the contact etching stop layer 138, as shown in FIGS. 3F-1 and 3F-2, in accordance with some embodiments.

FIGS. 3G-1, 2G-2 and 3G-3 illustrate a semiconductor structure 200 after the formation of a gate trench 142 and gaps 143 and 144, in accordance with some embodiments.

Figures 1, 2, 3G:
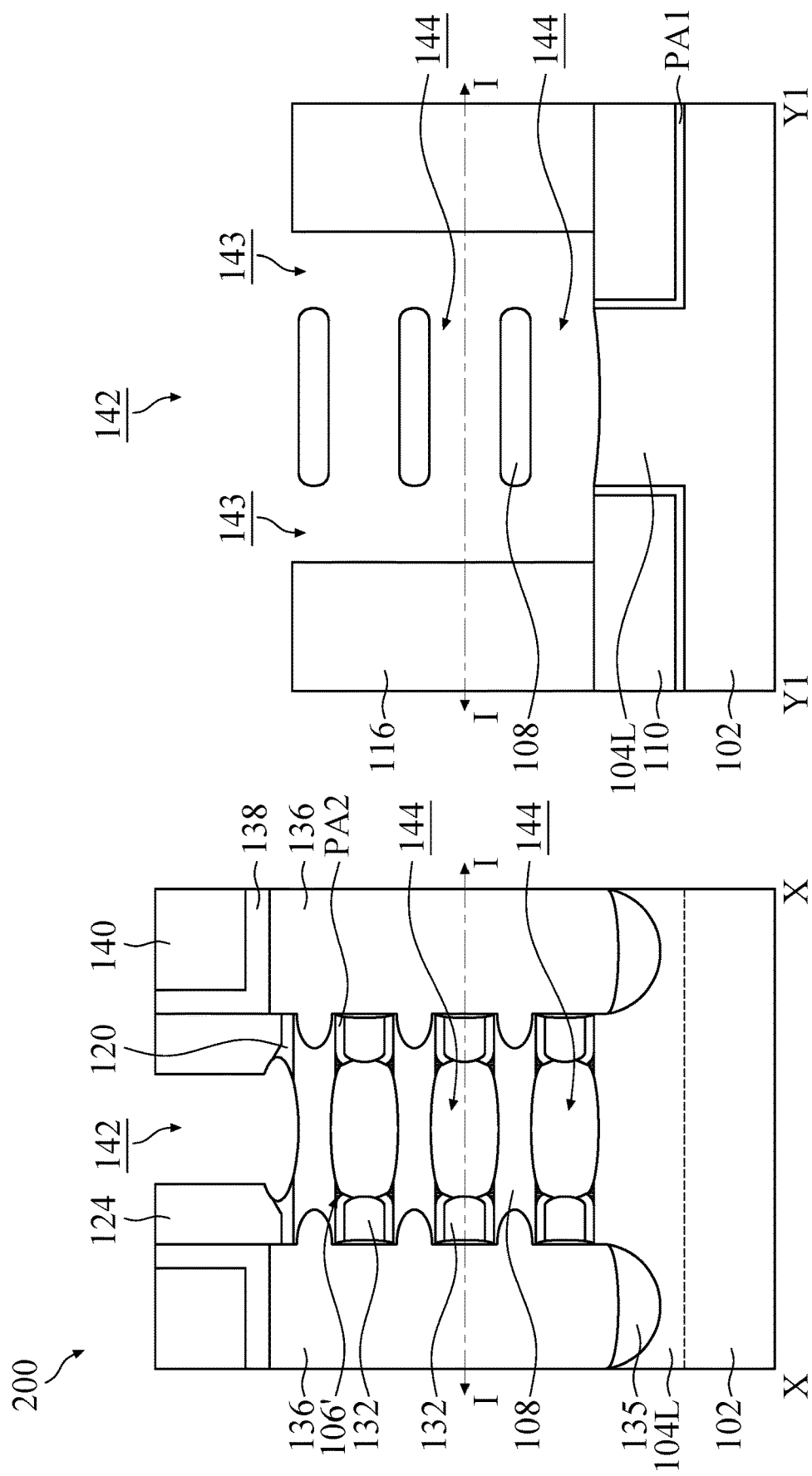
Figures 3, 3G, 4:
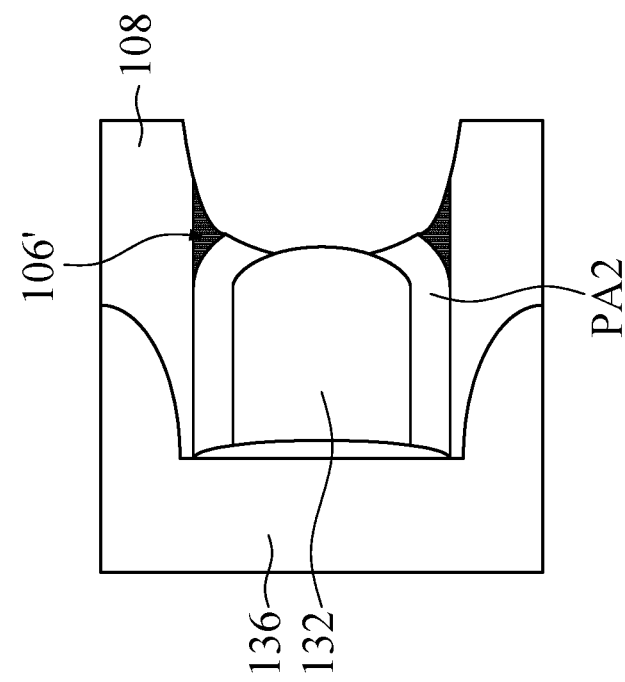
Figures 3, 3G:
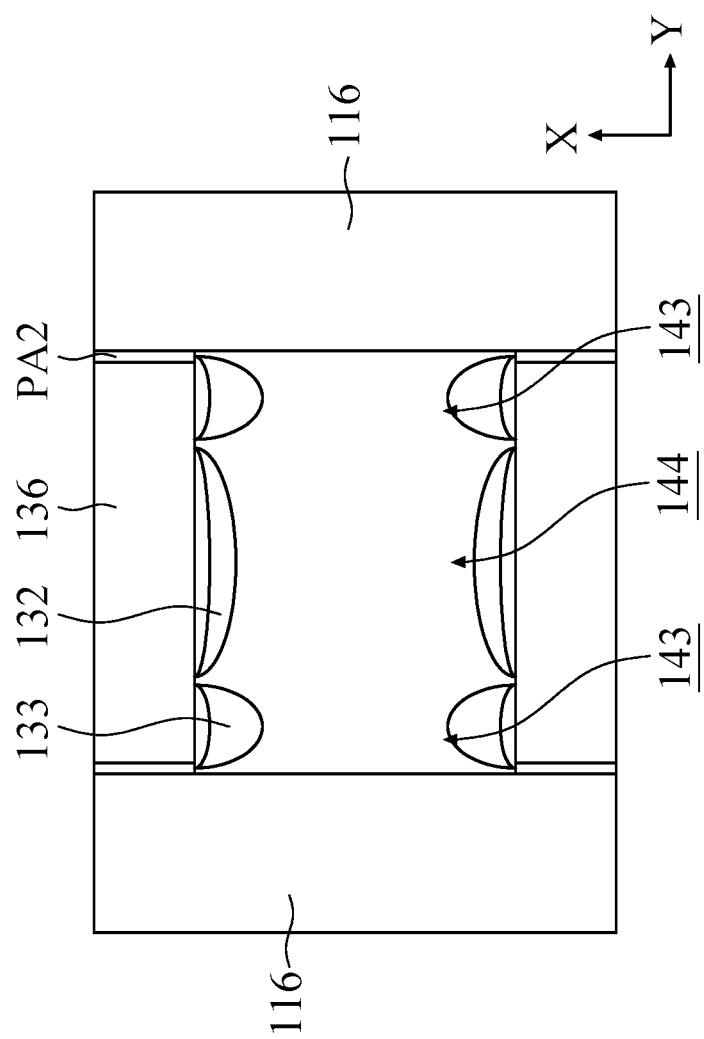

The steps described above with respect to FIGS. 2O-1, 2O-2 and 2O-3 are performed on the semiconductor structure 200, in accordance with some embodiments. The dummy gate structure 118 is removed using one or more etching processes to form a gate trench 142 between the gate spacer layers 124, as shown in FIGS. 3G-1 and 3G-2, in accordance with some embodiments. An etching process is performed to remove the semiconductor capping layer 112 to form gaps 143 and remove the first semiconductor layers 106 of the semiconductor fin structure 104 to form gaps 144, as shown in FIGS. 3G-1, 3G-2 and 3F-3, in accordance with some embodiments.

The exposed second semiconductor layers 108 serve as nanostructures, in accordance with some embodiments. In the etching process, the nanostructures 108 are also trimmed to thin down the center portions of the nanostructures 108 exposed from the gaps 144. Furthermore, portions of the first passivation layer PA1 formed along the semiconductor fin structure 104 exposed from the gate trench 142 and the notches 143 and portions of the second passivation layer PA2 exposed from the notches 144 are also removed, as shown in FIGS. 3G-1 and 3G-2, in accordance with some embodiments.

Figures 4, 20:
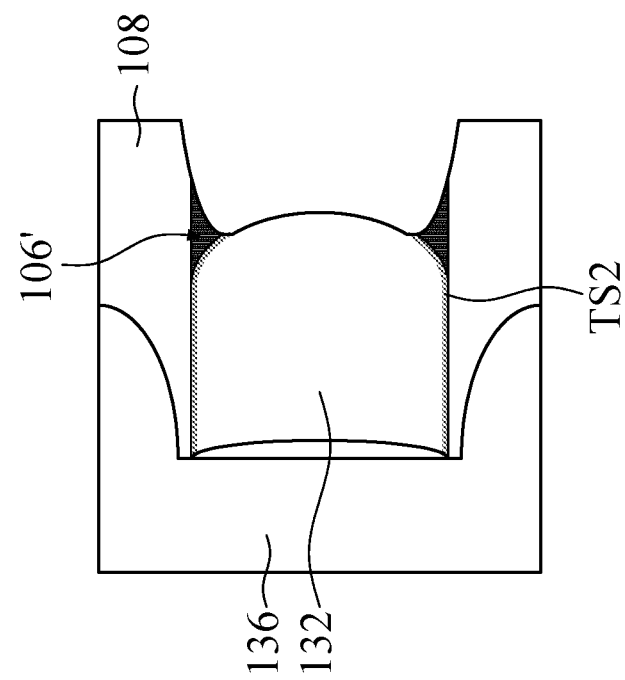
Figures 3, 20:
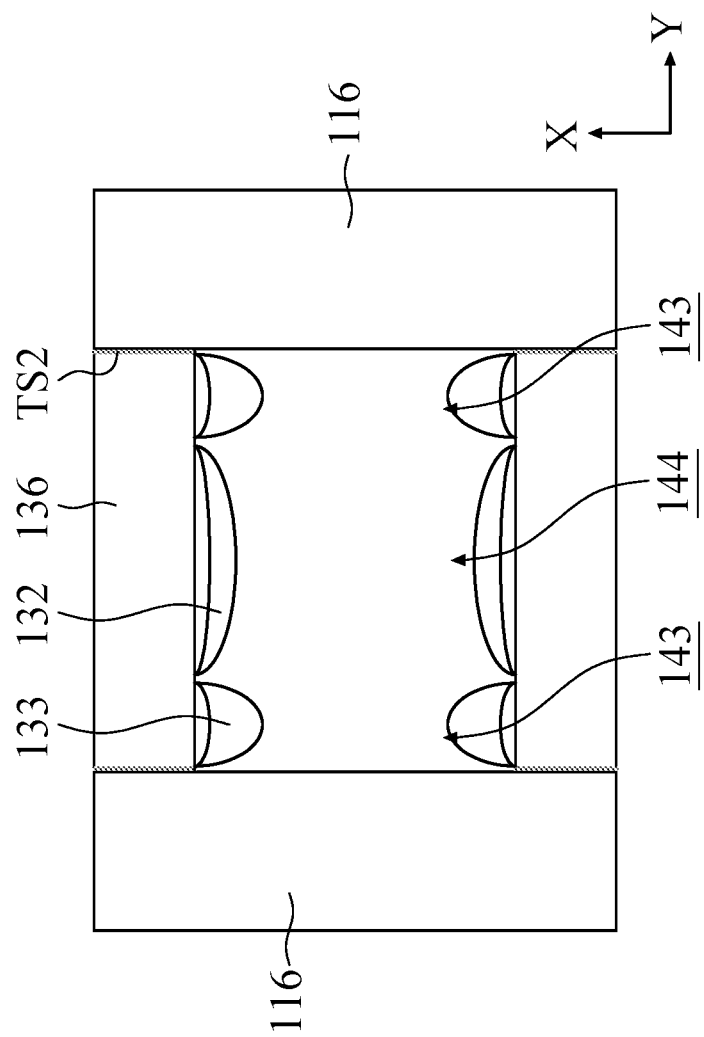

In some embodiments, the etching process may not completely remove the semiconductor material of the first semiconductor layers 106 due to etch process limitations and/or concerns about etch damage to adjacent components. FIG. 3G-4 illustrates an enlarged view of FIGS. 3G-1 to illustrate a remaining portion 106' of a first semiconductor layer 106 and neighboring components, in accordance with some embodiments of the disclosure. In some embodiments, after the etching process for removing the first semiconductor layers 106 and the semiconductor capping layer 112, the remaining portions 106' of the first semiconductor layers 106 may leave at the corner between the nanostructures 108 and the inner spacer layers 132. The remaining portions 106' of the first semiconductor layers 106 are hereinafter referred to as semiconductor features 106'.

FIGS. 3H-1, 3H-2 and 3H-3 illustrate a semiconductor structure 200 after the formation of a third passivation layer PA3, in accordance with some embodiments.

After the etching process for removing the first semiconductor layers 106 and the semiconductor capping layer 112, a clean process is performed on the semiconductor structure 200 to remove the residues, polymers and/or byproducts, in accordance with some embodiments. In some embodiments, the clean process includes immersing the semiconductor structure 200 in SPM solution, SC-1 (RCA Standard Clean-1) solution, and/or SC-2 (RCA Standard Clean-2) solution. The clean process may be performed at a temperature from room temperature (about 25° C.) to about 50° C.

After the etching process for removing the first semiconductor layers 106 and the semiconductor capping layer 112, dangling bonds may exist on the exposed etching surfaces of the semiconductor features 106'. A third passivation layer PA3 is formed over the semiconductor structure 200, as shown in FIGS. 3H-1, 3H-2 and 3H-3, in accordance with some embodiments.

The third passivation layer PA3 partially fills the gate trench 142 and the gaps 143 and 144 and wraps around nanostructure 108, in accordance with some embodiments. The third passivation layer PA3 is formed along the upper surfaces and the sidewalls of the dielectric fin structures 116 and the upper surface of the isolation structure 110, in accordance with some embodiments. The third passivation layer PA3 is also formed along the inner sidewalls of the gate spacer layers 124 facing the channel region and the inner sidewalls of the inner spacer layers 132 facing the channel region, in accordance with some embodiments.

FIG. 3H-4 illustrates an enlarged view of FIGS. 3H-1 to illustrate the semiconductor features 106' and neighboring components, in accordance with some embodiments of the disclosure. The third passivation layer PA3 covers the exposed surfaces of the semiconductor features 106', in accordance with some embodiments. The third passivation layer PA3 is configured to passivate the dangling bonds of the semiconductor features 106' on the exposed surfaces, in accordance with some embodiments.

In some embodiments, the third passivation layer PA3 is made of semiconductor material such as silicon (e.g., polysilicon). In some embodiments, the third passivation layer PA3 is globally and conformally deposited using ALD, CVD, another suitable technique, or a combination thereof. In some embodiments, the deposition process uses silane ($SiH_4$), dichlorosilane ($SiH_2Cl_2$ or DSC) and/or disilane ($Si_2H_6$), or a combination thereof as a percussor, and is performed at a temperature in a range from about 200° C. to about 700° C. In some embodiments, the thickness of the third passivation layer PA3 is in a range from about 5 Å to about 20 Å.

The third passivation layer PA3 covers the exposed surface of the semiconductor features 106', which may decrease the reactivity of the dangling bonds, thereby mitigating and preventing oxide formation, in accordance with some embodiments. Therefore, Dit may be reduced, which may in turn improve the performance of the resulting semiconductor device.

Figures 1, 2, 3I:
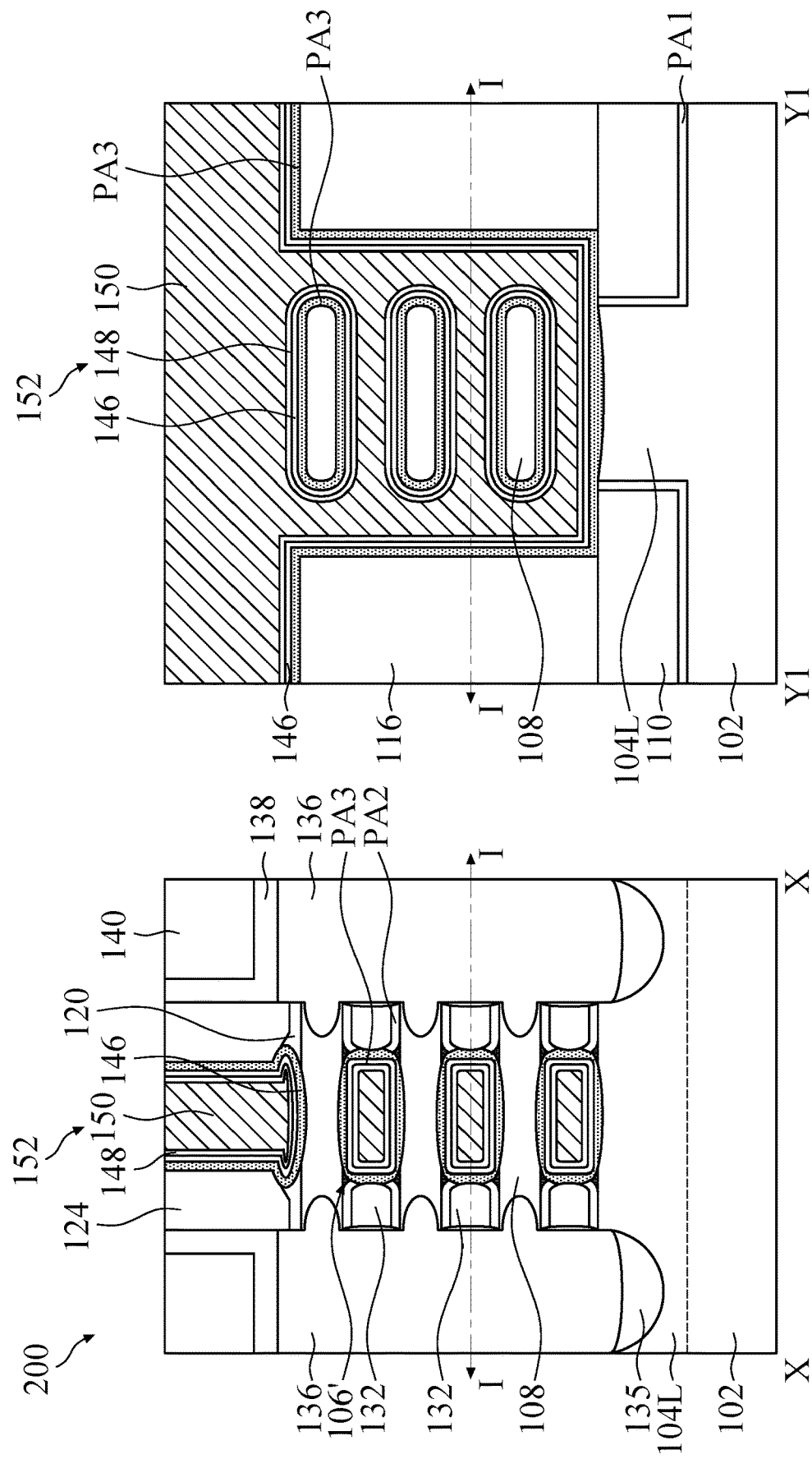
Figures 3, 3I, 4:
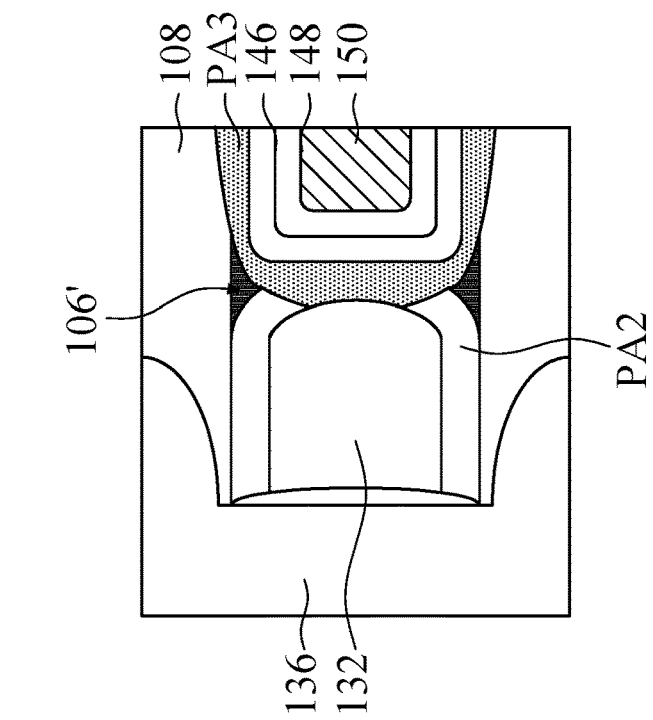
Figures 3, 3I:
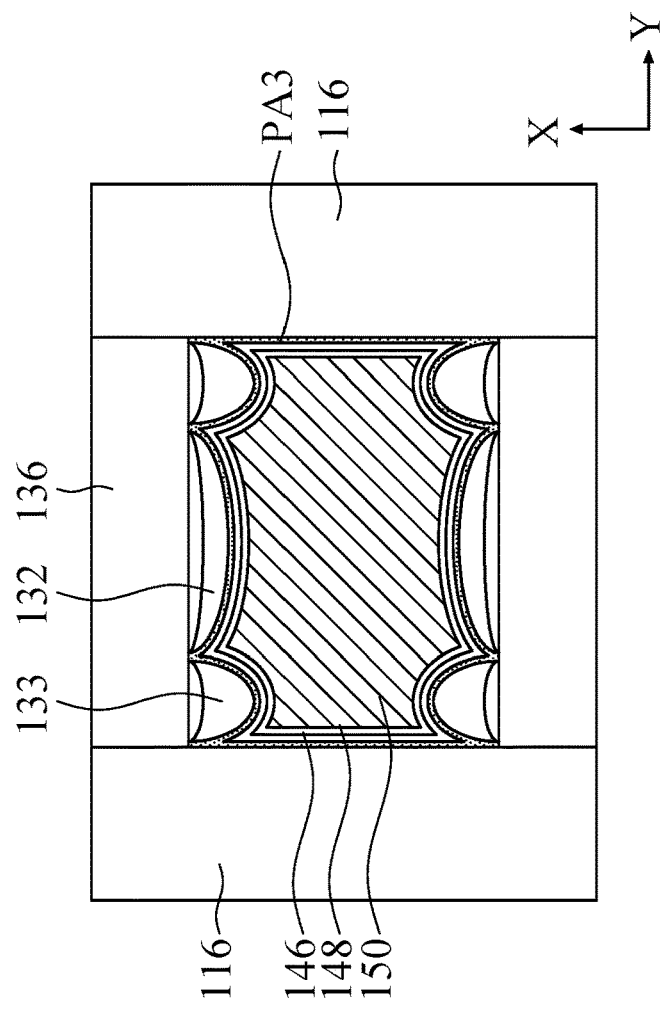

FIGS. 3I-1, 3I-2 and 3I-3 illustrate a semiconductor structure 200 after the formation of an interfacial layer 146, a gate dielectric layer 148 and a gate electrode layer 150, in accordance with some embodiments. FIG. 3I-4 illustrates an enlarged view of FIGS. 3I-1 to illustrate the semiconductor features 106' and neighboring components, in accordance with some embodiments of the disclosure.

The steps described above with respect to FIGS. 2Q-1 through 2R-3 are performed on the semiconductor structure 200, in accordance with some embodiments. The interfacial layer 146 is formed on the third passivation layer PA3, as shown in FIGS. 3I-1 and 3I-2, in accordance with some embodiments. The interfacial layer 146 is formed by an oxidation process, in accordance with some embodiments. The semiconductor material from the third passivation layer PA3 is oxidized to form the interfacial layer 146 on the exposed surfaces of the third passivation layer PA3, in accordance with some embodiments. The interfacial layer 146 wraps around the nanostructures 108, in accordance with some embodiments.

A gate dielectric layer 148 is formed conformally along the semiconductor structure 200 and partially fills the gate trench 142 and the gaps 143 and 144, as shown in FIGS. 3I-1, 3I-2 and 3I-3, in accordance with some embodiments. A metal gate electrode layer 150 is formed over the gate dielectric layer 148 and overfills remainders of the gate trench 142 and the gaps 143 and 144, as shown in FIGS. 3I-1, 3I-2 and 3I-3, in accordance with some embodiments.

A planarization process such as CMP may be performed on the semiconductor structure 200 to remove the materials of the gate dielectric layer 148 and the metal gate electrode layer 150 formed above the upper surface of the interlayer dielectric layer 140, in accordance with some embodiments. The interfacial layer 146, the gate dielectric layer 148 and the metal gate electrode layer 150 combine to form a final gate stack 152, in accordance with some embodiments.

As described above, the aspect of the present disclosure is directed to forming passivation layers on exposed etched surfaces of SiGe layers. After the etching SiGe layers, dangling bonds may exist on the exposed etching surfaces. In accordance with the embodiments, once the first semiconductor layers 106 and the semiconductor capping layer 112 are etched to have etched surfaces, a passivation layer is formed to cover the exposed etched surfaces of the first semiconductor layers 106 and the semiconductor capping layer 112, thereby passivating the reactivity of the dangling bonds. In some embodiments, the formation of the passivation layer includes treating the exposed surfaces of the semiconductor structure with radicals (such as nitrogen radical, hydrogen radical, deuterium radical and/or sulfur radical). In some other embodiments, the formation of the passivation layer includes forming a silicon layer. As a result, the oxide formation may be mitigated or prevented, and thus Dit may be reduced and the carrier mobility may be improved. Therefore, the performance of the resulting semiconductor device may be improved.

Embodiments of a semiconductor structure and the method for forming the same may be provided. The method for forming the semiconductor structure may include forming a stack including alternating first semiconductor layers and second semiconductor layers, etching the stack into a semiconductor fin structure, and forming a first passivation layer over the semiconductor fin structure. The method may also include laterally recessing the first semiconductor layers to form notches, and forming a second passivation layer on sidewalls of the first semiconductor layers exposed from the notches. The method may also include removing the first semiconductor layers to form nanostructure from the second semiconductor layers, and forming a third passivation layer to cover a remaining portion of the first semiconductor layers. As a result, the dangling bonds of the first semiconductor layers on the exposed etched surface may be passivated. Therefore, the performance of the resulting semiconductor device may be improved.

In some embodiments, a method for forming a semiconductor structure is provided. The method includes forming a semiconductor fin structure over a substrate, and the semiconductor fin structure includes first semiconductor layers and second semiconductor layers alternatingly stacked. The method also includes forming a semiconductor capping layer surrounding the semiconductor fin structure, laterally recessing the first semiconductor layers of the semiconductor fin structure and the semiconductor capping layer to form first notches in the first semiconductor layers and a second notch in the semiconductor capping layer. The method also includes forming first passivation layers on first sidewalls of the first semiconductor layers exposed from the first notches and a second passivation layer on a second sidewall of the semiconductor capping layer exposed from the second notch, and forming first inner spacer layers in the first notches and a second inner spacer layer in the second notch.

In some embodiments, a method for forming a semiconductor structure is provided. The method includes forming a stack over a substrate, and the stack includes a first semiconductor layer and second semiconductor layers interposed by the first semiconductor layer. The method also includes etching the stack to form a semiconductor fin structure, forming an inner spacer layer on a sidewall of the first semiconductor of the semiconductor fin structure, and etching the first semiconductor layer of the semiconductor fin structure until the inner spacer is exposed. A remaining portion of the first semiconductor layer leaves at a corner between one of the second semiconductor layers and the inner spacer layer. The method also includes forming a first passivation layer to cover the remaining portion of the first semiconductor layer, and forming a gate stack around the second semiconductor layers of the semiconductor fin structure.

In some embodiments, a semiconductor structure is provided. The semiconductor structure includes a first nanostructure stacked over and spaced apart from a second nanostructure, a source/drain feature adjoining the first nanostructure and the second nanostructure, and a gate stack wrapping around the first nanostructure and the second nanostructure. The semiconductor structure also includes an inner spacer layer sandwiched between the source/drain feature and the gate stack and between the first nanostructure and the second nanostructure, and a semiconductor feature at a corner between the inner spacer layer and the first nanostructure. The semiconductor structure also includes a first passivation layer sandwiched between a first surface of the semiconductor feature and the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a semiconductor fin structure over a substrate, wherein the semiconductor fin structure includes first semiconductor layers and second semiconductor layers alternatingly stacked;
    forming a semiconductor capping layer surrounding the semiconductor fin structure;
    laterally recessing the first semiconductor layers of the semiconductor fin structure and the semiconductor capping layer to form first notches in the first semiconductor layers and a second notch in the semiconductor capping layer;
    forming first passivation layers on first sidewalls of the first semiconductor layers exposed from the first notches and a second passivation layer on a second sidewall of the semiconductor capping layer exposed from the second notch; and
    forming first inner spacer layers in the first notches and a second inner spacer layer in the second notch.

2. The method for forming the semiconductor structure as claimed in claim 1, wherein forming the first passivation layers and the second passivation layer comprises:
    treating the semiconductor fin structure and the semiconductor capping layer with a first radical, wherein the first radical includes nitrogen, hydrogen, deuterium or sulfur.

3. The method for forming the semiconductor structure as claimed in claim 1, wherein the first passivation layers and the second passivation layer are made of silicon.

4. The method for forming the semiconductor structure as claimed in claim 1, further comprising, before forming the first passivation layers and the second passivation layer:
cleaning the first sidewalls of the first semiconductor layers exposed from the first notches and the second sidewall of the semiconductor capping layer exposed from the second notch in a solution.

5. The method for forming the semiconductor structure as claimed in claim 1, wherein the first notches have a first recessing depth, the second notch has a second recessing depth, and the first recessing depth is less than the second recessing depth.

6. The method for forming the semiconductor structure as claimed in claim 1, further comprising:
forming a source/drain recess in the semiconductor fin structure and semiconductor capping layer before laterally recessing the first semiconductor layers of the semiconductor fin structure and the semiconductor capping layer;
laterally recessing the second semiconductor layers of the semiconductor fin structure to form third notches in the second semiconductor layers; and
forming a source/drain feature in the source/drain recess and in the second semiconductor layers.

7. The method for forming the semiconductor structure as claimed in claim 1, further comprising:
removing the semiconductor capping layer and the first semiconductor layers of the semiconductor fin structure, thereby forming nanostructures from the second semiconductor layers of the semiconductor fin structure;
forming interfacial layers surrounding the nanostructures;
forming gate dielectric layers surrounding the interfacial layers; and
forming a gate electrode layer surrounding the gate dielectric layers.

8. The method for forming the semiconductor structure as claimed in claim 7, further comprising:
treating the nanostructures with a second radical, wherein the second radical includes nitrogen, hydrogen, deuterium or sulfur.

9. The method for forming the semiconductor structure as claimed in claim 7, further comprising:
forming third passivation layers surrounding the nanostructures before forming the interfacial layers, wherein the third passivation layers are made of silicon, and forming the interfacial layers comprises oxidizing a portion of the third passivation layers.

10. A method for forming a semiconductor structure, comprising:
forming a stack over a substrate, the stack including a first semiconductor layer and second semiconductor layers interposed by the first semiconductor layer;
etching the stack to form a semiconductor fin structure;
forming an inner spacer layer on a sidewall of the first semiconductor of the semiconductor fin structure;
etching the first semiconductor layer of the semiconductor fin structure until the inner spacer layer is exposed, wherein a remaining portion of the first semiconductor layer leaves at a corner between one of the second semiconductor layers and the inner spacer layer;
forming a first passivation layer to cover the remaining portion of the first semiconductor layer; and
forming a gate stack around the second semiconductor layers of the semiconductor fin structure.

11. The method for forming the semiconductor structure as claimed in claim 10, further comprising:
soaking the substrate with a first nitrogen-containing gas such that nitrogen is bonded to an exposed surface of the remaining portion of the first semiconductor layer, wherein a nitrided surface portion of the remaining portion of the first semiconductor layer forms the first passivation layer.

12. The method for forming the semiconductor structure as claimed in claim 10, further comprising:
soaking the substrate with a second nitrogen-containing gas after forming the semiconductor fin structure and before forming an inner spacer layer such that nitrogen is bonded to a sidewall of the first semiconductor layer of the semiconductor fin structure, wherein a second nitrided surface portion of the first semiconductor layer forms a second passivation layer.

13. The method for forming the semiconductor structure as claimed in claim 12, further comprising:
forming a semiconductor capping layer surrounding the semiconductor fin structure, wherein the semiconductor capping layer is in contact with the second passivation layer; and
forming a dielectric fin structure spaced apart from the semiconductor fin structure by the semiconductor capping layer, wherein a longitudinal axis of the semiconductor fin structure is substantially parallel to a longitudinal axis of the dielectric fin structure.

14. The method for forming the semiconductor structure as claimed in claim 10, wherein the first semiconductor layer is made of SiGe, and the second semiconductor layers are made of Si.

15. The method for forming the semiconductor structure as claimed in claim 10, further comprising:
etching the semiconductor fin structure to form a source/drain recess;
laterally recessing, from the recess, the first semiconductor layer to form a notch; and
soaking the substrate with a third nitrogen-containing gas such that nitrogen is bonded to a surface of the first semiconductor layer of the semiconductor fin structure exposed from the notch, wherein a third nitrided surface portion of the first semiconductor layer forms a third passivation layer, and the inner spacer layer is formed in the notch and is in contact with the third passivation layer.

16. The method for forming the semiconductor structure as claimed in claim 10, wherein a portion of the first passivation layer wraps around and is in contact with the second semiconductor layers of the semiconductor fin structure, and forming the gate stack layer comprises:
oxidizing the portion of the first passivation layer wrapping around the second semiconductor layers to form interfacial layers;
forming gate dielectric layers wrapping around the interfacial layers; and
forming a gate electrode layer wrapping around the gate dielectric layers.

17. A method for forming a semiconductor structure, comprising:
forming a stack including alternating first semiconductor layers and second semiconductor layers;
patterning the stack to form an active region;
removing the first semiconductor layers of the active region, wherein remaining portions of the first semiconductor layers are left on surfaces of the second semiconductor layers of the active region;

treating the substrate with a first radical to passivate surfaces of the remaining portions of the first semiconductor layers; and forming a gate stack to surround the second semiconductor layers of the active region.

18. The method for forming the semiconductor structure as claimed in claim 17, further comprising:

treating the substrate with a second radical to passivate surface of the first semiconductor layers after patterning the stack to form the active region.

19. The method for forming the semiconductor structure as claimed in claim 17, further comprising:

laterally recessing the first semiconductor layers to form notches; and treating the substrate with a second radical to passivate surfaces of the first semiconductor layers exposed from the notches.

20. The method for forming the semiconductor structure as claimed in claim 17, wherein the first radical includes a nitrogen radical, a hydrogen radical, a deuterium radical or a sulfur radical.

* * * * *